(12) United States Patent
Nakamura et al.

(10) Patent No.: US 8,427,045 B2
(45) Date of Patent: Apr. 23, 2013

(54) TRANSLUCENT SUBSTRATE, PROCESS FOR PRODUCING THE SAME, ORGANIC LED ELEMENT AND PROCESS FOR PRODUCING THE SAME

(75) Inventors: Nobuhiro Nakamura, Chiyoda-ku (JP); Kazutaka Hayashi, Chiyoda-ku (JP); Kenji Imakita, Chiyoda-ku (JP); Hiroyuki Ohkawa, Chiyoda-ku (JP); Hidefumi Odaka, Chiyoda-ku (JP); Nao Ishibashi, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/195,146

(22) Filed: Aug. 1, 2011

(65) Prior Publication Data

US 2011/0284907 A1    Nov. 24, 2011

Related U.S. Application Data

(63) Continuation of application No. 12/333,755, filed on Dec. 12, 2008, now Pat. No. 8,018,140, which is a continuation-in-part of application No. PCT/JP2008/063319, filed on Jul. 24, 2008.

(30) Foreign Application Priority Data

Jul. 27, 2007  (JP) ................................ 2007-195797
Sep. 18, 2007  (JP) ................................ 2007-241287

(51) Int. Cl.
*H01L 51/50*        (2006.01)
(52) U.S. Cl.
USPC ........................................................ 313/503
(58) Field of Classification Search .................. 313/503, 313/504
See application file for complete search history.

(56) References Cited

U.S. PATENT DOCUMENTS

2005/0007000 A1    1/2005  Chou et al.
2005/0231106 A1   10/2005  Tanaka et al.
(Continued)

FOREIGN PATENT DOCUMENTS

CN    1735970 A    2/2006
JP    2931211      5/1999
(Continued)

OTHER PUBLICATIONS

Chinese Office Action issued May 5, 2011, in Chinese Patent Application No. 200880100726.5 (with English translation), in U.S. Appl. No. 12/333,755.

(Continued)

*Primary Examiner* — Anh Mai
*Assistant Examiner* — Hana Featherly
(74) *Attorney, Agent, or Firm* — Oblon, Spivak, McClelland & Neustadt, L.L.P.

(57) ABSTRACT

The present invention provides an organic LED element in which the extraction efficiency is improved up to 80% of emitted light. Further, the invention relates to an electrode-attached translucent substrate having a translucent substrate, a scattering layer formed over the glass substrate and containing a base material having a first refractive index for at least one wavelength of wavelengths of emitted light of an organic LED element and a plurality of scattering materials positioned in the base material and having a second refractive index different from that of the base material, and a translucent electrode formed over the scattering layer and having a third refractive index equal to or lower than the first refractive index, in which distribution of the scattering materials in the scattering layer decreases from the inside of the scattering layer toward the translucent electrode.

11 Claims, 33 Drawing Sheets

U.S. PATENT DOCUMENTS

| | | |
|---|---|---|
| 2006/0049745 A1 | 3/2006 | Handa et al. |
| 2009/0161361 A1* | 6/2009 | Meir et al. .................. 362/238 |
| 2010/0187987 A1 | 7/2010 | Nakamura |
| 2010/0230667 A1 | 9/2010 | Nakamura et al. |

FOREIGN PATENT DOCUMENTS

| | | |
|---|---|---|
| JP | 11194204 A * | 7/1999 |
| JP | 2004-513483 | 4/2004 |
| JP | 2005-38681 | 2/2005 |
| JP | 2005-63704 | 3/2005 |
| JP | 2005-190838 | 7/2005 |
| JP | 2005-190931 | 7/2005 |
| JP | 2006-222028 | 8/2006 |
| JP | 2007-141728 | 6/2007 |
| WO | 02/37568 A1 | 5/2002 |
| WO | 2005/124887 | 12/2005 |

OTHER PUBLICATIONS

Extended European Search Report issued Jan. 19, 2011 in EP 08 79 1571, in U.S. Appl. No. 12/333,755.

Observation by a third party dated Jul. 31, 2012 in European Application No. 08791571.6.

* cited by examiner

G:GLASS PARTICLE

G:GLASS PARTICLE

LIGHT EMISSION (A)

(B)

(A)

(B)

TRANSLUCENT SUBSTRATE, PROCESS FOR PRODUCING THE SAME, ORGANIC LED ELEMENT AND PROCESS FOR PRODUCING THE SAME

This is a continuation application of U.S. application Ser. No. 12/333,755, filed Dec. 12, 2008, which is a continuation-in-part of PCT/JP08/063319 filed on Jul. 24, 2008.

TECHNICAL FIELD

The present invention relates to a translucent substrate, a process for producing the same, an organic LED element and a process for producing the same, and particularly relates to a light-extraction structure of an organic LED (organic light emitting diode) or the like.

BACKGROUND ART

An organic LED element is one in which an organic layer is put between electrodes, and a voltage is applied between the electrodes to inject holes and electrons, which are allowed to be recombined in the organic layer, thereby extracting light that a light-emitting molecule emits in the course of transition from an excited state to a ground state, and has been used for display, backlight and lighting applications.

The refractive index of the organic layer is from about 1.8 to about 2.1 at 430 nm. On the other hand, the refractive index, for example, at the time when ITO (indium tin oxide) is used as a translucent electrode layer is generally from about 1.9 to about 2.1, although it varies depending on the ITO film-forming conditions or composition (Sn—In ratio). Like this, the organic layer and the translucent electrode layer are close to each other in refractive index, so that emitted light reaches an interface between the translucent electrode layer and a translucent substrate without totally reflecting between the organic layer and the translucent electrode layer. A glass or resin substrate is usually used as the translucent substrate, and the refractive index thereof is from about 1.5 to about 1.6, which is lower in the refractive index than the organic layer or the translucent electrode layer. Considering Snell's law, light which tries to enter the glass substrate at a shallow angle is reflected by total reflection in an organic layer direction, and reflected again at a reflective electrode to reach the interface of the glass substrate again. At this time, the incident angle to the glass substrate does not vary, so that reflection is repeated in the organic layer and the translucent electrode layer to fail to extract the light from the glass substrate to the outside. According to an approximate estimate, it is known that about 60% of the emitted light can not be extracted by this mode (organic layer-translucent electrode layer propagation mode). The same also occurs at an interface between the substrate and the air, whereby about 20% of the emitted light propagates in the glass and fails to be extracted (substrate propagation mode). Accordingly, the amount of the light which can be extracted to the outside of the organic LED element is less than 20% of the emitted light in the present circumstances.

Patent document 1 proposes a structure in which a light scattering layer as a translucent material layer is provided on one surface of a substrate (paragraphs 0039 to 0040). This proposes a structure in which glass particles are firmly fixed to the surface of the substrate with an acrylic adhesive to perform an aggregation arrangement on the surface of the substrate, thereby providing a light scattering portion between the substrate and an organic EL element.

Further, intending to improve extraction efficiency, patent document 2 discloses "an organic EL element comprising a translucent substrate having provided thereon a scattering layer comprising an additional layer composed of a transparent material in which $SiO_2$ particles, resin particles, a metal powder or metal oxide particles are dispersed, by a resin-based adhesive, spraying, vapor deposition, sputtering, dipping, spin coating or the like" (paragraph 0057).

Patent document 3 discloses a light-emitting device in which a diffusing layer obtained by dispersing at least two kinds of fine particles one digit or more different in average particle size in a resin is provided adjacent to a translucent electrode, thereby efficiently extracting wave-guided light.

Further, patent document 4 proposes a technique of preventing total reflection in the inside of a display formed by using a light-emitting device, thereby intending to increase luminance. In patent document 4, it is described that "a high diffusion material may be coated on a layer of a light-emitting device such as a substrate, a transparent electrode, an optical film or another component (patent document 4, paragraph 0027), Furthermore, it is described that "for example, particles may be arranged in glass frit, suitably coated, flattened and fired to form a glass substrate or a layer on a glass substrate, which acts as a high diffusion TIR frustrator" (patent document 4, paragraph 0027).

Moreover, also in patent document 5,paragraph 0026, there are descriptions similar to those of patent document 4.

Patent Document 1 Japanese Patent No. 2931211
Patent Document 2 JP-A-2005-63704
Patent Document 3 JP-A-2005-190931
Patent Document 4 JP-T-2004-513483
Patent Document 5 JP-T-2004-513484

DISCLOSURE OF THE INVENTION

Problems that the Invention is to Solve

However, in patent document 1, paraffin or the like is fixed as the translucent material layer onto the substrate with the resin binder (paragraph 0040). Namely, the light scattering portion of patent document 1 is the resin, and liable to absorb water. Accordingly, the organic EL device of patent document 1 has a problem that it can not withstand use for a long period of time.

Further, patent document 2 discloses that the refractive index of the translucent substrate is brought near that of the scattering layer. However, it makes no mention of the relationship between the refractive index of the scattering layer and that of a translucent electrode layer at all. Further, patent document 2 discloses that a surface of the scattering layer may be uneven, in a text of the specification.

Further, patent documents 3 and 4 suggest use of the glass layer which is decreased in high-temperature degradation and stable, but makes no mention of unevenness of a surface of the scattering layer at all.

When the surface is uneven herein, the unevenness tends to be formed on a surface of a first electrode formed on this upper layer. When a layer having a light emitting function or the like is formed on this upper layer by a vapor deposition method or the like, coatability of the organic layer to the unevenness deteriorates, resulting in the occurrence of variation in thickness of the organic layer. Further, as a result, variation occurs in interelectrode distance between the above-mentioned first electrode and a surface of a second electrode formed on the organic layer. As a result, it has been known that in a region small in interelectrode distance, a large current locally flows through the organic layer to cause an interelectrode short circuit, leading to non-lighting. Furthermore, when a display device constituted by fine pixels such as a high-resolution display is formed, it is necessary to form a fine pixel pattern. There has been a problem that not only the unevenness of the surface contributes to the occurrence of variation in position of pixels and size, but also an organic element is short-circuited by this unevenness.

As described above, none of the above-mentioned patent documents 1 to 5 has made mention of the flatness (arithmetic average roughness) of the surface of the scattering layer. Further, none of the patent documents has shown an example of preparing the scattering layer by glass.

Further, the organic EL element is formed by laminating thin films, so that angular dependency of color is high due to interference, which has also posed a problem that color is not exactly reproduced according to a seeing direction.

Also from such a viewpoint, demand for a translucent substrate having a scattering layer which is thin, high in flatness and further high in refractive index increases.

An object of the invention is to improve light-extraction efficiency.

Further, in an embodiment of the invention, it is an object to provide a translucent substrate having a scattering layer excellent in scattering characteristics and having a desired refractive index, while keeping surface smoothness.

Furthermore, in another embodiment of the invention, it is an object to improve light-extraction efficiency to provide a high-efficient, long-life organic LED element.

In addition, in still another embodiment of the invention, it is an object to provide an organic LED element which can inhibit angular dependency of color.

Further, in another embodiment of the invention, when a reflective electrode is used as an electrode facing to a translucent electrode formed on a translucent substrate, it is an object to provide the translucent substrate and an organic EL element in which the appearance is not spoiled by the occurrence of reflection due to the reflective electrode at the time of non-light emission.

Means for Solving the Problems

Accordingly, the electrode-attached translucent substrate of the invention comprises a translucent glass substrate, a scattering layer formed on the above-mentioned glass substrate and comprising a glass which contains a base material having a first refractive index for at least one wavelength of light to be transmitted and a plurality of scattering materials dispersed in the above-mentioned base material and having a second refractive index different from that of the above-mentioned base material, and a translucent electrode formed on the above-mentioned scattering layer and having a third refractive index equal to or lower than the above-mentioned first refractive index, wherein distribution of the above-mentioned scattering materials in the above-mentioned scattering layer decreases from the inside of the above-mentioned scattering layer toward the above-mentioned translucent electrode.

Further, in the invention, in the above-mentioned translucent substrate, a surface of the above-mentioned scattering layer forms waviness constituting a curved surface.

Furthermore, in the invention, in the above-mentioned translucent substrate, the scattering layer includes one in which the ratio $Ra/R\lambda a$ of the waviness roughness Ra of the surface of the above-mentioned scattering layer to the wavelength $R\lambda a$ of the waviness of the surface is from $1.0 \times 10^{-3}$ to $3.0 \times 10^{-2}$.

In addition, an organic LED element of the invention uses the above-mentioned translucent substrate and comprises a layer having a light-emitting function formed on the above-mentioned translucent electrode as a first electrode and a second electrode formed on the above-mentioned layer having a light-emitting function.

Further, a process for producing a translucent substrate of the invention comprises the steps of preparing a translucent glass substrate, forming on the above-mentioned glass substrate a scattering layer comprising a base material having a first refractive index and a plurality of scattering materials dispersed in the above-mentioned base material and having a second refractive index different from that of the above-mentioned base material, and forming on the above-mentioned scattering layer a translucent electrode having a third refractive index equal to or lower than the above-mentioned first refractive index, wherein the above-mentioned scattering layer forming step includes the steps of applying a coating material containing a glass powder onto the above-mentioned glass substrate and firing the above-mentioned applied glass powder, and the intralayer distribution of the scattering materials in the scattering layer decreases from the inside of the above-mentioned scattering layer toward the outermost surface thereof.

The above-mentioned firing step includes herein the step of firing the glass powder at a temperature which is 60 to 100° C. higher than the glass transition temperature of the above-mentioned applied glass material.

The electrode-attached translucent substrate (laminate for an organic LED element) of the invention comprises a translucent substrate, a scattering layer formed on the translucent substrate and comprising a base material having a first refractive index for at least one wavelength of wavelengths of emitted light of the organic LED element and a plurality of scattering materials positioned in the inside of the base material and having a second refractive index different from that of the base material, and a translucent electrode formed on the scattering layer and having a third refractive index equal to or lower than the first refractive index.

The organic LED element of the invention comprises a translucent substrate, a scattering layer formed on the translucent substrate and comprising a base material having a first refractive index for at least one wavelength of wavelengths of emitted light of the organic LED element and a plurality of scattering materials positioned in the inside of the base material and having a second refractive index different from that of the base material, a translucent electrode formed on the scattering layer and having a third refractive index equal to or lower than the first refractive index, an organic layer formed on the translucent electrode and a reflective electrode formed on the organic layer.

The waviness roughness Ra and the average wavelength $R\lambda a$ as used herein mean values calculated based on JIS B0601 (2001) (the translated standard of ISO 97), taking the short wavelength cutoff value as 25.0 μm and the long wavelength cutoff value as 2.5 mm.

Further, the surface roughness Ra means the microscopically observed surface roughness and a value calculated in accordance with JIS B0601 (1994), taking the long wavelength cutoff value as 10 μm.

Advantages of the Invention

According to the invention, the light-extraction efficiency can be improved, and it becomes possible to provide a translucent substrate which can provide an optical device having high extraction efficiency.

Further, scatterability can be increased, so that the angular dependency of color can be decreased.

Furthermore, a scattering layer is constituted by glass, thereby being able to realize stability and high strength, which makes it possible to provide a translucent substrate excellent in scatterability without increasing the thickness compared to an original translucent substrate made of glass.

According to the invention, an organic LED element can be provided in which the extraction efficiency is improved up to 80% of the emitted light.

BRIEF DESCRIPTION OF THE DRAWINGS

FIG. 27(A) is a graph showing waviness of a surface of a scattering layer having a film thickness of 60 μm, and FIG. 27(B) is a graph showing waviness of a surface of a scattering layer having a film thickness of 60 μm obtained by polishing a scattering layer having a film thickness of 120 μm.

FIG. 29(A) is a graph showing the measurement results of a surface of a non-polished scattering layer, and FIG. 29(B) is a graph showing the measurement results of a surface of a polished scattering layer.

Figure 1:
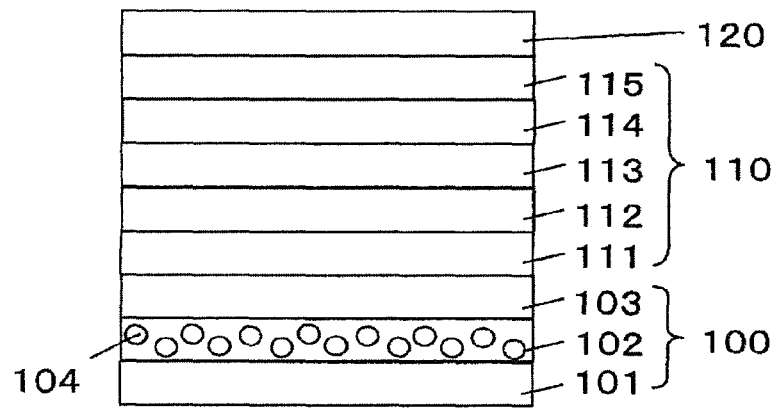
FIG. 1 is a cross-sectional view showing structures of a translucent substrate and an organic LED element of embodiment 1 of the invention.

| Description of Reference Numerals and Signs | |
|---|---|
| 100 | Electrode-Attached Translucent Substrate (Laminate for Organic LED Element) |
| 101 | Glass Substrate |
| 102 | Scattering Layer |
| 103 | Translucent Electrode |
| 104 | Scattering Material |
| 110 | Organic Layer |
| 120 | Reflective Electrode |

BEST MODE FOR CARRYING OUT THE INVENTION

Embodiment 1

The electrode-attached translucent substrate (laminate for an organic LED element) of embodiment 1 of the invention and the organic LED element being laminated for an organic LED element will be described below with reference to the drawings. FIG. 1 is a cross-sectional view showing structures of the laminate for an organic LED element and the organic LED element being laminated for an organic LED element.

The organic LED element of the invention comprises an electrode-attached translucent substrate (laminate for an organic LED element) 100, an organic layer 110 and a reflective electrode 120, as shown in FIG. 1. The electrode-attached translucent substrate comprises a substrate 101 as a translucent glass substrate, a scattering layer 102 and a translucent electrode 103.

The electrode-attached translucent substrate 100 used in the invention comprises the translucent glass substrate 101, the scattering layer 102 including glass and formed on the above-mentioned glass substrate and the translucent electrode 103. The above-mentioned scattering layer comprises a base material having a first refractive index at one wavelength of light to be transmitted and a plurality of scattering materials 104 dispersed in the above-mentioned base material and having a second refractive index different from that of the above-mentioned base material, and the distribution of the above-mentioned scattering materials in the above-mentioned scattering layer decreases from the inside of the above-mentioned scattering layer to the above-mentioned translucent electrode. This translucent electrode 103 has a third refractive index equal to or lower than the above-mentioned first refractive index.

Further, the density $\rho_1$ of the scattering material at a half thickness ($\delta/2$) of the above-mentioned scattering layer 102 including glass and the density $\rho_2$ of the scattering material at a distance x ($\delta/2 < x \leq \delta$) from a surface of the above-mentioned scattering layer on the side facing to the above-mentioned translucent electrode (namely, a surface on the substrate side) satisfy $\rho_1 \geq \rho_2$.

Figure 55:
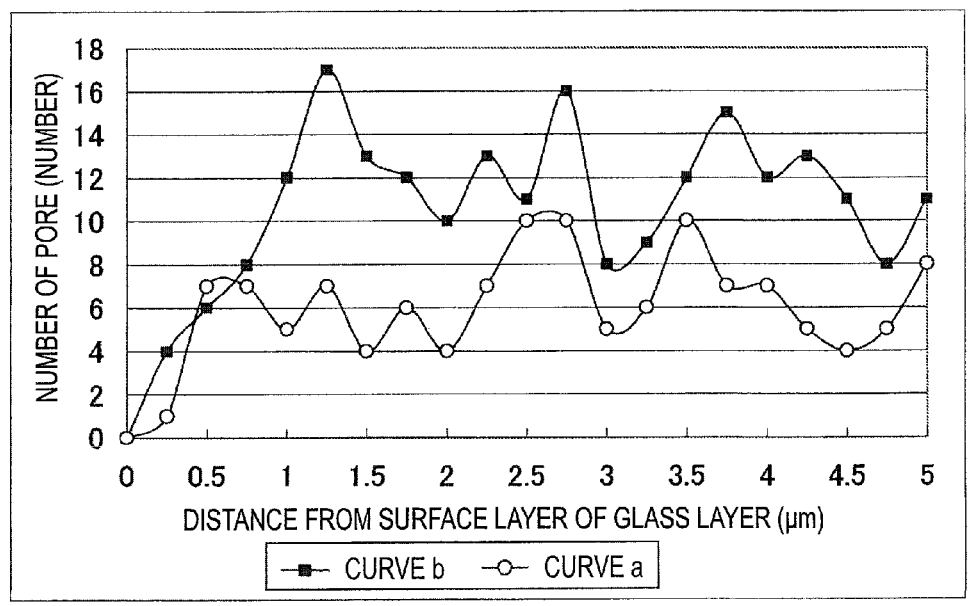
FIG. 55 is a graph showing the relationship between the depth and the number of pores in a scattering layer of the organic LED element in Example 2 of the invention.

Further, the density $\rho_3$ of the scattering material at a distance x (x×0.2 μm) from the translucent electrode side surface of the above-mentioned scattering layer including glass and the density $\rho_4$ of the above-mentioned scattering material at a distance x=2 μm satisfy $\rho_4 > \rho_3$. This is also clear from FIG. 55, although described later. FIG. 55 shows the case where the firing temperature is 570° C. and 580° C. However, similar results could be obtained even when the firing temperature was somewhat changed.

Furthermore, the density $\rho_3$ of the scattering material at a distance x (x≦0.2 μm) from the translucent electrode side surface of the above-mentioned scattering layer including glass and the density $\rho_5$ of the above-mentioned scattering material at a distance x=5 μm satisfy $\rho_5 > \rho_3$. This is also clear from FIG. 55, although also described later.

According to this constitution, the probability that pores, precipitated crystals or the scattering material composed of a material different in composition from the base material exists in a surface layer of the scattering layer as a glass layer and directly thereunder is lower than in the inside of the scattering layer, so that a smooth surface can be obtained. For this reason, for example, in the case of forming an organic EL element, a surface of the translucent substrate, namely a surface of the scattering layer, is smooth, so that a surface of the translucent electrode (first electrode) formed on this upper layer is smooth. Also in the case of forming a layer having a light-emitting function, or the like on this upper layer by a coating method or the like, the layer having a light-emitting function can be uniformly formed, and the interelectrode distance between the translucent electrode and a surface of the reflective electrode (second electrode) formed on the layer having a light-emitting function also becomes uniform. As a result, it does not happen that a large current is locally applied to the layer having a light-emitting function, so that the lifetime can be prolonged. Further, when a display device constituted by fine pixels such as a high-resolution display is formed, it is necessary to form a fine pixel pattern. There has been a problem that not only the unevenness of the surface contributes to the occurrence of variation in position of pixels and size, but also an organic EL element is short-circuited by this unevenness. However, the fine pattern can be formed with high accuracy.

Incidentally, although the scattering layer is directly formed on the glass substrate, it may be formed with the interposition of a barrier layer, for example, such that a thin silica film is formed on the glass substrate by a sputtering method or the like, and then the scattering layer is formed thereon. However, an extremely stable and flat surface can be obtained by forming the scattering layer including glass with no interposition of an adhesive or an organic layer. Moreover, it becomes possible to form a thermally stable and long-life optical device by constituting it with only inorganic materials.

Characteristics of such a translucent substrate will be described in detail.

Figure 2:
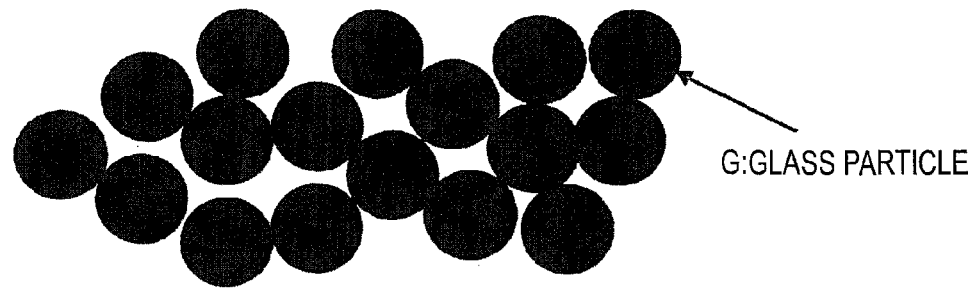
FIG. 2 is a schematic view showing a state of glass particles constituting a scattering layer of the translucent substrate of embodiment 1 of the invention, at the time of coating.

When a glass powder is fired, a schematic view of a state in which the glass powder is applied by a suitable method is shown in FIG. 2. A cross section of an outermost portion of a glass layer as the scattering layer constituting the translucent substrate of the invention is shown herein. This state can be obtained, for example, by dispersing glass particles G in a solvent or a mixture of a resin and a solvent and applying the resulting dispersion to a desired thickness. For example, there are used the glass particle G having a size of about 0.1 to about 10 μm in terms of the maximum length. When the resin and the solvent are mixed, a resin membrane in which the glass particles G are dispersed is heated to decompose the resin, thereby obtaining the state of FIG. 2. FIG. 2 is drawn in a simplified manner, and there is a space between the glass particles.

Figure 3:
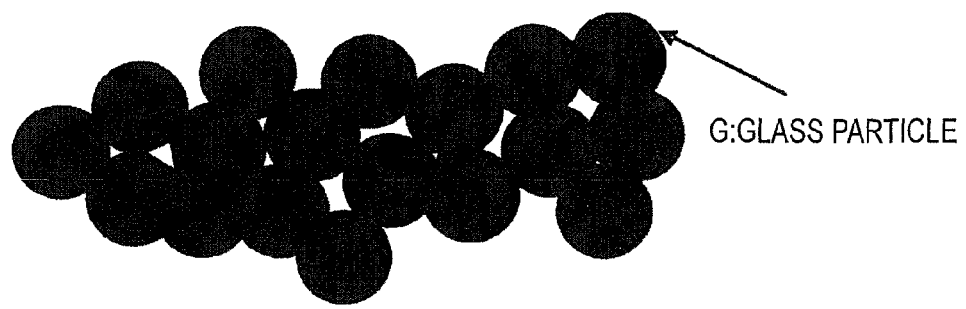
FIG. 3 is a schematic view showing a state of the glass particles constituting the scattering layer of the translucent substrate of embodiment 1 of the invention, at the time of firing.

Supposing that the glass particle size of the glass particles G has distribution, it is conceivable that a structure in which a small glass particle enters the space between the large glass particles G is obtained. When the temperature further rises, the glass particles start to be fused to one another at a temperature 10° C. to 20° C. higher than the softening temperature of the glass. A state at this time is shown in FIG. 3. When the glass particles are fused to one another, the space formed between the glass particles of FIG. 2 is deformed by softening of the glass to form a closed space in the glass. The glass particles are fused to one another, whereby outermost layers of the glass particles form an outermost surface of the scattering layer 102 (glass layer). On the outermost surface 200, the space which does not form the closed space is present as a depression.

Figure 4:
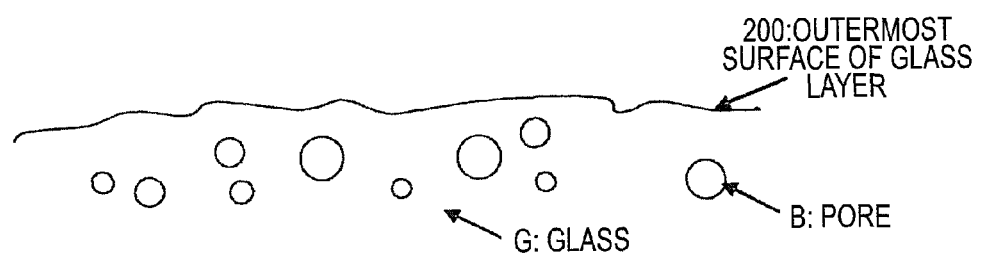
FIG. 4 is a schematic view showing a state of a scattering layer at times when fired at a temperature lower than the softening point of the glass as a comparative example of the invention.
Figure 5:
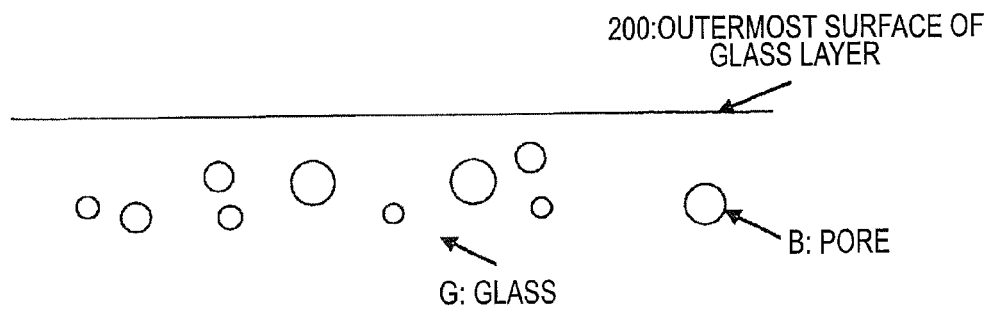
FIG. 5 is a schematic view showing a state of the scattering layer (when fired at a temperature sufficiently higher than the softening point of the glass) of embodiment 1 of the invention.

When the temperature is further raised, softening and fluidity of the glass proceed, and the space in the inside of the glass forms a spherical pore. On the glass outermost surface 200, the depression caused by the space between the glass particles G is smoothed. This state is shown in FIG. 4. Not only the pore due to the space between the glass particles G, but also pores are formed by generation of a gas at the time when the glass is softened, in some cases. For example, when an organic material is adhered to the surface of the glass layer, it decomposes to generate $CO_2$, thereby forming pores in some cases. Further, such a thermally decomposable material may be introduced to positively generate pores. Such a state is usually obtained in the vicinity of the softening temperature. The viscosity of the glass is as high as $10^{7.6}$ poises at the softening temperature, so that the pores can not rise to the surface in the case where the size of the pores is several microns or less. Accordingly, it is possible to further smooth the surface while inhibiting the pores from rising to the surface by adjusting the material composition so as to generate small pores and by further raising the temperature or by prolonging the retention time. When cooled from the state in which the surface is smoothed in this way, the scattering glass layer is obtained in which the density of the scattering material is smaller in the inside of the glass layer than in the surface thereof and which has a smooth surface.

Like this, it is possible to inhibit the generation of the pores and depressions in the outermost surface of the glass layer while leaving the pores in the glass layer by adjusting the material composition and firing temperature for forming the glass layer. Namely, it becomes possible to provide the electrode-attached translucent substrate excellent in scattering characteristics and high in surface smoothness by adjusting the firing temperature profile and adjusting the firing temperature so as to prevent the scattering material from rising and to leave the pores in the glass layer not to rise to the surface.

Figure 6:
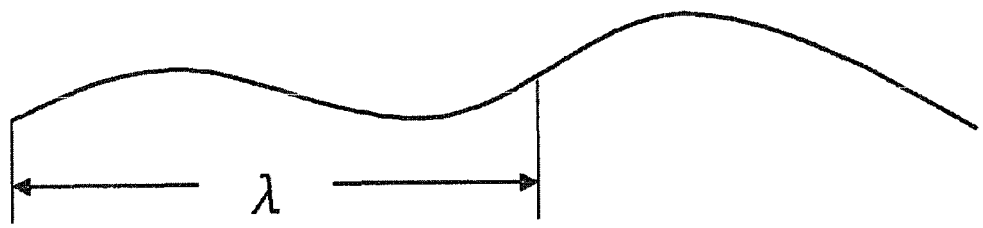
FIG. 6 is a schematic view showing a state of a waviness of a surface of the scattering layer of embodiment 1 of the invention.
Figure 7:
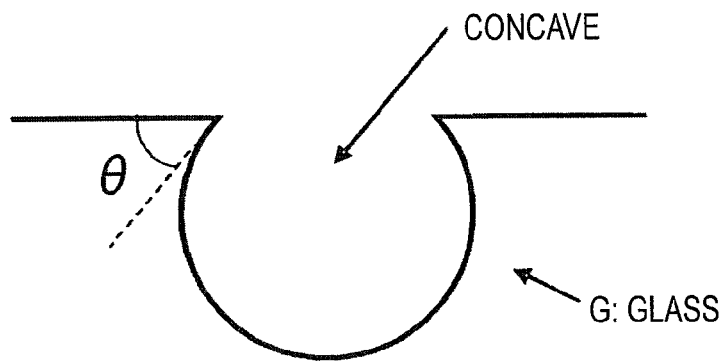
FIG. 7 is a schematic view showing a state of a microscopic concave portion of the surface of the scattering layer.
Figure 8:
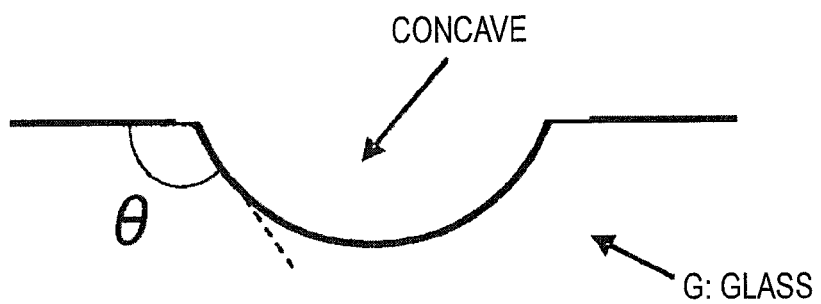
FIG. 8 is a schematic view showing a state of a microscopic concave portion of the surface of the scattering layer.

Further, at this time, the surface of the glass layer undulates in some cases depending on the treating temperature, the glass material for the glass layer, the size of the glass particles and the substrate material. A schematic view thereof is shown in FIG. 6. The waviness as used herein have a period of 10 μm or more. The size of the waviness is from about 0.01 μm to about 5 μm in terms of the waviness roughness Ra. Even when such waviness is present, the microscopic smoothness, namely the microscopic surface roughness Ra, is kept at 30 nm or less. When the treating temperature is low, a microscopic concave portion of the outermost surface is left in some cases. However, the shape of the concave portion becomes gentle as shown in FIG. 8, not an overhung shape as shown in FIG. 7. The overhung shape as used herein means that the angle θ between the surface of the scattering layer and a tangent line in the vicinity of an opening of the concave portion is an acute angle as shown in FIG. 7, and the term gentle means that θ in FIG. 8 is an obtuse angle or a right angle. When the shape is gentle as described above, it is said that the possibility that this concave portion causes an inter-electrode short circuit of the organic EL element is low. The firing temperature is desirably about 40° C. to about 60° C.

higher than the glass transition temperature. A too low temperature causes insufficient sintering, resulting in failure to smooth the surface. Accordingly, the firing temperature is more desirably about 50° C. to about 60° C. higher than the glass transition temperature.

Figure 9:
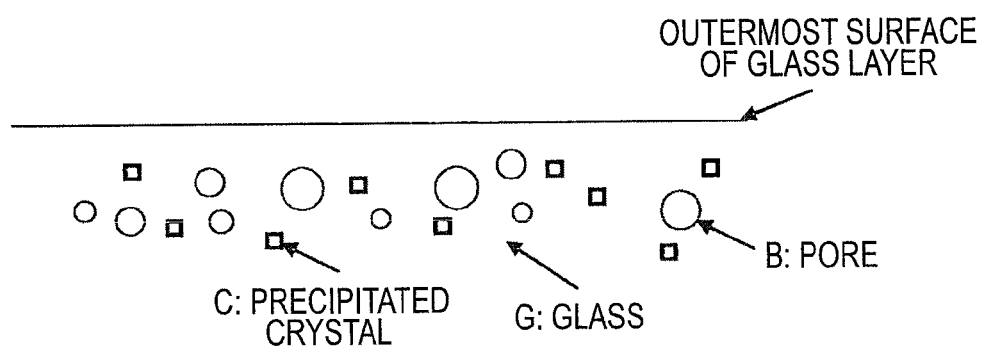
FIG. 9 is a schematic view showing a state of the surface of the scattering layer of embodiment 1 of the invention.

Further, use of the easily crystallizable glass makes it possible to precipitate crystals in the inside of the glass layer. At this time, when the crystals have a size of 0.1 μm or more, they act as a light scattering material. A state at this time is shown in FIG. 9. A suitable selection of the firing temperature makes it possible to precipitate the crystals in the inside of the glass layer while inhibiting the precipitation of the crystals in the outermost surface of the glass layer as described above. Specifically, it is desirable that the temperature is about 60° C. to about 100° C. higher than the glass transition temperature. On such an increase in temperature as this, the viscosity of the glass is high, and the pores do not rise to the surface.

Figure 10:
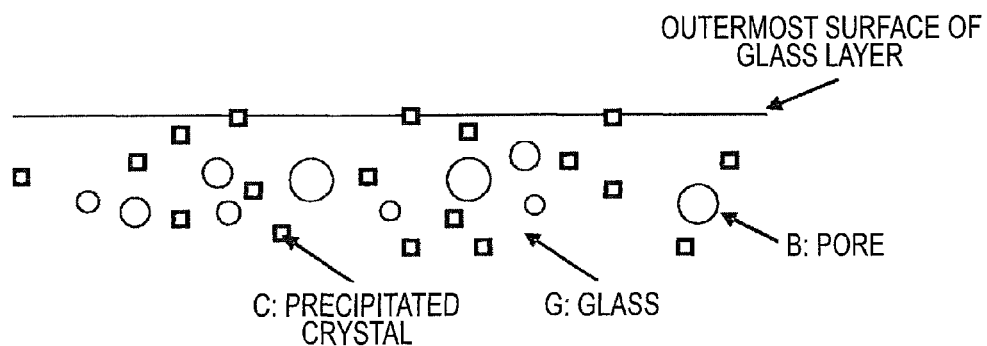
FIG. 10 is a schematic view showing a state of a surface of a scattering layer of a comparative example (when the firing temperature is too high).

When the temperature is too high, the crystals also precipitate in the outermost surface of the glass layer to lose smoothness of the outermost surface. This is therefore unfavorable. A schematic view thereof is shown in FIG. 10. Accordingly, the firing temperature is more preferably about 60° C. to about 80° C. higher than the glass transition temperature, and most preferably about 60° C. to about 70° C. higher than the glass transition temperature. Such a technique makes it possible to allow the pores and the precipitated crystals to exist in the glass layer as the scattering material and to inhibit the generation thereof in the glass outermost surface. The reason why these are possible is that the glass is flattened for itself within the certain temperature range, and that high viscosity at which the pores do not rise to the surface can be realized or the crystals can be precipitated. In the case of a resin, it is difficult to control the process at high viscosity as described above, and also the crystals can not be precipitated.

As described above, the translucent substrate in which the density of the scattering material in the outermost surface of the above-mentioned scattering layer is lower than the density of the scattering material in the inside of the above-mentioned scattering layer can be obtained by adjusting the material composition and the firing conditions.

Further, it becomes possible to obtain the translucent substrate having sufficient scattering characteristics and a smooth surface by using a translucent substrate in which there is present such δ that the density $\rho_1$ of the scattering material at a half thickness of the above-mentioned scattering layer including glass and the density $p_2$ of the scattering material at a distance x from a surface of the above-mentioned scattering layer on the side facing to the above-mentioned translucent electrode (namely, a surface on the substrate side), which satisfies $\delta/2 < x \leq \delta$, satisfy $\rho_1 \geq \rho_2$.

Further, in the scattering layer, the surface forms waviness constituting a curved surface, thereby being able to inhibit the appearance from being spoiled by reflection, when the organic EL element formed on the upper layer is a reflective electrode. When the reflective electrode is used, it has been a problem that the appearance is spoiled by reflection due to the reflective electrode at the time of non-light emission. However, according to the invention, the accuracy of a pattern formed on the upper layer is not deteriorated, variation does not occur in interelectrode distance, and the contact area of the electrode and the layer having a light-emitting function can be increased, by making the conditions suitable when the scattering layer is formed. Accordingly, the effective element area can be increased, thereby being able to form the long-life, high-intensity organic EL element.

Furthermore, as shown in FIG. 6, the ratio Ra/Rλa of the waviness roughness Ra of the surface of this scattering layer to the wavelength Rλa of the waviness of the surface is desirably from $1.0 \times 10^{-6}$ to $3.0 \times 10^{-5}$.

In addition, the surface roughness Ra of the surface of the above-mentioned scattering layer is desirably 30 nm or less. More desirably, the surface roughness of the above-mentioned scattering layer is 10 nm or less.

For example, when the organic EL element is formed on such a translucent substrate, for example, the translucent substrate is required to be thinly formed. It is at a surface roughness of 30 nm or less, desirably 10 nm or less that this translucent electrode can be formed without being affected by a ground. When the surface roughness exceeds 30 nm, coatability of the organic layer formed thereon deteriorates in some cases, and a short circuit occurs between the translucent electrode formed on the glass scattering layer and the other electrode in some cases. The interelectrode short circuit causes non-lighting of the element, but it is possible to restore it by applying an overcurrent in some cases. In order to make the restoration possible, the roughness of the glass scattering layer is desirably 10 nm or less, and more desirably 3 nm or less.

Incidentally, in a certain material system, it is known that a surface roughness of 10 nm or less can be obtained when the firing temperature is adjusted to 570° C. or more (see Table 1). Although the optimum firing conditions vary depending on the material system, the scattering material is inhibited from being present in the outermost surface by controlling the kind or size of scattering material, thereby being able to obtain the scattering layer with an excellent surface smoothness.

Further, when the pores are present in the scattering layer, an increase in size of the pores increases buoyancy in a scattering layer forming process such as firing, resulting in an easy rising of the pores to the surface. When the pores reach the outermost surface, there is the possibility that they burst to significantly deteriorate the surface smoothness. Furthermore, the number of the scattering materials relatively decreases in that portion, so that scatterability decreases only in that portion. Coagulation of such large pores also results in visual observation as unevenness. Moreover, the ratio of the pores having a diameter of 5 μm or more is desirably 15 vol % or less, more desirably 10 vol % or less, and still more preferably 7 vol % or less. In addition, even when the scattering material is other than the pores, the number of the scattering materials relatively decreases in that portion, so that scatterability decreases only in that portion. Accordingly, the ratio of the scattering material having a maximum length of 5 μm or more is desirably 15 vol % or less, more desirably 10 vol % or less, and still more desirably 7 vol % or less.

Still further, when the reflective electrode is used, there has been a problem that the appearance is spoiled by the occurrence of reflection due to the reflective electrode at the time of non-light emission. However, when the scattering layer is formed, the conditions are optimized, thereby being able to form waviness shape on the surface of the scattering layer. The waviness of the surface of the scattering layer was measured. SURFCOM 1400D manufactured by Tokyo Seimitsu Co., Ltd was used for the measurement. The cutoff wavelength used herein was 2.5 mm. Then, aluminum was vacuum vapor deposited on this scattering layer-attached glass substrate to a thickness of 80 nm, the diffuse reflectivity of a film formation surface of the aluminum layer was measured, and the ratio of scattering light was calculated. LANBDA 950 manufactured by Perkin Elmer Inc. was used for the measurement.

The results thereof are shown in Table 1.

TABLE 1

| | Glass Material | Ra (μm) | Rλa (μm) | Ra/Rλa $(10^{-2})$ | Surface Ares Ratio | Diffuse Reflection Ratio |
|---|---|---|---|---|---|---|
| A | Fired at 550° C. | 3.39 | 143 | 2.37 | 1.0352 | 98% |
|   | Fired at 560° C. | 2.58 | 216 | 1.19 | 1.0111 | 85% |
|   | Fired at 570° C. | 2.53 | 236 | 1.07 | 1.0088 | 83% |
|   | Fired at 580° C. | 1.68 | 302 | 0.556 | 1.0027 | 60% |
| B |   | 4.74 | 492 | 0.963 | 1.0082 | 72% |
| C |   | 0.04 | 171 | 0.0234 | 1.0001 | 38% |

Here, A is glass materials comprising 23.1 mol % of $P_2O_5$, 12.0 mol % of $B_2O_3$, 11.6 mol % of $Li_2O$, 16.6 mol % of $Bi_2O_3$, 8.7 mol % of $TiO_2$, 17.6 mol % of $Nb_2O_5$ and 10.4 mol % of $WO_3$ and fired at the respective temperatures, B is a glass material having the same composition as A with exception that $Bi_2O_3$ is decreased to 5.5 mol % and that $Na_2O$ and $K_2O$ are added in amounts of 4 mol % and 2.5 mol %, respectively, and fired at 530° C., and C is a glass material having the composition shown in Table 12 and obtained by firing a scattering layer constituted. The glass transition temperature Tg of A is 499° C., and that of B is 481° C.

By adjusting the firing conditions like this, the waviness can be given to the surface, and this makes it possible to reduce specular reflectivity. Accordingly, even when scatterability of the scattering layer is low, reflection due to the fact that the reflective electrode has specularity can be decreased.

Further, the content of the above-mentioned scattering materials in the above-mentioned scattering layer is desirably at least 1 vol %.

The experiment results reveals that when the scattering material is contained in an amount of 1 vol % or more, sufficient light scatterability can be obtained.

Furthermore, there are the case where the scattering material is pores, the case where it is material particles having a composition different from that of the base layer and the case where it is precipitated crystals of the base layer. These may be used either alone or as a mixture thereof.

When the scattering material is pores, the size of the pores, pore distribution or density can be adjusted by adjusting the firing conditions such as the firing temperature.

When the scattering material is material particles having a composition different from that of the base layer, the size, distribution or density of the scattering material can be adjusted by adjusting the material composition or the firing conditions such as the firing temperature.

When the above-mentioned scattering material is precipitated crystals of the glass constituting the above-mentioned base layer, the size of the pores, pore distribution or density can be adjusted by adjusting the firing conditions such as the firing temperature.

Further, the first refractive index of the base layer for at least one wavelength of wavelengths λ (430 nm<λ<650 nm) is desirably 1.8 or more. Although it is difficult to form a high refractive index material layer, it becomes easy to adjust the refractive index by adjusting the material composition of the glass material.

The respective members will be described in detail below.

<Substrate>

As substrate 101 used for the formation of the translucent substrate, a material having a high refractive index for visible light is used, mainly such as a glass substrate. As the material having a high refractive index, specifically, a plastic substrate as well as the glass substrate may be used. As a material for the glass substrate, an inorganic glass such as alkali glass, non-alkali glass or quartz glass may be mentioned. Further, as a material for the plastic substrate, a polyester, a polycarbonate, a polyether, a polysulfone, a polyethersulfone, a polyvinyl alcohol or a fluorine-containing polymer such as polyvinylidene fluoride or polyvinyl fluoride may be mentioned. Incidentally, in order to prevent moisture from passing through the substrate, the plastic substrate may be constituted so that barrier properties are given thereto. The thickness of the translucent substrate 101 is preferably from 0.1 mm to 2.0 mm in the case of glass. However, too thin substrate results in a decrease in strength, so that it is particularly preferred that the thickness is from 0.5 mm to 1.0 mm.

Incidentally, in order to prepare the scattering layer by glass fit, the thermal expansion coefficient is preferably $50 \times 10^{-7}$/° C. or more, more preferably $70 \times 10^{-7}$/° C. or more and still more preferably $80 \times 10^{-7}$/° C. or more, because a problem of strain and the like are encountered.

Further, it is desirable that the average thermal expansion coefficient of the scattering layer at 100° C. to 400° C. is from $70 \times 10^{-7}$(° $C.^{-1}$) to $95 \times 10^{-7}$(° $C.^{31\ 1}$), and that the glass transition temperature is from 450° C. to 550° C.

Scattering Layer

A constitution, a preparation method and characteristics of the scattering layer and a measuring method of the refractive index will be described in detail below. Incidentally, in order to realize an improvement of the light-extraction efficiency which is the principal object of the invention, the refractive index of the scattering layer must be equivalent to or higher than the refractive index of a translucent electrode material, although details thereof are described later.

Calculating Method

In order to obtain characteristics of the scattering layer described later, the present inventors performed optical simulations, and examined, for respective parameters, influences exerted on the extraction efficiency thereby. A computing software used is a software SPEOS manufactured by OPTIS Corporation. This software is a ray trace software, and at the same time, it is possible to apply a theoretical formula of Mie scattering to the scattering layer. The thickness of the organic layer actually used as a layer having a light-emitting function, such as a charge-injection-transport layer or a light-emitting layer, is actually from about 0.1 μm to about 0.3 μm in total. However, in the ray trace, the angle of a ray does not change even when the thickness is changed. Accordingly, it was taken as 1 μm of the minimum thickness allowed in the software. For a similar reason, the total thickness of the glass substrate and the scattering layer was taken as 100 μm. Further, for simplicity, calculation was made dividing the organic layer and the translucent electrode into three of the charge-injection layer and the light-emitting layer, a hole-injection-transport layer, and the translucent electrode. In the calculation, the refractive indexes of these are assumed as the same. However, the refractive indexes of the organic layer and the translucent electrode are equivalent values, so that the calculated results are not largely changed. Strictly considered, a waveguide mode caused by interference stands, because the organic layer is thin. However, the results are not largely changed, even when geometric-optically treated. This is therefore sufficient for estimating the advantages of this invention. In the organic layer, emitted light is assumed to be outgone from a total of 6 faces without having directivity. The calculation was made, taking the total light flux amount as 1,000 lm and the number of light rays as 100,000 rays or 1,000,000 rays. The light outgone from the translucent substrate was captured by a receiving surface mounted 10 μm above the translucent substrate, and the extraction efficiency was calculated from the illuminance thereof.

Constitution

In this embodiment, as described above, the scattering layer 102 is formed by forming a glass powder on the glass substrate by a method such as coating and firing it at a desired temperature, and has the base material 102 having a first refractive index and a plurality of scattering materials 104 dispersed in the above-mentioned base material 102 and having a second refractive index different from that of the above-mentioned base material. The intralayer distribution of the above-mentioned scattering materials in the above-mentioned scattering layer decreases from the inside of the above-mentioned scattering layer to the outermost surface. Use of the glass layer makes it possible to keep smoothness of the surface while having excellent scattering characteristics, as described above, and use thereof on the light outgoing surface side of the light-emitting device or the like makes it possible to realize extremely high-efficient light extraction.

Further, as the scattering layer, a material (base material) having a main surface coated and having a high light transmittance may be used. As the base material, a glass, a crystallized glass, a translucent resin or a translucent ceramic may be used. As a material for the glass, an inorganic glass such as soda lime glass, borosilicate glass, non-alkali glass or quartz glass may be used. Incidentally, the plurality of scattering materials 104 (for example, pores, precipitated crystals, material particles different from the base material or phase-separated glass) are formed in the inside of the base material. The particle as used herein means a small solid material, and there is a filler or a ceramic. Further, the pore means an air or gas material. Furthermore, the phase-separated glass means a glass composed of two or more kinds of glass phases. Incidentally, when the scattering material is the pore, the size of the scattering material indicates a diameter of a void.

Further, in order to realize an improvement of the light-extraction efficiency which is the principal object of the invention, the refractive index of the scattering layer must be equivalent to or higher than the refractive index of the translucent electrode material. When the refractive index is low, a loss due to total reflection occurs at an interface between the base material and the translucent electrode material. The refractive index of the base material is only required to exceed for at least one portion (for example, red, blue, green or the like) in the emission spectrum range of the scattering layer. However, it exceeds preferably over the whole region (430 nm to 650 nm) of the emission spectrum range, and more preferably over the whole region (360 nm to 830 nm) of the wavelength range of visible light.

Further, in order to prevent the interelectrode short circuit of the organic LED element, the main surface of the scattering layer is required to be smooth. For that purpose, it is unfavorable that the scattering materials protrude from the main surface of the scattering layer. Also in order to prevent the scattering materials from protruding from the main surface of the scattering layer, it is preferred that the scattering materials are not present within 0.2 μm from the main surface of the scattering layer. The arithmetic average roughness (Ra) of the main surface of the scattering layer specified in JIS B0601-1994 is preferably 30 nm or less, more preferably 10 nm or less (see Table 1), and particularly desirably 1 nm or less. Although both the refractive indexes of the scattering material and the base material may be high, the difference (Δn) in the refractive indexes is preferably 0.2 or more for at least one portion in the emission spectrum range of the scattering layer.

In order to obtain sufficient scattering characteristics, the difference (Δn) in the refractive indexes is more preferably 0.2 or more over the whole region (430 nm to 650 nm) of the emission spectrum range or the whole region (360 nm to 830 nm) of the wavelength range of visible light.

In order to obtain the maximum refractive index difference, a constitution of using a high refractive index glass as the above-mentioned high light transmittance material and the gas material, namely the pores, as the scattering material is desirable.

In this case, the refractive index of the base material is desirably as high as possible, so that the high refractive index glass is preferably used as the base material. For components of the high refractive index glass, there can be used the high refractive index glass containing one or two or more kinds of components selected from $P_2O_5$, $SiO_2$, $B_2O_3$, $Ge_2O$ and $TeO_2$ as network formers, and one or two or more kinds of components selected from $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$ and $Sb_2O_3$ as high refractive index components. In addition, in a sense of adjusting characteristics of the glass, an alkali oxide, an alkaline earth oxide, a fluoride or the like may be used within the range not impairing characteristics required for the refractive index. Specific glass systems include a $B_2O_3$—$ZnO$—$La_2O_3$ system, a $P_2O_5$—$B_2O_3$—$R'_2O$—$R''O$—$TiO_2$—$Nb_2O_5$—$WO_3$—$Bi_2O_3$ system, a $TeO_2$—$ZnO$ system, a $B_2O_3$—$Bi_2O_3$ system, a $SiO_2$—$Bi_2O_3$ system, a $SiO_2$—$ZnO$ system, a $B_2O_3$—$ZnO$ system, a $P_2O_5$—$ZnO$ system and the like, wherein R' represents an alkali metal element, and R" represents an alkaline earth metal element. Incidentally, the above are examples, and the glass system is not construed as being limited to these examples as long as it is constituted so as to satisfy the above-mentioned conditions.

It is also possible to change color of light emission by allowing the base material to have a specific transmittance spectrum. As colorants, known ones such as a transition metal oxide, a rare-earth metal oxide and a metal colloid can be used alone or in combination thereof.

Here, in general, white light emission is necessary for backlight and lighting applications. For whitening, there are known a method in which red, blue and green area spatially selectively coated (selective coating method), a method of laminating light-emitting layers having different light emission colors (lamination method) and a method of color changing light emitted in blue with a color changing material spatially separately provided (color changing method). In the backlight and lighting applications, what is necessary is just to uniformly obtain white color, so that the lamination method is generally used. The light-emitting layers to be laminated are used in such a combination that white color is obtained by additive color mixing. For example, a blue-green layer and an orange layer are laminated, or red, blue and green are laminated, in some cases. In particular, in the lighting application, color reproducibility at a reflective surface is important, so that it is desirable to have an emission spectrum necessary for a visible light region. When the blue-green layer and the orange layer are laminated, lighting of one with a high proportion of green deteriorates color reproducibility, because of low light emission intensity of green color. The lamination method has a merit that it is unnecessary to spatially change a color arrangement, whereas it has the following two problems. The first problem is that the emitted light extracted is influenced by interference, because the film thickness of the organic layer is thin as described above. Accordingly, color changes depending on the viewing angle. In the case of white color, such a phenomenon becomes a problem in some cases, because the sensitivity of the human eye to color is high. The second problem is that a carrier balance is disrupted during light emission to cause changes in light-emitting luminance in each color, resulting in changes in color.

A conventional organic LED element has no idea of dispersing a fluorescent material in a scattering layer or a diffusing layer, so that it can not solve the above-mentioned problem of changes in color. Accordingly, the conventional organic LED element has been insufficient yet for the backlight and lighting applications. However, in the substrate for an organic LED element and the organic LED element of the invention, the fluorescent material can be used in the scattering material or the base material. This can cause an effect of performing wavelength conversion by light emission from the organic layer to change color. In this case, it is possible to decrease the light emission colors of the organic LED, and the emitted light is extracted after being scattered. Accordingly, the angular dependency of color and changes in color with time can be inhibited.

Preparation Method of Scattering Layer

The preparation of the scattering layer is carried out by coating and firing. In particular, from the viewpoint of forming rapidly and uniformly a film thickness of 10 to 100 μm with a large area, a method of preparing the layer by using a frit-pasted glass is preferred. In order to utilize a frit paste method, it is desirable that the softening point (Ts) of the glass of the scattering layer is lower than the strain point (SP) of the substrate glass, and that the difference in the thermal expansion coefficient (α) is small, for inhibiting thermal deformation of the substrate glass. The difference between the softening point and the strain point is preferably 30° C. or more, and more preferably 50° C. or more. Further, the difference in the expansion coefficient between the scattering layer and the substrate glass is preferably $\pm 10 \times 10^{-7}$ (1/K) or less, and more preferably $\pm 5 \times 10^{-7}$ (1/K) or less. The frit paste as used herein indicates one in which a glass powder is dispersed in a resin, a solvent, a filler or the like. Glass layer coating becomes possible by patterning the frit paste using a pattern forming technique such as screen printing and firing it. The technical outline will be described below.

Frit Paste Material

1. Glass Powder

The particle size of the glass powder is from 1 μm to 10 μm. In order to control the thermal expansion of the film fired, a filler is incorporated in some cases. As the filler, specifically, zircon, silica, alumina or the like may be used, and the particle size thereof is from 0.1 μm to 20 μm.

Glass materials will be described below.

In the invention, the above-mentioned scattering layer uses a glass containing 20 to 30 mol % of $P_2O_5$, 3 to 14 mol % of $B_2O_3$, 10 to 20 mol % of $Li_2O$, $Na_2O$ and $K_2O$ in terms of total amount thereof, 10 to 20 mol % of $Bi_2O_3$, 3 to 15 mol % of $TiO_2$, 10 to 20 mol % of $Nb_2O_5$ and 5 to 15 mol % of $WO_3$, wherein the total amount of the above-mentioned components is 90 mol % or more.

The glass composition for forming the scattering layer is not particularly limited, as long as desired scattering characteristics are obtained and it can be frit-pasted and fired. However, in order to maximize the extraction efficiency, examples thereof include a system containing $P_2O_5$ as an essential component and further one or more components of $Nb_2O_5$, $Bi_2O_3$, $TiO_2$ and $WO_3$; a system containing $B_2O_3$, ZnO and $La_2O_3$ as essential components and one or more components of $Nb_2O_5$, $ZrO_2$, $Ta_2O_5$ and $WO_3$; a system containing $SiO_2$ as an essential component and one or more components of $Nb_2O_5$ and $TiO_2$; a system containing $Bi_2O_3$ as a main component and $SiO_2$, $B_2O_3$ and the like as network forming components, and the like.

Incidentally, in all glass systems used as the scattering layer in the invention, $As_2O_3$, PbO, CdO, $ThO_2$ and HgO which are components having adverse effects on the environment are not contained, except for the case of inevitable contamination therewith as impurities derived from raw materials.

The scattering layer containing $P_2O_5$ and one or more components of $Nb_2O_5$, $Bi_2O_3$, $TiO_2$ and $WO_3$ is preferably a glass within the composition range of 15 to 30% of $P_2O_5$, 0 to 15% of $SiO_2$, 0 to 18% of $B_2O_3$, 5 to 40% of $Nb_2O_5$, 0 to 15% ot $TiO_2$, 0 to 50% of $WO_3$, 0 to 30% of $Bi_2O_3$, provided that $Nb_2O_5+TiO_2+WO_3+Bi_2O_3$ is from 20 to 60%, 0 to 20% of $Li_2O$, 0 to 20% of $Na_2O$, 0 to 20% of $K_2O$, provided that $Li_2O+Na_2O+K_2O$ is from 5 to 40%, 0 to 10% of MgO, 0 to 10% of CaO, 0 to 10% of SrO, 0 to 20% of BaO, 0 to 20% of ZnO and 0 to 10% of $Ta_2O_5$, in terms of mol %.

Effects of the respective components are as follows in terms of mol %.

$P_2O_5$ is an essential component forming a skeleton of this glass system and performing vitrification. However, when the content is too small, devitrification of the glass increases to result in failure to obtain the glass. Accordingly, it is preferably 15% or more, and more preferably 18% or more. On the other hand, when the content is too large, the refractive index decreases to result in failure to achieve the object of the invention. Accordingly, it is preferably 30% or less, and more preferably 28% or less.

$B_2O_3$ is an optional component as a component which is added into the glass, thereby improving resistance to devitrification and decreasing the thermal expansion coefficient. When the content is too large, the refractive index decreases. It is therefore preferably 18% or less, and more preferably 15% or less.

$SiO_2$ is an optional component as a component which is added in slight amounts, thereby stabilizing the glass and improving resistance to devitrification. When the content is too large, the refractive index decreases. It is therefore preferably 15% or less, and more preferably 10% or less.

$Nb_2O_5$ is an essential component improving the refractive index and also having an effect of enhancing weather resistance at the same time. Accordingly, the content is preferably 5% or more, and more preferably 8% or more. On the other hand, when the content is too large, devitrification increases to result in failure to obtain the glass. Accordingly, the content thereof is preferably 40% or less, and more preferably 35% or less.

$TiO_2$ is an optional component improving the refractive index. However, when the content is too large, coloring of the glass increases to cause an increased loss in the scattering layer, resulting in failure to achieve the object of improving the light-extraction efficiency. Accordingly, the content is preferably 15% or less, and more preferably 13% or less.

$WO_3$ is an optional component improving the refractive index and decreasing the glass transition temperature to decrease the firing temperature. However, excessive introduction thereof results in coloring of the glass to cause a decrease in the light-extraction efficiency. Accordingly, the content thereof is preferably 50% or less, and more preferably 45% or less.

$Bi_2O_3$ is a component improving the refractive index, and can be introduced into the glass in relatively large amounts while keeping stability of the glass. However, excessive introduction thereof poses a problem that the glass is colored to decrease the transmittance. Accordingly, the content is preferably 30% or less, and more preferably 25% or less.

In order to increase the refractive index more than the desired value, one or more components of $Nb_2O_5$, $TiO_2$, $WO_3$ and $Bi_2O_3$ described above must be necessarily contained. Specifically, the total amount of $(Nb_2O_5+TiO_2+WO_3+Bi_2O_3)$ is preferably 20% or more, and more preferably 25% or more. On the other hand, when the total amount of these components is too large, coloring occurs, or devitrification excessively increases. It is therefore preferably 60% or less, and more preferably 55% or less.

$Ta_2O_5$ is an optional component improving the refractive index. However, when the amount added is too large, resistance to devitrification decreases. In addition to this, it is expensive. Accordingly, the content thereof is preferably 10% or less, and more preferably 5% or less.

The alkali metal oxides ($R_2O$) such as $Li_2O$, $Na_2O$ and $K_2O$ has an effect of improving meltability to decrease the glass transition temperature and concurrently an effect of enhancing affinity with the glass substrate to increase adhesion. For this reason, it is desirable to contain one or two or more kinds of these. These are contained preferably in an amount of 5% or more, and more preferably in an amount of 10% or more, as the total amount of ($Li_2O+Na_2O+K_2O$). However, when they are excessively contained, stability of the glass is impaired. In addition to this, all are components decreasing the refractive index, so that the refractive index of the glass decreases, resulting in failure to the desired improvement of the light-extraction efficiency. Accordingly, the total content is preferably 40% or less, and more preferably 35% or less.

$Li_2O$ is a component for decreasing the glass transition temperature and improving solubility. However, when the content is too much, devitrification excessively increases to result in failure to obtain homogeneous glass. Further, the thermal expansion coefficient excessively increases to increase the difference in the expansion coefficient from the substrate. At the same time, the refractive index also decreases to result in failure to achieve a desired improvement of the light-extraction efficiency. Accordingly, the content is desirably 20% or less, and more preferably 15% or less.

Both of $Na_2O$ and $K_2O$ are optional components improving meltability. However, excessive inclusion thereof causes a decrease in the refractive index, resulting in failure to achieve the desired light-extraction efficiency. Accordingly, the contents are each preferably 20% or less, and more preferably 15% or less.

ZnO is a component improving the refractive index and decreasing the glass transition temperature. However, when it is excessively added, devitrification of the glass increases to result in failure to obtain the homogeneous glass. Accordingly, the content is preferably 20% or less, and more preferably 18% or less.

BaO is a component improving the refractive index and concurrently improving solubility. However, when it is excessively added, stability of the glass is impaired. Accordingly, the content thereof is preferably 20% or less, and more preferably 18% or less.

MgO, CaO and SrO are optional components improving solubility, and components decreasing the refractive index at the same time. Accordingly, the contents are each preferably 10% or less, and more preferably 8% or less.

In order to obtain the high refractive index and stable glass, the total amount of the above-mentioned components is preferably 90% or more, more preferably 93% or more, and still more preferably 95% or more.

In addition to the components described above, a refining agent, a vitrification enhancing component, a refractive index adjusting component, a wavelength converting component or the like may be added in small amounts within the range not impairing necessary glass characteristics. Specifically, the refining agents include $Sb_2O_3$ and $SnO_2$, the vitrification enhancing components include $GeO_2$, $Ga_2O_3$ and $In_2O_3$, the refractive index adjusting components include $ZrO_2$, $Y_2O_3$, $La_2O_3$, $Gd_2O_3$ and $Yb_2O_3$, and the wavelength converting components include rare-earth components such as $CeO_2$, $Eu_2O_3$ and $Er_2O_3$, and the like.

The scattering layer containing $B_2O_3$ and $La_2O_3$ as essential components and one or more components of $Nb_2O_5$, $ZrO_2$, $Ta_2O_5$ and $WO_3$ is preferably a glass within the composition range of: 20 to 60% of $B_2O_3$, 0 to 20% of $SiO_2$, 0 to 20% of $Li_2O$, 0 to 10% of $Na_2O$, 0 to 10% of $K_2O$, 5 to 50% of ZnO, 5 to 25% of $La_2O_3$, 0 to 25% of $Gd_2O_3$, 0 to 20% of $Y_2O_3$, 0 to 20% of $Yb_2O_3$, provided that $La_2O_3+Gd_2O_3+Y_2O_3+Yb_2O_3$ is from 5 to 30%, 0 to 15% of $ZrO_2$, 0 to 20% of $Ta_2O_5$, 0 to 20% of $Nb_2O_5$, 0 to 20% of $WO_3$, 0 to 20% of $Bi_2O_3$ and 0 to 20% of BaO, in terms of mol %.

Effects of the respective components are as follows in terms of mol %.

$B_2O_3$ is a network forming oxide, and an essential component in this glass system. When the content is too small, glass formation is not performed, or resistance to devitrification of the glass decreases. Accordingly, it is contained preferably in an amount of 20% or more, and more preferably in an amount of 25% or more. On the other hand, when the content is too large, the refractive index decreases, and further, resistance decreases. Accordingly, the content is restricted to 60% or less, and more preferably, it is 55% or less.

$SiO_2$ is a component improving stability of the glass when added into the glass of this system. However, when the amount introduced is too large, the refractive index decreases, and the glass transition temperature increases. For this reason, the content is preferably 20% or less, and more preferably 18% or less.

$Li_2O$ is a component decreasing the glass transition temperature. However, when the amount introduced is too large, resistance to devitrification of the glass decreases. For this reason, the content is preferably 20% or less, and more preferably 18% or less.

$Na_2O$ and $K_2O$ improve solubility. However, introduction thereof causes a decrease in resistance to devitrification and a decrease in the refractive index. Accordingly, each content is preferably 10% or less, and more preferably 8% or less.

ZnO is an essential component improving the refractive index of the glass and decreasing the glass transition temperature. For this reason, the amount introduced is preferably 5% or more, and more preferably 7% or more. On the other hand, when the amount added is too large, resistance to devitrification decreases to result in failure to obtain the homogeneous glass. Accordingly, it is preferably 50% or less, and more preferably 45% or less.

$La_2O_3$ is an essential component achieving a high refractive index and improving weather resistance when introduced into the $B_2O_3$ system glass. For this reason, the amount introduced is preferably 5% or more, and more preferably 7% or more. On the other hand, when the additive amount is too large, the glass transition temperature increases, or resistance to devitrification of the glass decreases, resulting in failure to obtain the homogeneous glass. Accordingly, the content is preferably 25% or less, and more preferably 22% or less.

$Gd_2O_3$ is a component achieving a high refractive index, improving weather resistance when introduced into the $B_2O_3$ system glass and improving stability of the glass by coexistence with $La_2O_3$. However, when the amount introduced is too large, stability of the glass decreases. Accordingly, the content thereof is preferably 25% or less, and more preferably 22% or less.

$Y_2O_3$ and $Yb_2O_3$ are components achieving a high refractive index, improving weather resistance when introduced into the $B_2O_3$ system glass and improving stability of the glass by coexistence with $La_2O_3$. However, when the amount introduced is too large, stability of the glass decreases. Accordingly, the contents are each preferably 20% or less, and more preferably 18% or less.

The rare-earth oxides such as $La_2O_3$, $Gd_2O_3$, $Y_2O_3$ and $Yb_2O_3$ are components essential for achieving a high refractive index and improving weather resistance of the glass. Accordingly, the total amount of these components, $La_2O_3+Gd_2O_3+Y_2O_3+Yb_2O_3$, is preferably 5% or more, and more preferably 8% or more. However, when the amount introduced is too large, resistance to devitrification of the glass decreases to result in failure to obtain the homogeneous glass. Accordingly, it is preferably 30% or less, and more preferably 25% or less.

$ZrO_2$ is a component for improving the refractive index. However, when the content is too large, resistance to devitrification decreases, or the liquid-phase temperature is excessively increased. Accordingly, the content is preferably 15% or less, and more preferably 10% or less.

$Ta_2O_5$ is a component for improving the refractive index. However, when the content is too large, resistance to devitrification decreases, or the liquid-phase temperature is excessively increased. Accordingly, the content is preferably 20% or less, and more preferably 15% or less.

$Nb_2O_5$ is a component for improving the refractive index. However, when the content is too large, resistance to devitrification decreases, or the liquid-phase temperature is excessively increased. Accordingly, the content is preferably 20% or less, and more preferably 15% or less.

$WO_3$ is a component for improving the refractive index. However, when the content is too large, resistance to devitrification decreases, or the liquid-phase temperature is excessively increased. Accordingly, the content is preferably 20% or less, and more preferably 15% or less.

$Bi_2O_3$ is a component for improving the refractive index. However, when the content is too large, resistance to devitrification decreases, or coloring occurs in the glass to cause a decrease in the refractive index, resulting in a decrease in extraction efficiency. Accordingly, the content is preferably 20% or less, and more preferably 15% or less.

BaO is a component for improving the refractive index. However, when the content is too large, resistance to devitrification decreases. Accordingly, it is preferably 20% or less, and more preferably 15% or less.

In order to conform to the object of the invention, the total amount of the above-mentioned components is desirably 90% or more, and more preferably 95% or more. Even a component other than the above-mentioned components, it may be added for the purposes of refining or an improvement of solubility, as long as it does not deviate from the efficiency of the present invention Such components include, for example, $Sb_2O_3$, $SnO_2$, MgO, CaO, SrO, $GeO_2$, $Ga_2O_3$, $In_2O_3$ and fluorine.

The scattering layer containing $SiO_2$ as an essential component and one or more components of $Nb_2O_5$, $TiO_2$ and $Bi_2O_3$ is preferably a glass within the composition range of: 20 to 50% of $SiO_2$, 0 to 20 of $B_2O_3$, 1 to 20% of $Nb_2O_5$, 1 to 20% of $TiO_2$, 0 to 15% of $Bi_2O_3$, 0 to 15% of $ZrO_2$, provided that $Nb_2O_5+TiO_2+Bi_2O_3+ZrO_2$ is from 5 to 40%, 0 to 40% of $Li_2O$, 0 to 30% of $Na_2O$, 0 to 30% of $K_2O$, provided that $Li_2O+Na_2O+K_2O$ is from 1 to 40%, 0 to 20% of MgO, 0 to 20% of CaO, 0 to 20% of SrO, 0 to 20% of BaO and 0 to 20% of ZnO, in terms of mol %.

$SiO_2$ is an essential component acting as a network former for forming the glass. When the content thereof is too small, no glass is formed. Accordingly, it is preferably 20% or more, and more preferably 22% or more.

$B_2O_3$ is added in relatively small amounts with $SiO_2$, thereby assisting glass formation and decreasing devitrification. However, when the content is too large, the refractive index decreases. Accordingly, the content thereof is preferably 20% or less, and more preferably 18% or less.

$Nb_2O_5$ is an essential component for improving the refractive index, and the content thereof is preferably 1% or more, and more preferably 3% or more. However, excessive addition thereof causes a decrease in resistance to devitrification of the glass to result in failure to obtain the homogeneous glass. Accordingly, the content thereof is desirably 20% or less, and more preferably 18% or less.

$TiO_2$ is an essential component for improving the refractive index, and the content thereof is preferably 1% or more, and more preferably 3% or more. However, excessive addition thereof causes a decrease in resistance to devitrification of the glass to result in failure to obtain the homogeneous glass and causes coloring to increase a loss due to absorption at the time when light propagates in the scattering layer. For this reason, the content thereof is desirably 20% or less, and more preferably 18% or less.

$Bi_2O_3$ is an component for improving the refractive index. However, excessive addition thereof causes a decrease in resistance to devitrification of the glass to result in failure to obtain the homogeneous glass and causes coloring to increase a loss due to absorption at the time when light propagates in the scattering layer. For this reason, the content thereof is desirably 15% or less, and more preferably 12% or less.

$ZrO_2$ is a component improving the refractive index without deteriorating the degree of coloring. However, when the content is too large, resistance to devitrification of the glass decreases to result in failure to obtain the homogeneous glass. For this reason, the content is preferably 15% or less, and more preferably 10% or less.

In order to obtain the high refractive index glass, $Nb_2O_5+TiO_2+Bi_2O_3+ZrO_2$ is preferably 5% or more, and more preferably 8% or more. On the other hand, when this total amount is too large, resistance to devitrification of the glass decreases, or coloring occurs. Accordingly, it is preferably 40% or less, and more preferably 38% or less.

$Li_2O$, $Na_2O$ and $K_2O$ are components improving solubility, decreasing the glass transition temperature and enhancing affinity with the glass substrate. For this reason, the total amount of these components, $Li_2O+Na_2O+K_2O$, is preferably 1% or more, and more preferably 3% or more. On the other hand, when the content of the alkali oxide component is too large, resistance to devitrification of the glass decreases to result in failure to obtain the homogeneous glass. Accordingly, the content thereof is preferably 40% or less, and more preferably 35% or less.

BaO is a component improving the refractive index and improving solubility at the same time. However, when it is excessively contained, stability of the glass is impaired to result in failure to obtain the homogeneous glass. Accordingly, the content thereof is preferably 20% or less, and more preferably 15% or less.

MgO, CaO, SrO and ZnO are components improving solubility of the glass, and moderate addition thereof can decrease resistance to devitrification of the glass. However, when they are excessively contained, devitrification increases to result in failure to obtain the homogeneous glass. Accordingly, the contents thereof are each preferably 20% or less, and more preferably 15% or less.

In order to conform to the object of the invention, the total amount of the above-mentioned components is desirably 90% or more. Further, even a component other than the above-mentioned components may be added for the purposes of refining, an improvement of solubility and the like within the range not impairing the advantages of the invention. Such components include, for example, $Sb_2O_3$, $SnO_2$, $GeO_2$, $Ga_2O_3$, $In_2O_3$, $WO_3$, $Ta_2O_5$, $La_2O_3$, $Gd_2O_3$, $Y_2O_3$ and $Yb_2O_3$.

The scattering layer containing $Bi_2O_3$ as a main component and $SiO_2$, $B_2O_3$ and the like as glass forming auxiliaries is preferably a glass within the composition range of: 10 to 50% of $Bi_2O_3$, 1 to 40 of $B_2O_3$, 0 to 30% of $SiO_2$, provided that $B_2O_3+SiO_2$ is from 10 to 40%, 0 to 20% of $P_2O_5$, 0 to 15% of $Li_2O$, 0 to 15% of $Na_2O$, 0 to 15% of $K_2O$, 0 to 20% of $TiO_2$, 0 to 20% of $Nb_2O_5$, 0 to 20% of $TeO_2$, 0 to 10% of MgO, 0 to 10% of CaO, 0 to 10% of SrO, 0 to 10% of BaO, 0 to 10% of $GeO_2$ and 0 to 10% of $Ga_2O_3$, in terms of mol %.

Effects of the respective components are as follows in terms of mol %.

$Bi_2O_3$ is an essential component achieving a high refractive index and stably forming the glass even when introduced in large amounts. For this reason, the content thereof is preferably 10% or more, and more preferably 15% or more. On the other hand, excessive addition thereof causes coloring in the glass to absorb light which should originally transmit, resulting in a decrease in extraction efficiency. In addition to this, devitrification increases to result in failure to obtain the homogeneous glass. Accordingly, the content thereof is preferably 50% or less, and more preferably 45% or less.

$B_2O_3$ is an essential component acting as a network former in the glass containing $Bi_2O_3$ in large amounts to assist glass formation, and the content thereof is preferably 1% or more, and more preferably 3% or more. However, when the amount added is too large, the refractive index of the glass decreases. Accordingly, it is preferably 40% or less, and more preferably 38% or less.

$SiO_2$ is a component acting to assist $Bi_2O_3$ in glass formation as a network former. However, when the content is too large, the refractive index decreases. Accordingly, it is preferably 30% or less, and more preferably 25% or less.

$B_2O_3$ and $SiO_2$ improve glass formation by a combination thereof, so that the total amount thereof is preferably 5% or more, and more preferably 10% or more. On the other hand, when the amount introduced is too large, the refractive index decreases. Accordingly, it is preferably 40% or less, and more preferably 38% or less.

$P_2O_5$ is a component assisting glass formation and inhibiting deterioration of the degree of coloring. However, when the content is too large, the refractive index decreases. Accordingly, it is preferably 20% or less, and more preferably 18% or less.

$Li_2O$, $Na_2O$ and $K_2O$ are components for improving glass solubility and further decreasing the glass transition temperature. However, when they are excessively contained, devitrification increases to result in failure to obtain the homogeneous glass. Accordingly, the contents thereof are each preferably 15% or less, and more preferably 13% or less. Further, when the total amount of the above alkali oxide components, $Li_2O+Na_2O+K_2O$, is too large, the refractive index decreases, and further, resistance to devitrification decreases. Accordingly, it is preferably 30% or less, and more preferably 25% or less.

$TiO_2$ is a component improving the refractive index. However, when the content is too large, coloring occurs, or resistance to devitrification decreases, resulting in failure to obtain the homogeneous glass. Accordingly, the content is preferably 20% or less, and more preferably 18% or less.

$Nb_2O_5$ is a component improving the refractive index. However, when the amount introduced is too large, resistance to devitrification of the glass decreases to result in failure to obtain the homogeneous glass. For this reason, the content is preferably 20% or less, and more preferably 18% or less.

$TeO_2$ is a component improving the refractive index without deteriorating the degree of coloring. However, excessive introduction thereof results in a decrease in resistance to devitrification, which causes coloring at the time when fired after fritting. Accordingly, the content thereof is preferably 20% or less, and more preferably 15% or less.

$GeO_2$ is a component improving stability of the glass while keeping the refractive index relatively high. However, it is extremely expensive, so that the content is preferably 10% or less, and more preferably 8% or less. It is still more preferred not to contain it.

$Ge_2O_3$ is a component improving stability of the glass while keeping the refractive index relatively high. However, it is extremely expensive, so that the content is preferably 10% or less, and more preferably 8% or less. It is still more preferred not to contain it.

In order to conform to the object of the invention, the total amount of the above-mentioned components is desirably 90% or more, and more preferably 95% or more. Even a component other than the above-mentioned components may be added for the purposes of refining, an improvement of solubility, adjustment of the refractive index, and the like within the range not impairing the advantages of the invention. Such components include, for example, $Sb_2O_3$, $SnO_2$, $In_2O_3$, $ZrO_2$, $Ta_2O_5$, $WO_3$, $La_2O_3$, $Gd_2O_3$, $Y_2O_3$, $Yb_2O_3$ and $Al_2O_3$.

The glass composition for forming the scattering layer is not particularly limited, as long as desired scattering characteristics are obtained and it can be frit-pasted and fired. However, in order to maximize the extraction efficiency, examples thereof include a system containing $P_2O_5$ and one or more components of $Nb_2O_5$, $Bi_2O_3$, $TiO_2$ and $WO_3$; a system containing $B_2O_3$ and $La_2O_3$ as essential components and one or more components of $Nb_2O_5$, $ZrO_2$, $Ta_2O_5$ and $WO_3$; a system containing $SiO_2$ as an essential component and one or more components of $Nb_2O_5$ and $TiO_2$; a system containing $Bi_2O_3$ as a main component and $SiO_2$, $B_2O_3$ and the like as glass forming auxiliaries, and the like. Incidentally, in all glass systems used as the scattering layer in the invention, $As_2O_3$, PbO, CdO, $ThO_2$ and HgO which are components having adverse effects on the environment should not be contained, except for the case of inevitable contamination therewith as impurities derived from raw materials.

In the composition containing $P_2O_5$ and one or more components of $Nb_2O_5$, $Bi_2O_3$, $TiO_2$ and $WO_3$, a glass within the following composition range is preferred. Incidentally, the following composition is represented by mol %.

2. Resin

The resin supports the glass powder and the filler after screen printing. As a specific example, there is used ethyl cellulose, nitrocellulose, an acrylic resin, vinyl acetate resin, a butyral resin, a melamine resin, an alkyd resin, a rosin resin or the like. Used as base resins are ethyl cellulose and nitrocellulose. Incidentally, a butyral resin, a melamine resin, an alkyd resin and a rosin resin are used as additives for improving coated film strength. The debinderizing temperature at the time of firing is from 350° C. to 400° C. for ethyl cellulose, and from 200° C. to 300° C. for nitrocellulose.

3. Solvent

The solvent dissolves the resin and adjusts the viscosity necessary for printing. Further, it does not dry during printing, and rapidly dries in a drying process. One having a boiling point of 200° C. to 230° C. is desirable. For adjustment of the viscosity, the solid content ratio and the drying rate, a mixture of some solvents is used. Specific examples include ether type solvents (butyl carbitol (BC), butyl carbitol acetate (BCA), diethylene glycol di-n-butyl ether, dipropylene glycol dibutyl ether, tripropylene glycol butyl ether and butyl cellosolve acetate), alcohol type solvents (α-terpineol, pine oil and Dowanol), ester type solvents (2,2,4-trimethyl-1,3-pentanediol monoisobutyrate) and phthalic acid ester type solvents (DBP (dibutyl phthalate), DMP (dimethyl phthalate) and DOP (dioctyl phthalate)). Mainly used are α-terpineol and 2,2,4-trimethyl-1,3-pentanediol monoisobutyrate. Incidentally, DBP (dibutyl phthalate), DMP (dimethyl phthalate) and DOP (dioctyl phthalate) also function as a plasticizer.

4. Others

A surfactant may be used for viscosity adjustment and frit dispersion promotion. A silane coupling agent may be used for fit surface modification.

Preparation Method of Frit Paste (1) Frit Paste

A glass powder and a vehicle are prepared. The vehicle as used herein means a mixture of a resin, a solvent and a surfactant. Specifically, it is obtained by putting the resin, the surfactant and the like in the solvent heated at 50° C. to 80° C., and then, allowing the resulting mixture to stand for about 4 hours to about 12 hours, followed by filtering.

Then, the glass powder and the vehicle are mixed by a planetary mixer, and then, uniformly dispersed by a three-roll mill. Thereafter, the resulting mixture is kneaded by a kneader. Usually, the vehicle is used in an amount of 20 to 30 wt % based on 70 to 80 wt % of the glass material.

As the glass powder used herein, one having a particle size $D_{10}$ of 0.2 μm or more and $D_{90}$ of 5 μm or less is desirably used. When $D_{90}$ of the particle size exceeds 5 μm, the value to the film thickness of the scattering layer increases to result in a tendency to decrease film thickness uniformity. On the other hand, when $D_{10}$ of the particle size is less than 0.2 μm, the interface existence ratio increases, which poses a problem that crystals are easily precipitated to cause easy devitrification.

(2) Printing

The frit paste prepared in (1) is printed by using a screen printer. The film thickness of a frit paste film formed can be controlled by the mesh roughness of a screen plate, the thickness of an emulsion, the pressing force in printing, the squeegee pressing amount and the like. After printing, drying is performed in a firing furnace.

(3) Firing

A substrate printed and dried is fired in the firing furnace. The firing comprises debinderizing treatment for decomposing the resin in the frit paste and allowing it to disappear and firing treatment for sintering and softening the glass powder. The debinderizing temperature is from 350° C. to 400° C. for ethyl cellulose, and from 200° C. to 300° C. for nitrocellulose. Heating is carried out in the atmosphere for 30 minute to 1 hour. Then, the temperature is raised to sinter and soften the glass. The firing temperature is from the softening temperature to the softening temperature +20° C., and the shape and size of pores remaining in the inside vary depending on the treatment temperature. Then, cooling is carried out to form a glass layer on the substrate. Although the thickness of the film obtained is from 5 μm to 30 μm, a thicker glass layer can be formed by lamination printing.

Incidentally, when a doctor blade printing method or a die coat printing method is used in the above-mentioned printing process, it becomes possible to form a thicker film (green sheet printing). A film is formed on a PET film or the like, and dried, thereby forming a green sheet. Then, the green sheet is heat pressed on the substrate by a roller or the like, and a fired film is obtained through a firing procedure similar to that of the frit paste. The thickness of the resulting film is from 50 μm to 400 μm. However, it is possible to form a thicker glass film by using the green sheets laminated.

Figure 11:
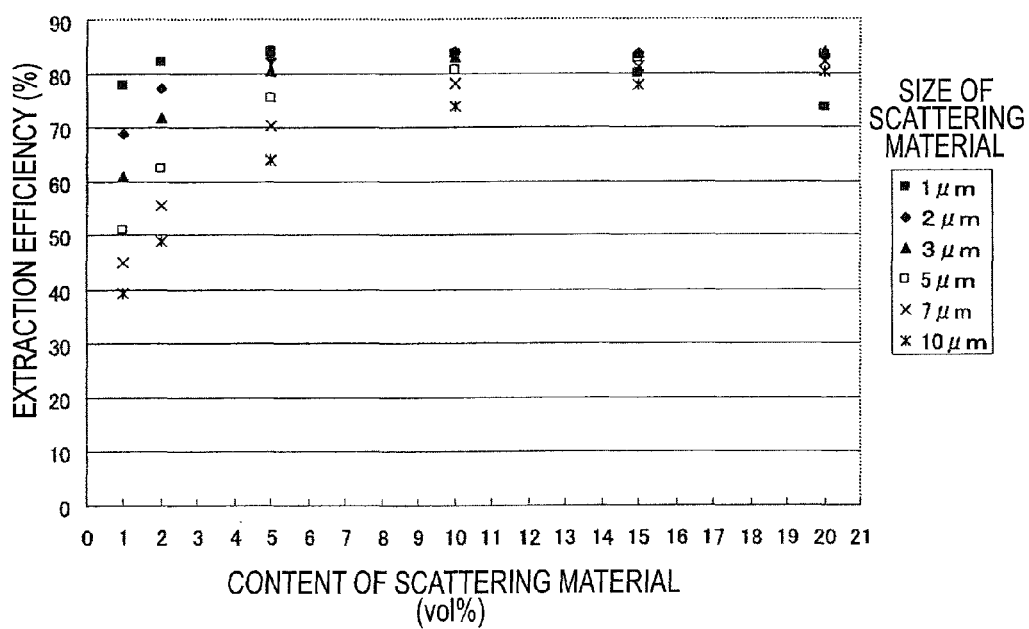
FIG. 11 is a graph showing the relationship between the light-extraction efficiency (%) and the content (vol %) of a scattering material.

Density of Scattering Material in Scattering Layer and Size of Scattering Material FIG. 11 is a graph showing the relationship between the light-extraction efficiency (%) and the content (vol %) of a scattering material. In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graph, calculation was made for the electron-injection-transport layer (thickness: 1 μm, refractive index: 1.9), the light-emitting layer (thickness: 1 μm, refractive index: 1.9), the hole-injection-transport layer (thickness: 1 μm, refractive index: 1.9), the scattering layer (thickness: 30 μm, the refractive index of the base material: 1.9, the refractive index of the scattering material: 1.0), the translucent electrode (thickness: 100 μm, refractive index: 1.54) and the light flux 1,000 lm divided into 100,000 rays (wavelength: 550 nm). As shown in the graph, the content of the scattering material in the scattering layer is preferably 1 vol % or more. Although the behavior varies depending on the size of the scattering material, when the content of the scattering material in the scattering layer is 1 vol %, the light-extraction efficiency can be 40% or more. Further, when the content of the scattering material in the scattering layer is 5 vol % or more, the light-extraction efficiency can be 65% or more. This is therefore more preferred. Furthermore, when the content of the scattering material in the scattering layer is 10 vol % or more, the light-extraction efficiency can be improved to 70% or more. This is therefore still more preferred. In addition, when the content of the scattering material in the scattering layer is approximately 15 vol %, the light-extraction efficiency can be improved to 80% or more. This is therefore particularly preferred. Incidentally, in view of mass production of the scattering layers, the content is preferably from 10 vol % to 15 vol % at which it is difficult to be affected by production variations.

Incidentally, the graph also shows the relationship between the size of the scattering material and the light-extraction efficiency. Specifically, in the case where the size of the scattering material is 1 μm, the light-extraction efficiency can be 70% or more, even when the content of the scattering material is within the range of 1 vol % to 20 vol %. In particular, when the content of the scattering material is within the range of 2 vol % to 15 vol %, the light-extraction efficiency can be 80% or more. Further, in the case where the size of the scattering material is 2 μm, the light-extraction efficiency can be 65% or more, even when the content of the scattering material is within the range of 1 vol % to 20 vol %. In particular, when the content of the scattering material is 5 vol % or more, the light-extraction efficiency can be 80% or more. Furthermore, in the case where the size of the scattering material is 3 μm, the light-extraction efficiency can be 60% or more, even when the content of the scattering material is within the range of 1 vol % to 20 vol %. In particular, when the content of the scattering material is 5 vol % or more, the light-extraction efficiency can be 80% or more. In addition, in the case where the size of the scattering material is 5 μm, the light-extraction efficiency can be 50% or more, even when the content of the scattering material is within the range of 1 vol % to 20 vol %. In particular, when the content of the scattering material is 10 vol % or more, the light-extraction efficiency can be 80% or more. Further, in the case where the size of the scattering material is 7 µm, the light-extraction efficiency can be 45% or more, even when the content of the scattering material is within the range of 1 vol % to 20 vol %. In particular, when the content of the scattering material is 10 vol % or more, the light-extraction efficiency can be 80% or more. Furthermore, in the case where the size of the scattering material is 10 µm, the light-extraction efficiency can be 40% or more, even when the content of the scattering material is within the range of 1 vol % to 20 vol %. In particular, when the content of the scattering material is 15 vol % or more, the light-extraction efficiency can be 80% or more. The above shows that when the size of the scattering material is large, the efficiency is improved with an increase in the content. On the other hand, it is seen that when the size of the scattering material is small, the light-extraction efficiency is improved, even in the case where the content is small.

Refractive Index of Scattering Material

Figure 12:
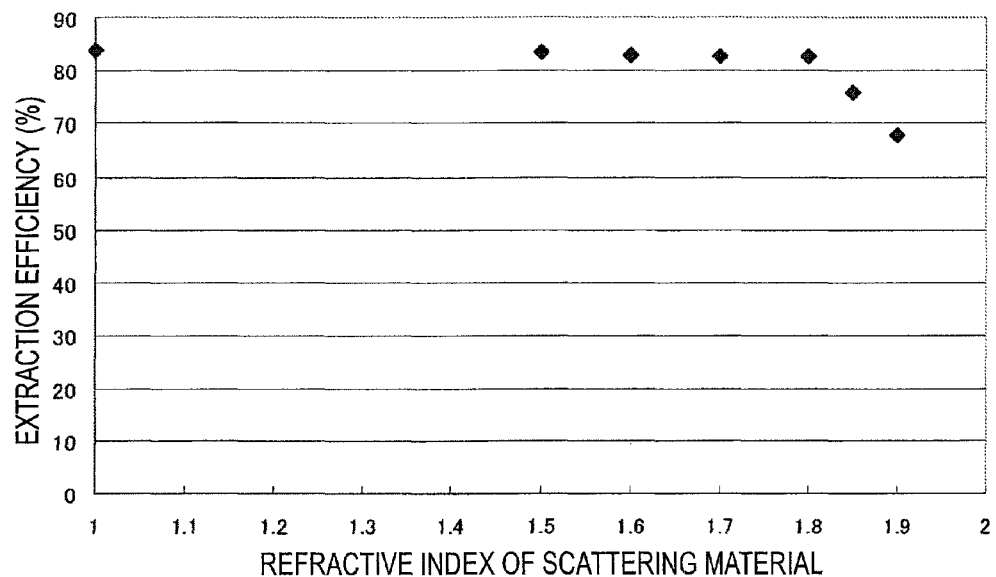
FIG. 12 is a graph showing the relationship between the light-extraction efficiency (%) and the refractive index of a scattering material.

FIG. 12 is a graph showing the relationship between the light-extraction efficiency (%) and the refractive index of a scattering material. In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (thickness: 30 µm, the refractive index of the base material: 2.0, the size of the scattering material: 2 µm, the number of the scattering materials: about 36,000,000, the content of the scattering material: 15 vol %), the translucent electrode (thickness: 100 µm, refractive index: 1.54) and the light flux 1,000 lm divided into 100,000 rays (wavelength: 550 nm). As shown in the graph, when the difference between refractive index (2.0) of the base material and the refractive index of the scattering material is 0.2 or more (the refractive index of the scattering material is 1.8 or less), the light-extraction efficiency can be 80% or more. This is therefore particularly preferred. Incidentally, even when the difference between refractive index of the base material and the refractive index of the scattering material is 0.1 (the refractive index of the scattering material is 1.9), the light-extraction efficiency can be 65% or more.

Thickness of Scattering Layer

Figure 13:
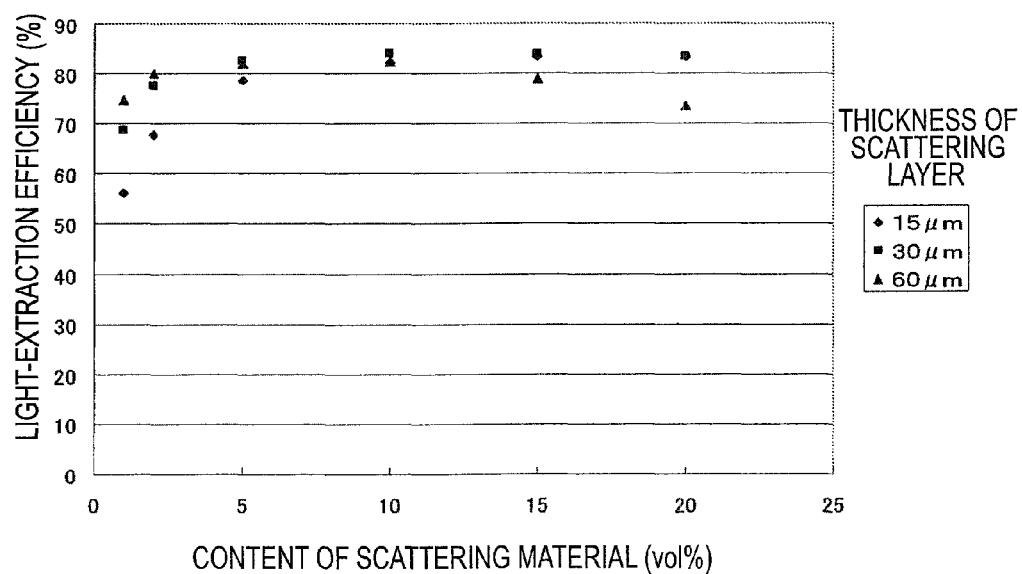
FIG. 13 is a graph showing the relationship between the light-extraction efficiency (%) and the content (vol %) of a scattering material.

FIG. 13 is a graph showing the relationship between the light-extraction efficiency (%) and the content (vol %) of a scattering material. In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (the refractive index of the base material: 2.0, the size of the scattering material: 2 µm, the refractive index of the scattering material: 1.0), the translucent electrode (thickness: 100 µm, refractive index: 1.54) and the light flux 1,000 lm divided into 100,000 rays (wavelength: 550 nm) As shown in the graph, in the case where the content of the scattering material in the scattering layer is 1 vol % or more, the light-extraction efficiency can be 55% or more, even when the thickness of the scattering layer is 15 µm or less. This is therefore preferred. Further, in the case where the content of the scattering material in the scattering layer is from 5 vol % to 15 vol %, the light-extraction efficiency can be 80% or more, even when the thickness of the scattering layer is 15 µm or less, or 60 µm or more. This is therefore particularly preferred.

Number of Scattering Materials

Figure 14:
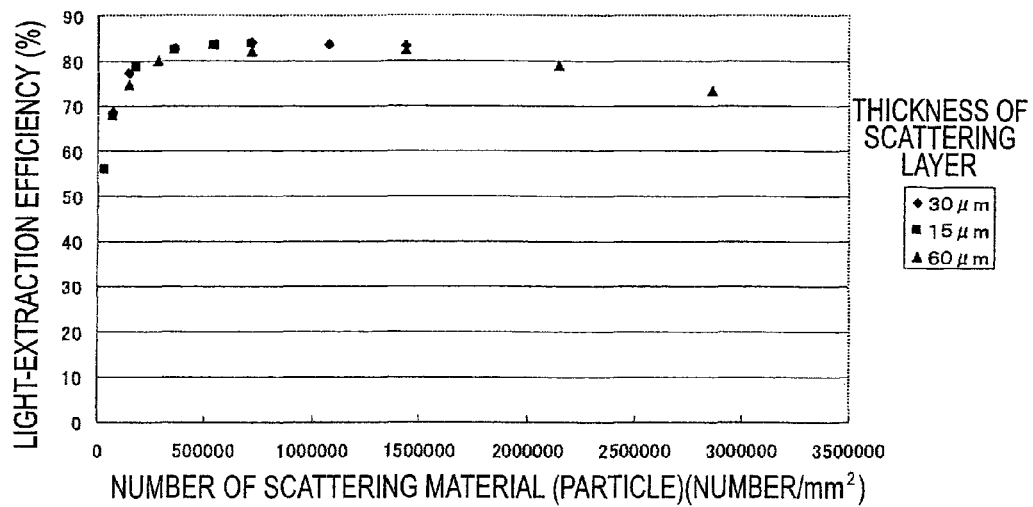
FIG. 14 is a graph showing the relationship between the light-extraction efficiency (%) and the number (number/$mm^2$) of scattering materials.

FIG. 14 is a graph showing the relationship between the light-extraction efficiency (%) and the number (number/$mm^2$) of scattering material (particles). In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (the refractive index of the base material: 2.0, the size of the scattering material: 2 µm, the refractive index of the scattering material: 1.0), the translucent electrode (thickness: 100 µm, refractive index: 1.54) and the light flux 1,000 lm divided into 100,000 rays (wavelength: 550 nm). As shown in the graph, it is seen that the light-extraction efficiency varies depending on the number of the scattering materials, regardless of the thickness of the scattering layer. As shown in the graph, when the number of the scattering materials per 1 $mm^2$ of the scattering layer is $1\times10^4$ or more, the light-extraction efficiency can be 55% or more. This is therefore preferred. Further, when the number of the scattering materials per 1 $mm^2$ of the scattering layer is $2.5\times10^5$ or more, the light-extraction efficiency can be 75% or more. This is therefore more preferred. Furthermore, when the number of the scattering materials per 1 $mm^2$ of the scattering layer is from $5\times10^5$ to $2\times10^6$, the light-extraction efficiency can be 80% or more. This is therefore particularly preferred. Here, even when the size of the scattering material is 60 µm or more and the number of the scattering materials is $3\times10^6$, the light-extraction efficiency can be 70% or more.

Transmittance of Base Material of Scattering Layer

Figure 15:
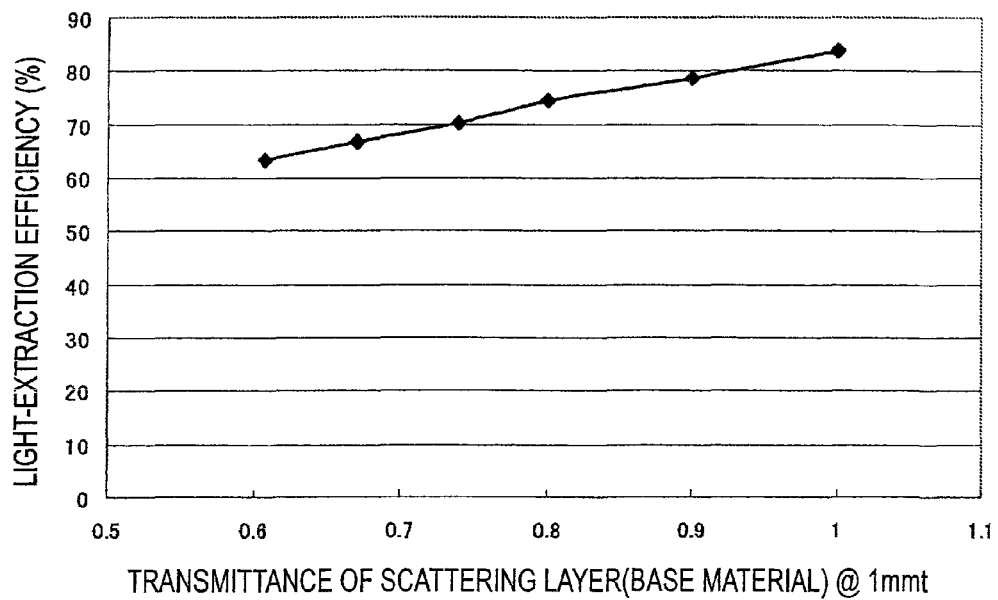
FIG. 15 is a graph showing the relationship between the light-extraction efficiency (%) and the transmittance (@1 mmt) of a base material of the scattering layer.

FIG. 15 is a graph showing the relationship between the light-extraction efficiency (%) and the transmittance at 1 mmt of a base material of the scattering layer. In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (thickness: 30 µm, the refractive index of the base material: 2.0, the size of the scattering material: 2 µm, the refractive index of the scattering material: 1.0, the number of the scattering materials: about 36,000,000, the content of the scattering material: 15 vol %), the translucent electrode (thickness: 100 µm, refractive index: 1.54) and the light flux 1,000 lm divided into 100,000 rays (wavelength: 550 nm). As shown in the graph, even when the transmittance of the base material of the scattering layer is 50%, the light-extraction efficiency can be 55% or more. Further, when the transmittance of the base material of the scattering layer is 90%, the light-extraction efficiency can be 80% or more. When a glass is used as the base material, the transmittance thereof is about 98%. Accordingly, the light-extraction efficiency can exceed 80%.

Reflectivity of Cathode

Figure 16:
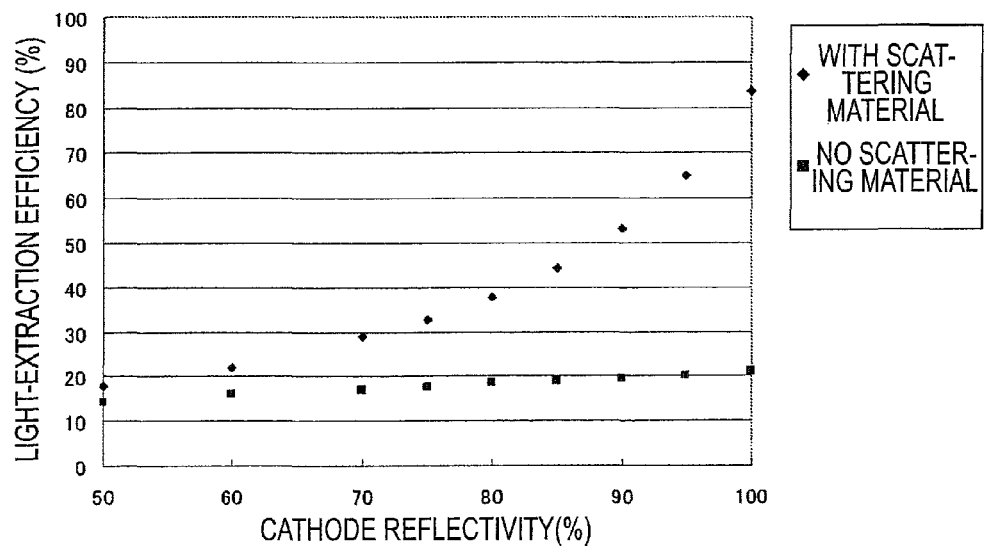
FIG. 16 is a graph showing the relationship between the light-extraction efficiency (%) and the reflectivity (%) of a cathode.

FIG. 16 is a graph showing the relationship between the light-extraction efficiency (%) and the reflectivity (%) of a cathode. In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graph, calculation was made for the electron-injection-transport layer (thickness: 1 μm, refractive index: 1.9), the light-emitting layer (thickness: 1 μm, refractive index: 1.9), the hole-injection-transport layer (thickness: 1 μm, refractive index: 1.9), the scattering layer (thickness: 30 μm, the refractive index of the base material: 2.0, the size of the scattering material: 2 μm, the refractive index of the scattering material: 1.0, the number of the scattering materials: about 36,000,000, the content of the scattering material: 15 vol %), the translucent electrode (thickness: 100 μm, refractive index: 1.54) and the light flux 1,000 lm divided into 100,000 rays (wavelength: 550 nm). As shown in the graph, when the reflectivity of the cathode decreases, the light-extraction efficiency also decreases. Here, the cathode reflectivity of a blue LED is from 80% to 90%, so that it is seen that the light-extraction efficiency of 40% to 50% is obtained. Here, the reflectivity of the organic LED element of patent document 1 is assumed to be 100%, and the light-extraction efficiency thereof is about 50%. On the other hand, when the reflectivity of the organic LED element of the invention is taken as 100% and the same conditions as in the reflectivity of the organic LED element of patent document 1 are applied, the light-extraction efficiency thereof exceeds 80%, as seen from the graph. Namely, it is seen that the light-extraction efficiency of the organic LED element of the invention is 1.6 times better than the light-extraction efficiency of the organic LED element of patent document 1. Accordingly, the organic LED of the invention can be used as a light source for lighting in place of a fluorescent lamp.

Refractive Indexes of Scattering Layer and Anode

Figure 17:
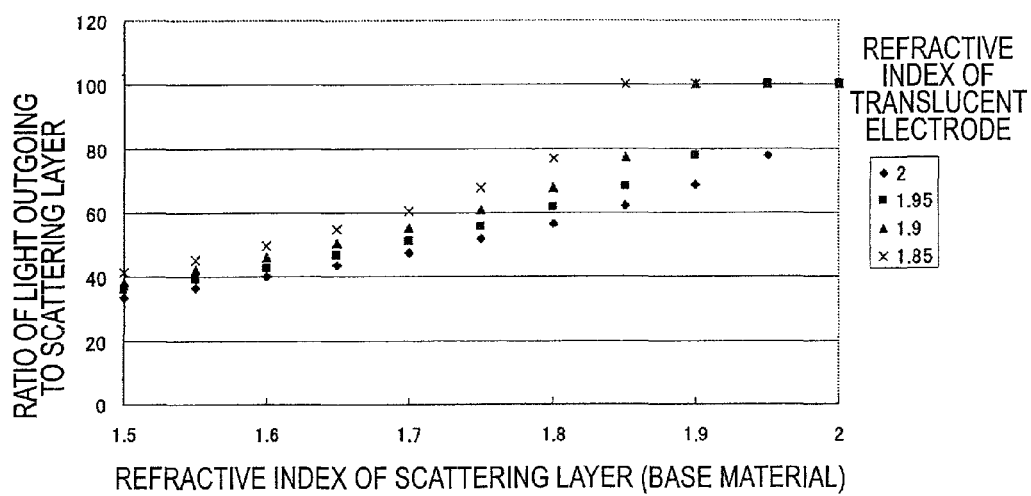
FIG. 17 is a graph showing the relationship between the ratio of light outgoing to the scattering layer and the refractive index of the base material of the scattering layer.

FIG. 17 is a graph showing the relationship between the ratio of light outgoing to the scattering layer and the refractive index of the base material of the scattering layer. In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graph, calculation was made for the electron-injection-transport layer (thickness: 1 μm, refractive index: 1.9), the light-emitting layer (thickness: 1 μm, refractive index: 1.9), the hole-injection-transport layer (thickness: 1 μm, refractive index: 1.9), the scattering layer (thickness: 30 μm, the size of the scattering material: 2 μm, the refractive index of the scattering material: 1.0, the number of the scattering materials: about 36,000,000, the content of the scattering material: 15 vol %), the translucent electrode (thickness: 100 μm, refractive index: 1.54) and the light flux 1,000 lm divided into 100,000 rays (wavelength: 550 nm). As shown in the graph, when the refractive index of an anode is larger than the refractive index of the scattering layer, total reflection occurs on a surface of the scattering layer to decrease the amount of light entering the scattering layer. Accordingly, it is seen that the light-extraction efficiency decreases. It is therefore preferred that the refractive index of the scattering layer of the invention is equivalent to or higher than the refractive index of the anode.

Figure 18:
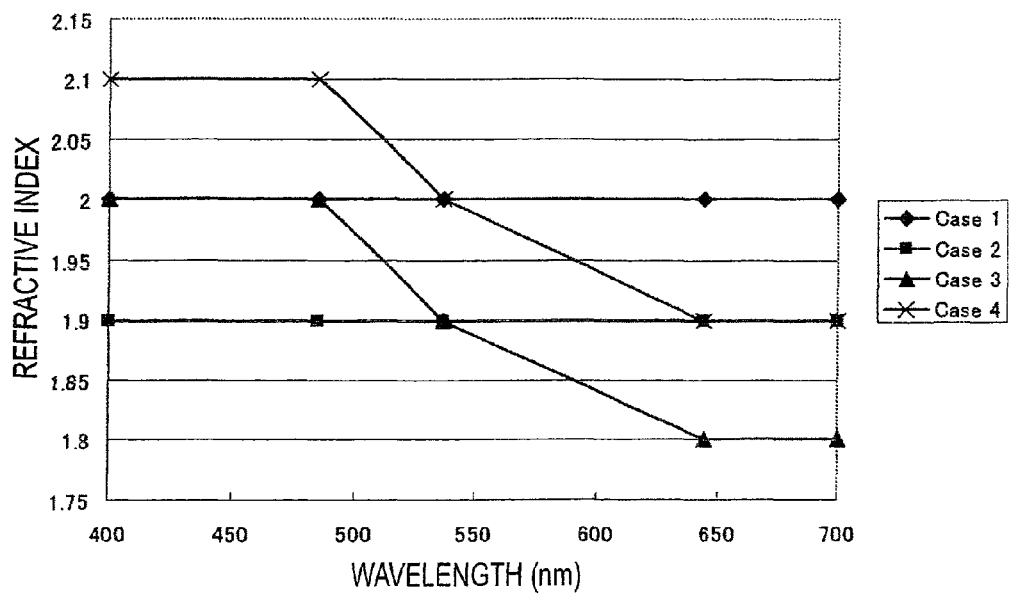
FIG. 18 is a graph showing the relationship between the wavelength and the refractive index of the base material of the scattering layer.
Figure 19:
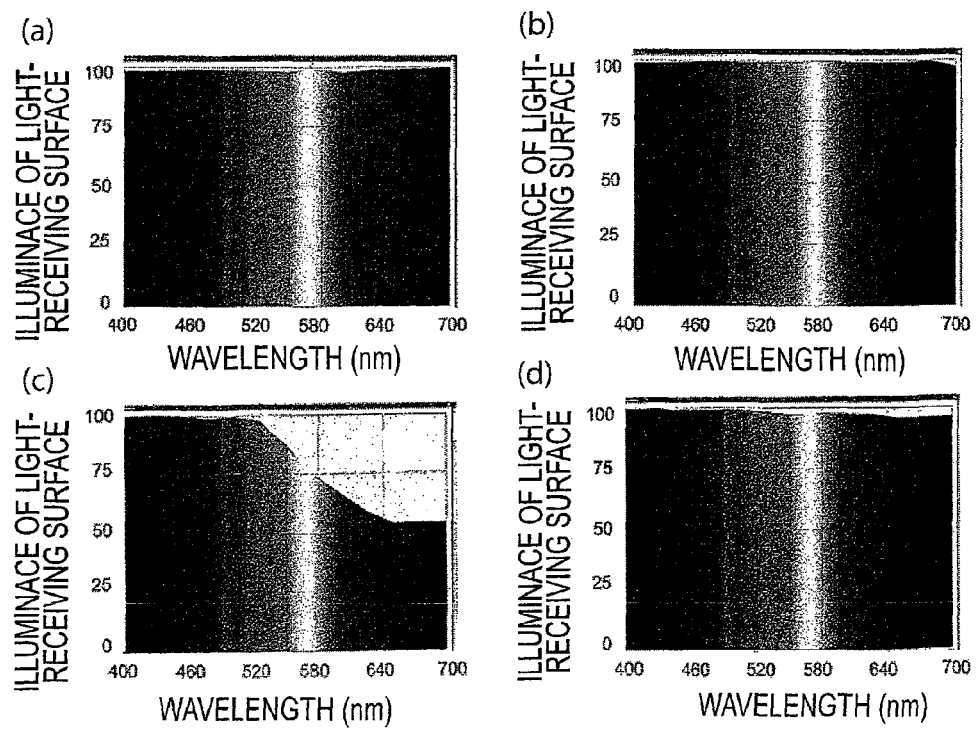
FIG. 19 show the results of a simulation of the relationship between the wavelength and the illuminance of a light receiving surface.

Relationship between Refractive Index of Base Material of Scattering Layer and White Emitted Light Color FIG. 18 is a graph showing the relationship between the wavelength and the refractive index of the base material of the scattering layer. FIG. 19 is the results showing the relationship between the wavelength and the illuminance of a light receiving surface. Incidentally, FIG. 19(a) is a spectral diagram corresponding to Case 1 of FIG. 18, FIG. 19(b) is a spectral diagram corresponding to Case 2 of FIG. 18, FIG. 19(c) is a spectral diagram corresponding to Case 3 of FIG. 18, and FIG. 19(d) is a spectral diagram corresponding to Case 4 of FIG. 18. In the following, for simplicity, calculation was made dividing the organic layer and the translucent electrode into three parts, the electron-injection-transport layer and the light-emitting layer, the hole-injection-transport layer, and the translucent electrode. Here, in the above-mentioned graphs, calculation was made for the electron-injection-transport layer (thickness: 1 μm, refractive index: 1.9), the light-emitting layer (thickness: 1 μm, refractive index: 1.9), the hole-injection-transport layer (thickness: 1 μm, refractive index: 1.9), the scattering layer (thickness: 30 μm, the refractive index of the base material, the size of the scattering material: 2 μm, the refractive index of the scattering material: 1.0, the number of the scattering materials: about 36,000,000, the content of the scattering material: 15 vol %), the translucent electrode (thickness: 100 μm, refractive index: 1.54) and the light flux 1,000 lm divided into 100,000 rays. Incidentally, the refractive index of the translucent electrode was taken as 1.9. As shown in FIG. 19, when the refractive index of the base material of the scattering layer is lower than the refractive indexes of the organic layer and the translucent electrode, it is seen that the extraction efficiency at that wavelength decreases to result in changes in color. To describe it concretely, as known from FIG. 19(c), in the case where the wavelength is 550 nm or more, it is seen that the light-emitting efficiency decreases when the refractive index becomes 1.9 or less. Namely, redness of the organic LED element deteriorates. In this case, it becomes necessary to form the element in which redness is strengthened.

Measuring Methods of Refractive Index of Scattering Layer

There are the following two methods for measuring the refractive index of the scattering layer. One is a method of analyzing composition of the scattering layer, thereafter preparing a glass having the same composition, and evaluating the refractive index by a prism method. The other is a method of polishing the scattering layer as thin as 1 to 2 μm, and performing ellipsometry measurement in a region of about 10 μm in diameter having no pores to evaluate the refractive index. Incidentally, in the invention, it is assumed that the refractive index is evaluated by the prism method.

Surface Roughness of Scattering Layer

The scattering layer has a main surface on which the translucent electrode is provided. As described above, the scattering layer of the invention contains the scattering material. As described above, when the size of the scattering material is large, even the smaller content thereof can improve the light-extraction efficiency. However, according to experiments of the inventors, there is a tendency that the larger the size is, the larger the arithmetic average roughness (Ra) of the main surface of the scattering layer becomes, when projected from the main surface of the scattering layer. As described above, the translucent electrode is provided on the main surface of the scattering layer. Accordingly, there is a problem that the larger arithmetic average roughness (Ra) of the main surface of the scattering layer causes a short circuit between the translucent electrode and the scattering layer, resulting in no light emission of the organic EL element. The above-mentioned patent document 1 discloses, in paragraph 0010, that the unevenness formed on the substrate poses a problem even when it is about several microns. However, according to experiments by the inventors, it has been proved that light emission of the organic EL element is not obtained in the case of several microns.

Translucent Electrode

The translucent electrode (anode) 103 is required to have a translucency of 80% or more, in order to extract the light generated in the organic layer 110 to the outside. Further, in order to inject many holes, one having a high work function is required. Specifically, there is used a material such as ITO (indium tin oxide), $SnO_2$, ZnO, IZO (indium zinc oxide), AZO (ZnO—$Al_2O_3$: a zinc oxide doped with aluminum), GZO (ZnO—$Ga_2O_3$: a zinc oxide doped with gallium), Nb-doped $TiO_2$ or Ta-doped $TiO_2$. The thickness of the anode 103 is preferably 100 nm or more. Incidentally, the refractive index of the anode 103 is from 1.9 to 2.2. Here, an increase in carrier concentration can decrease the refractive index of ITO. ITO is commercially available as a standard containing 10 wt % of $SnO_2$. The refractive index of ITO can be decreased by increasing the Sn concentration more than this. However, although the carrier concentration is increased by an increase in the Sn concentration, the mobility and transmittance are decreased. It is therefore necessary to determine the Sn amount, achieving a balance of these. Incidentally, it goes without saying that the translucent electrode may be used as the cathode.

Organic Layer (Layer Having Light-Emitting Function)

The organic layer 110 is a layer having a light-emitting function and comprises a hole-injection layer 111, hole-transport layer 112, a light-emitting layer 113, an electron-transport layer 114 and an electron-injection layer 115. The refractive index of the organic layer 110 is from 1.7 to 1.8.

Hole-Injection Layer

As the hole-injection layer 111, one whose ionization potential is not so different from the anode 103 is required, in order to lower a hole-injection barrier. An improvement of charge-injection efficiency from an electrode interface in the hole-injection layer 111 decreases the driving voltage of the element and increases charge-injection efficiency thereof. There is widely used polyethylenedioxythiophene doped with polystyrene sulfonic acid (PSS) (PEDOT:PSS), as a polymer, and copper phthalocyanine (CuPc) of the phthalocyanine family as a low-molecular substance.

Hole-Transport Layer

The hole-transport layer 112 plays a role to transport holes injected from the hole-injection layer 111 to the light-emitting layer 113. As the hole-transport layer 112, there is used, specifically, a triphenylamine derivative, N,N'-bis(1-naphthyl)-N,N'-diphenyl-1,1'-biphenyl-4,4'-diamine (NPD), N,N'-diphenyl-N,N'-bis[N-phenyl-N-(2-naphthyl)-4'-aminobiphenyl-4-yl]-1,1'-biphenyl-4,4'-diamine (NPTE), 1,1-bis[(di-4-tolylamino)phenyl]cyclohexane (HTM2), N,N'-diphenyl-N,N'-bis(3-methylphenyl)-1,1'-diphenyl-4,4'-diamine (TPD) or the like. The thickness of the hole-transport layer 112 is preferably from 10 nm to 150 nm. The thinner the thickness is, the lower the voltage can be. However, it is particularly preferably from 10 nm to 150 nm, in terms of a problem of the interelectrode short circuit.

Light-Emitting Layer

The light-emitting layer provides a field in which injected electrons and holes recombine with each other, and a material having high light-emitting efficiency is used. To describe it in detail, a light-emitting host material and a doping material of a light-emitting dye used in the light-emitting layer 113 function as recombination centers of the holes and the electrons injected from the anode and the cathode. Further, doping of the host material in the light-emitting layer with the light-emitting dye provides high light emitting efficiency, and converts the light-emitting wavelength. These are required to have a suitable energy level for charge injection, to be excellent in chemical stability and heat resistance, and to form a homogeneous amorphous film. Further, these are required to be excellent in the kind of emission color and color purity, and to have high light-emitting efficiency. The organic light-emitting materials includes low-molecular and polymer materials. Further, they are classified into fluorescent and phosphorescent materials according to the light-emitting mechanism. Specifically, the light-emitting layer 113 includes metal complexes of quinoline derivatives such as a tris(8-quinolinolate) aluminum complex ($Alq_3$), bis(8-hydroxy)quinaldine aluminum phenoxide ($Alq'_2OPh$), bis(8-hydroxy)quinaldine aluminum 2,5-dimethylphenoxide (BAlq), a mono(2,2,6,6-tetra-methyl-3,5-heptanedionate)lithium complex (Liq), a mono(8-quinolinolate)sodium complex (Naq), a mono(2,2,6,6-tetramethyl-3,5-heptanedionate)lithium complex, a mono (2,2,6,6-tetramethyl-3,5-heptanedionate)sodium complex and a bis(8-quinolinolate)calcium complex ($Caq_2$), and fluorescent substances such as tetraphenylbutadiene, phenylquinacridone (QD), anthracene, perylene and coronene. As the host material, preferred is a quinolinolate complex, and particularly preferred is an aluminum complex having 8-quinolinol or a derivative thereof as a ligand.

Electron-Transport Layer

The electron-transport layer 114 plays a role to transport holes injected from the electrode. As the electron-transport layer 114, there is used, specifically, a quinolinol aluminum complex ($Alq_3$), an oxadiazole derivative (for example, 2,5-bis(1-naphthyl)-1,3,4-oxadiazole (BND), 2-(4-t-butyl-phenyl)-5-(4-biphenyl)-1,3,4-oxadiazole (PBD) or the like), a triazole derivative, a bathophenanthroline derivative, a silole derivative or the like.

Electron-Injection Layer

As the electron-injection layer 115, one which increases electron injection efficiency is required. Specifically, a layer doped with an alkali metal such as lithium (Li) or cesium (Cs) is provided on a cathode interface, as the electron-injection layer 115.

Reflective Electrode

As the reflective electrode (cathode) 120, a metal having a small work function or an alloy thereof may be used. Specifically, examples of the cathode 120 include an alkali metal, an alkaline earth metal, a metal of group 3 in the periodic table. Of these, Aluminum (Al), magnesium (Mg), an alloy thereof or the like is preferably used. Further, as a cathode 120, a co-vapor-deposited film of Al and MgAg, a laminated electrode in which Al is vapor-deposited on a thin vapor-deposited film of LiF or $Li_2O$, or the like may be used. Further, in system using a polymer, a laminate of calcium (Ca) or barium (Ba) and aluminum (Al), or the like may be used as the cathode 120.

Incidentally, it goes without saying that the reflective electrode may be used as the anode.

Process for Producing Translucent Electrode-Attached Translucent Substrate (Laminate for Organic LED Element)

Figure 20:
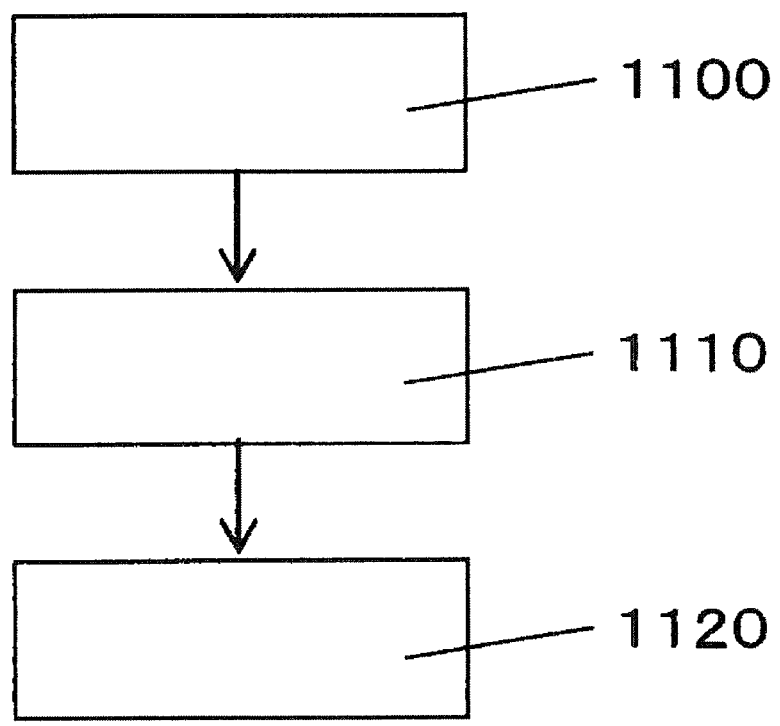
FIG. 20 is a flow chart showing a process for producing a substrate for an organic LED element of the invention.

The process for producing the translucent electrode-attached translucent substrate of the invention will be described below with reference to the drawing. FIG. 20 is a flow chart showing a process for producing the translucent electrode-attached translucent substrate of the invention. The process for producing the translucent electrode-attached translucent substrate of the invention comprises the step of preparing a translucent substrate (step 1100), the step of forming on the translucent substrate a scattering layer comprising a base material having a first refractive index at a wavelength of emitted light of an organic LED element and a plurality of scattering materials provided in the inside of the base material and having a refractive index different from that of the base material (step 1110), and the step of forming on the scattering layer a translucent electrode having a second refractive index equal to or lower than the first refractive index (step 1120).

First, the translucent substrate is prepared (step 1100). Specifically, a glass substrate or a plastic substrate is used herein as the translucent substrate.

Then, there is prepared the scattering layer comprising the base material having a first refractive index at a wavelength of emitted light of the organic LED element and the plurality of scattering materials provided inside the base material and having a refractive index different from that of the base material. Then, the scattering layer prepared is formed on the translucent substrate (step 1110).

Then, on the scattering layer, the translucent electrode having a second refractive index equal to or lower than the first refractive index (step 1120) is formed. To describe it concretely, an ITO film is formed on the substrate, and the ITO film is etched, thereby forming the translucent electrode. The film formation of ITO can be uniformly performed over the whole surface of the glass substrate by sputtering or vapor deposition. An ITO pattern is formed by photolithography and etching. This ITO pattern becomes the translucent electrode (anode). A phenol novolak resin is used as a resist, and exposure and development are conducted. The etching may be either wet etching or dry etching. For example, patterning of ITO can be performed by using a mixed aqueous solution of hydrochloric acid and nitric acid. As a resist remover, there can be used, for example, monoethanolamine.

Process for Producing Organic LED Element

Figure 21:
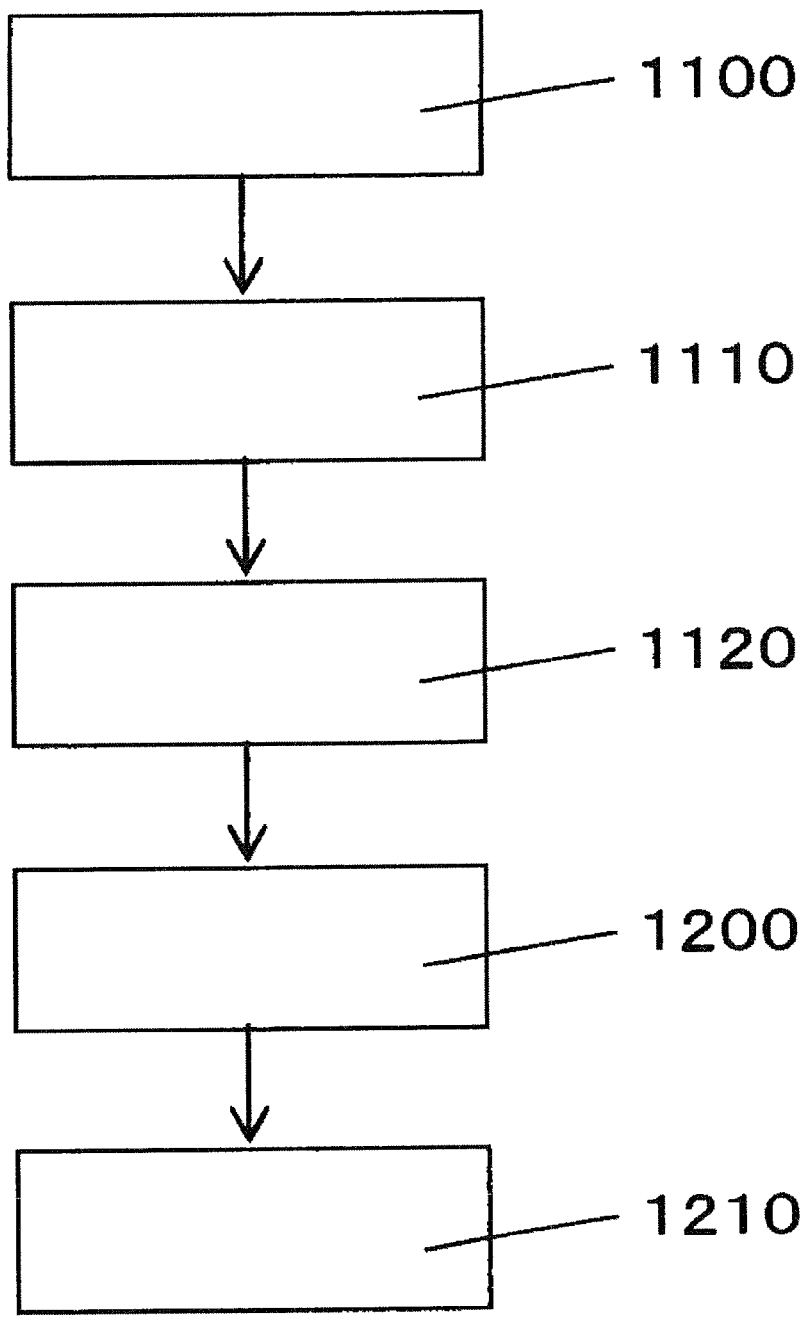
FIG. 21 is a flow chart showing a process for producing an organic LED element of the invention.

The process for producing the organic LED element of the invention will be described below by using the drawing. FIG. 21 is a flow chart showing a process for producing the organic LED element of the invention. The process for producing the organic LED element of the invention comprises the step of preparing a translucent substrate (step 1100), the step of forming on the translucent substrate a scattering layer comprising a base material having a first refractive index at a wavelength of emitted light of an organic LED element and a plurality of scattering materials provided in the inside of the base material and having a refractive index different from that of the base material (step 1110), the step of forming on the scattering layer a translucent electrode having a second refractive index equal to or lower than the first refractive index (step 1120), the step of forming an organic layer on the translucent electrode (step 1200) and the step of forming a reflective electrode on the organic layer (step 1210).

After steps 1100 to 1120 have been performed, the organic layer is formed on the translucent electrode (step 1200). The organic layer is formed herein by a combination of a coating method and a vapor deposition method. For example, when some one or more of the organic layers are formed by the coating method, the other layers are formed by the vapor deposition method. When the layer is formed by the coating method and the upper layer is formed thereon by the vapor deposition method, condensation, drying and curing are performed before the organic layer is formed by the vapor deposition method. Further, the organic layer may be formed by only the coating method or only the vapor deposition method.

Then, the reflective electrode is formed on the organic layer (step 1210). To describe it concretely, a metal material such as aluminum is vapor-deposited on the organic layer, thereby forming the reflective electrode.

Next, there will be described the step of producing an opposed substrate for sealing, in order to seal the organic EL light-emitting element formed by the above-mentioned steps. First, a glass substrate different from the element substrate is prepared. This glass substrate is processed to form a desiccant housing portion for housing a desiccant. The glass substrate is coated with a resist, and a part of the substrate is exposed by exposure and development to form the desiccant housing portion. This exposed portion is made thin by etching, thereby forming the desiccant housing portion.

Figure 22:
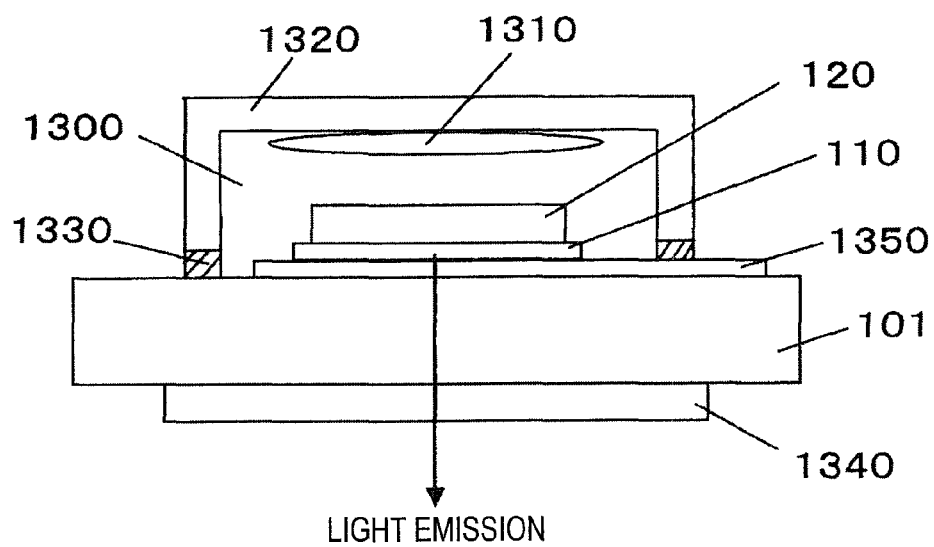
FIG. 22 is a cross-sectional view schematically showing a constitution of an organic EL display device.

As shown in FIG. 22, the desiccant 1310 such as calcium oxide is disposed in this desiccant housing portion 1300, and then, two substrates are laminated and adhered to each other. Incidentally, FIG. 22 is a cross-sectional view schematically showing a constitution of an organic EL display device. Specifically, a seal material 1330 is applied to a surface of the opposed substrate 1320 on which the desiccant housing portion 1300 is provided, by using a dispenser. As the seal material 1330, there can be used, for example, an epoxy-based UV-curable resin. Further, the seal material 1330 is applied to the whole periphery of a region facing to the organic LED element. The two substrates are aligned, allowed to face each other, and then, irradiated with UV light to cure the seal material, thereby adhering the substrates to each other. Thereafter, in order to more enhance the curing of the seal material, for example, heat treatment is performed in a clean oven of 80° C. for 1 hour. As a result of this, a space between the substrates in which the organic EL element is present is isolated from the outside of the substrates by the seal material and the pair of substrates. Deterioration of the organic EL element due to water and the like remaining in the sealed space or entering therein can be prevented by disposing the desiccant 1310.

Light emission from the organic layer 110 is outgone in a direction of the arrow. An optical sheet 1340 is attached to a surface of the substrate 101 opposite to a surface on which the organic LED element is formed, namely, an outgoing surface. The optical sheet 1340 has a polarizing plate and a ¼ wavelength plate, and functions as an antireflective film. The light from the organic thin film layer is extracted to the side of the surface on which this optical sheet 1340 is provided.

Unnecessary portions in the vicinity of the periphery of the substrates are cut and removed. A signal electrode driver is connected to anode wiring 1350, and a scanning electrode driver is connected to cathode connection wiring. At an end portion of the substrate, a terminal portion connected to each wiring is formed. An anisotropically-conductive film (ACF) is attached to this terminal portion, and a TCP (tape carrier package) provided with a driving circuit is connected thereto. Specifically, the ACF is temporarily pressed on the terminal portion. Then, the TCP containing the driving circuit is securely pressed on the terminal portion. The driving circuit is mounted thereby. This organic EL display panel is attached to a box to complete the organic EL display device. Although the above shows the case of a dot matrix display element, character display may be used. This is not limited to the above-mentioned constitution depending on the element specification.

Embodiment 2

Another Constitutional Example of Organic LED Element

Figure 23:
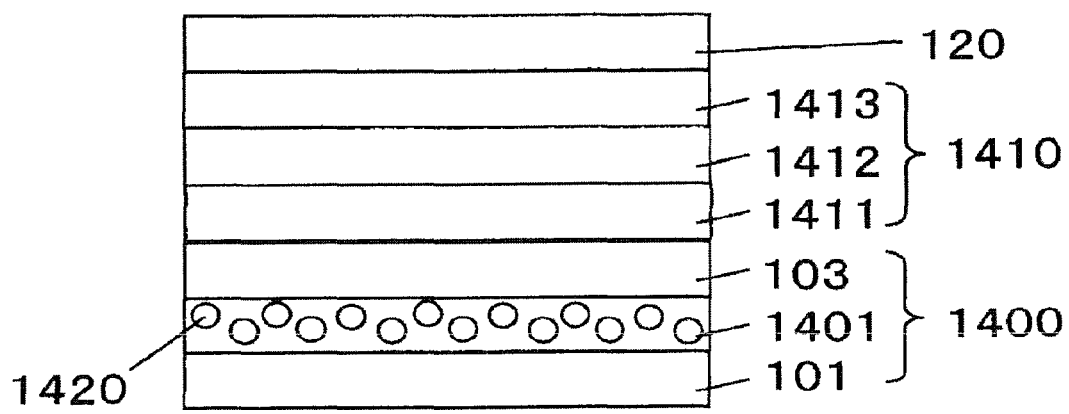
FIG. 23 is a cross-sectional view showing other structures of a laminate for an organic LED element and an organic LED element of the invention.

Then, constitutions of the electrode-attached translucent substrate (laminate for an organic LED element) and the laminate for an organic LED element of embodiment 2 of the invention will be described below with reference to the drawings. Incidentally, the same reference numerals are given to the same constituents as those in FIG. 1, and descriptions thereof will be omitted. FIG. 23 is a cross-sectional view showing other structures of the laminate for an organic LED element and the laminate for an organic LED element of the invention.

The other organic LED element of the invention is constituted by an electrode-attached translucent substrate (laminate for an organic LED element) 1400, an organic layer 1410 and a reflective electrode 120. The electrode-attached translucent substrate 1400 is constituted by a translucent substrate 101, a scattering layer 1401 and a translucent electrode 103. The organic layer 1410 is constituted by a hole-injection-transport layer 1411, a light-emitting layer 1412 and an electron-injection-transport layer 1413.

The light-emitting layer 113 of the organic LED element of FIG. 1 is constituted by three layers herein. Any one of the three layers is formed so as to emit light of any one color of three light emission colors (red, green and blue). However, the light-emitting layer 1412 of the organic LED element of FIG. 23 can be constituted by one layer emitting only blue light by using a fluorescent emission material (for example, a filler) emitting red light and green light as the plurality of scattering materials 1420 provided in the inside of the scattering layer 1401. Namely, according to the other constitution of the organic LED element of the invention, a layer emitting light of any one color of red, green and blue can be used as the light-emitting layer to achieve an effect that the organic LED element can be downsized.

In the above-mentioned embodiments, descriptions have been made for the constitution in which the organic layer is sandwiched between the translucent electrode and the reflective electrode. However, a bifacial light emission type organic EL layer may be constituted by making both electrodes translucent.

Further, the translucent electrode-attached translucent substrate of the invention is effective to increase the efficiency of optical devices such as various light-emitting devices such as inorganic EL elements and liquid crystals and light-receiving devices such as light quantity sensors and solar pores, without being limited to the organic EL elements.

EXAMPLES

Example 1

Experimental Proof of Effect of Scattering Layer

An experimental proof for showing that the scattering layer is effective for an improvement of the light-extraction efficiency will be described below. Sample 1 is an example having the scattering layer of the invention, and sample 2 is a comparative example having the scattering layer in the inside of which no scattering material is provided. The calculating method is the same as the calculating method of the scattering layer described above. The respective conditions and results (front extraction efficiency) are shown in Table 2 below.

TABLE 2

|  | Sample 1 | Sample 2 |
|---|---|---|
| Electron-Injection-Transport Layer | | |
| Thickness (μm) | 1 | 1 |
| Refractive Index | 1.9 | 1.9 |
| Light-Emitting Layer | | |
| Thickness (μm) | 1 | 1 |
| Refractive Index | 1.9 | 1.9 |

TABLE 2-continued

|  | Sample 1 | Sample 2 |
|---|---|---|
| Hole-Injection-Transport Layer | | |
| Thickness (μm) | 1 | 1 |
| Refractive Index | 1.9 | 1.9 |
| Scattering Layer Base Material | | |
| Thickness (μm) | 30 | 30 |
| Refractive Index | 1.9 | 1.9 |
| Transmittance (%) | 100 | 100 |
| Scattering Material | | |
| Size (μm) | 5 | — |
| Refractive Index | 1 | — |
| Number of Particles (@ 1 mm$^2$) | 1527932.516 | — |
| Content (vol %) | 10 | — |
| Transmittance (%) | 100 | — |
| Glass Substrate | | |
| Thickness (μm) | 100 | — |
| Refractive Index | 1.54 | — |
| Light Flux | | |
| Number of Light Rays Extracted from Front Face | 811.1/1000 | 210.4/1000 |
| Number of Light Rays Extracted from Side Face | 47.86/1000 | 125/1000 |
| Front Extraction Efficiency (%) | 81.11 | 21.04 |

Figure 24:
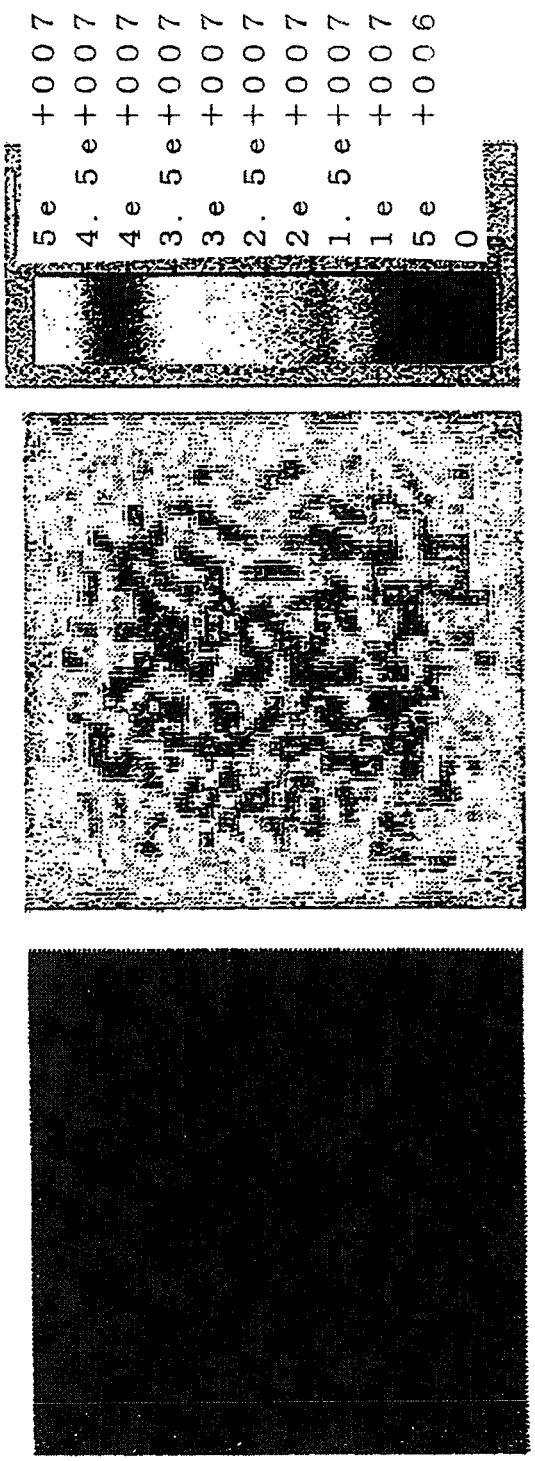
FIG. 24 shows the results of observation from the front under conditions of sample 1 and sample 2.

The results of comparison of front extraction efficiency between the example and the comparative example are shown in FIG. 24. FIGS. 24(*a*) and 24(*b*) are graphs showing the results of observation from the front under conditions of samples 1 and 2, respectively. As shown in FIG. 24, according to the electrode-attached translucent substrate (laminate for an organic LED element) and the organic LED element of the invention, it becomes possible to improve the light-extracting efficiency which is about 20% when untreated to about 80%.

The contents and results of evaluation experiments made for confirming that the electrode-attached translucent substrate of the invention improves the outside extraction efficiency will be described below with reference to the drawings.

Figure 25:
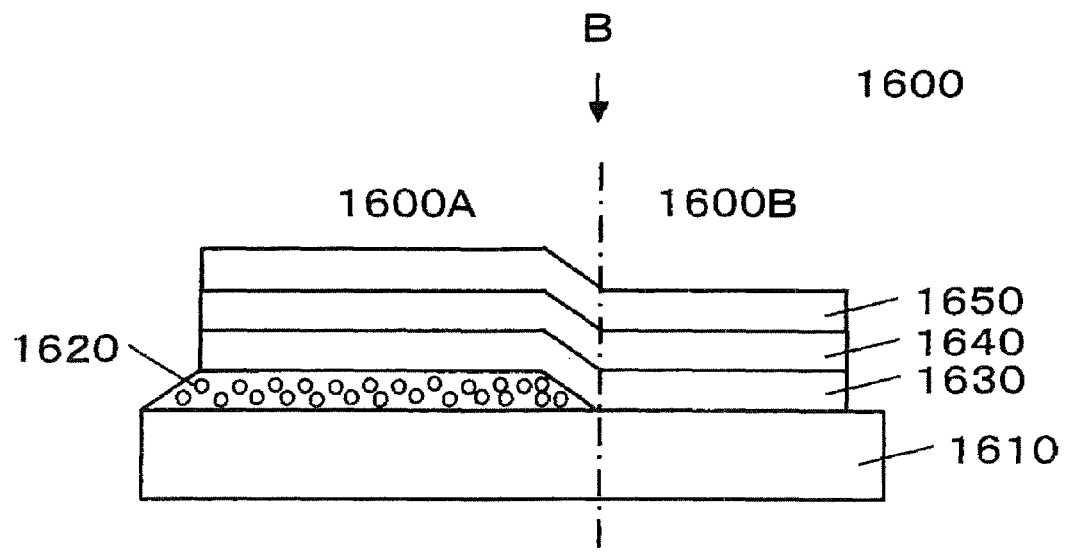
FIG. 25 is a cross-sectional view taken along line A-A as seen from the direction C in FIG. 26, showing a structure of an evaluation element.
Figure 26:
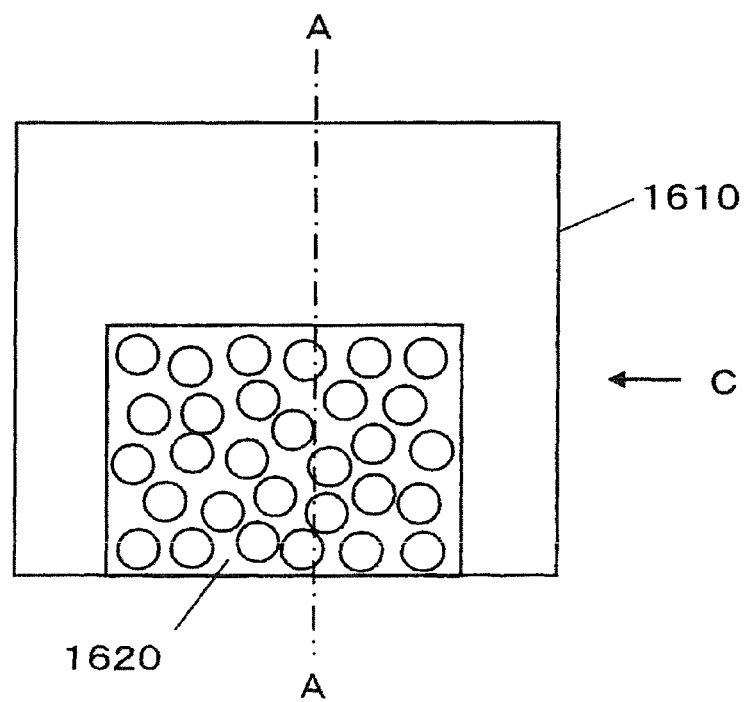
FIG. 26 is a top view of the evaluation element seen from the direction B in FIG. 25.

First, an evaluation element shown in FIG. 25 and FIG. 26 was prepared. Here, FIG. 25 is a cross-sectional view taken along line A-A as seen from the direction C in FIG. 26, showing a structure of the evaluation element. FIG. 26 is a top view of the evaluation element seen from the direction B in FIG. 25. Incidentally, in FIG. 25, in order to clarify the positional relationship between a glass substrate 1610 and a scattering layer 1620, only the glass substrate 1610 and the scattering layer 1620 are described.

The evaluation element has the glass substrate 1610, the scattering layer 1620, an ITO (indium tin oxide) film 1630, an Alg$_3$ (tris(8-quinolinolate)aluminum complex) film 1640 and a Ag film 1650. In order to compare herein the difference in light extraction efficiency by the presence or absence of the scattering layer, the evaluation element was divided into two parts, region 1600A having the scattering layer and region 1600B having no scattering layer. In the evaluation element in region 1600A having the scattering layer, the scattering layer 1620 is formed on the glass substrate 1610. In the evaluation element in region 1600B having no scattering layer, the ITO film 1630 is formed on the glass substrate 1610.

As the glass substrate, there was used a glass substrate, PD200 (trade name) manufactured by Asahi Glass Co., Ltd. This glass has a strain point of 570° C. and a thermal expansion coefficient of 83×10$^{-7}$ (1/° C.). The glass substrate having such a high strain point and a high thermal expansion coefficient is suitable when a glass frit paste is fired to form the scattering layer.

The scattering layer 1620 is formed by using a high refractive index glass frit paste layer. Here, a glass having the composition shown in Table 3 was prepared as the scattering layer 1620. This glass has a glass transition temperature of 483° C., a yield point of 528° C. and a thermal expansion coefficient of $83 \times 10^{-7}$ (1/° C.). The refractive index nF of this glass at the F line (486.13 nm) is 2.03558, the refractive index nd at the d line (587.56 nm) is 1.99810, and the refractive index nC at the C line (656.27 nm) is 1.98344. The refractive index was measured with a refractometer (manufactured by Kalnew Optical Industrial Co., Ltd, trade name: KRP-2). The glass transition temperature (Tg) and the yield point (At) were measured with a thermal analysis instrument (manufactured by Bruker, trade name: TD5000SA) by a thermal expansion method at a rate of temperature increase of 5° C./min.

TABLE 3

|  | Mass % | Mol % |
|---|---|---|
| $P_2O_5$ | 16.4 | 23.1 |
| $B_2O_3$ | 1.9 | 5.5 |
| $Li_2O$ | 1.7 | 11.6 |
| $Na_2O$ | 1.2 | 4.0 |
| $K_2O$ | 1.2 | 2.5 |
| $Bi_2O_3$ | 38.6 | 16.6 |
| $TiO_2$ | 3.5 | 8.7 |
| $Nb_2O_5$ | 23.3 | 17.6 |
| $WO_3$ | 12.1 | 10.4 |

The scattering layer 1620 was formed by the following procedure. A powder raw material was prepared so as to give the composition indicated by the ratio of Table 3. The powder raw material prepared was dry milled in a ball mill made of alumina for 12 hours to prepare a glass powder having an average particle size (d50, particle size at an integrated value of 50%, unit: μm) of 1 to 3 μm. Then, 75 g of the resulting glass powder was kneaded with 25 g of an organic vehicle (one in which about 10% by mass of ethyl cellulose was dissolved in α-terpineol and the like) to prepare a paste ink (glass paste). This glass paste was uniformly printed on the above-mentioned glass substrate to film thicknesses after firing of 15 μm, 30 μm, 60 μm and 120 μm. After drying at 150° C. for 30 minutes, this was once returned to room temperature. Then, the temperature was raised to 450° C., taking 45 minutes, and held at 450° C. for 10 hours. Thereafter, the temperature was raised to 550° C., taking 12 minutes, and held at 550° C. for 30 minutes. Then, the temperature was lowered to room temperature, taking 3 hours, to form a glass layer on the glass substrate. For the scattering layer having a film thickness of 120 μm, a surface thereof was polished to a film thickness of 60 μm. In the glass film formed thereby, many pores were contained, which caused the occurrence of scattering. On the other hand, on the outermost glass surface of the scattering layer, there was not observed such local unevenness as causing an interelectrode short circuit of the organic EL element, such as openings of the pores, although waviness was observed.

Figure 27:
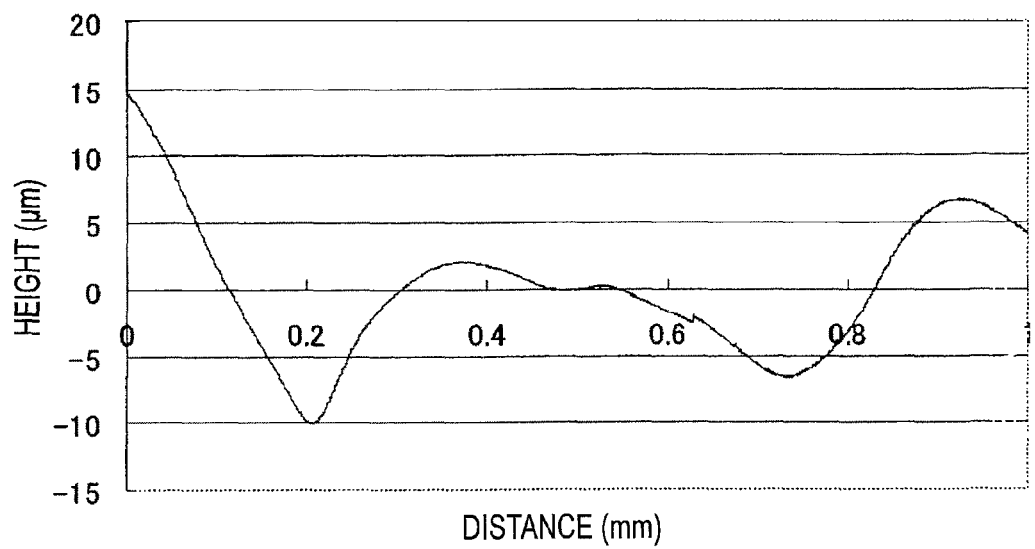
FIG. 27 are graphs showing wavinesses of surfaces of scattering layers.
Figure 27:
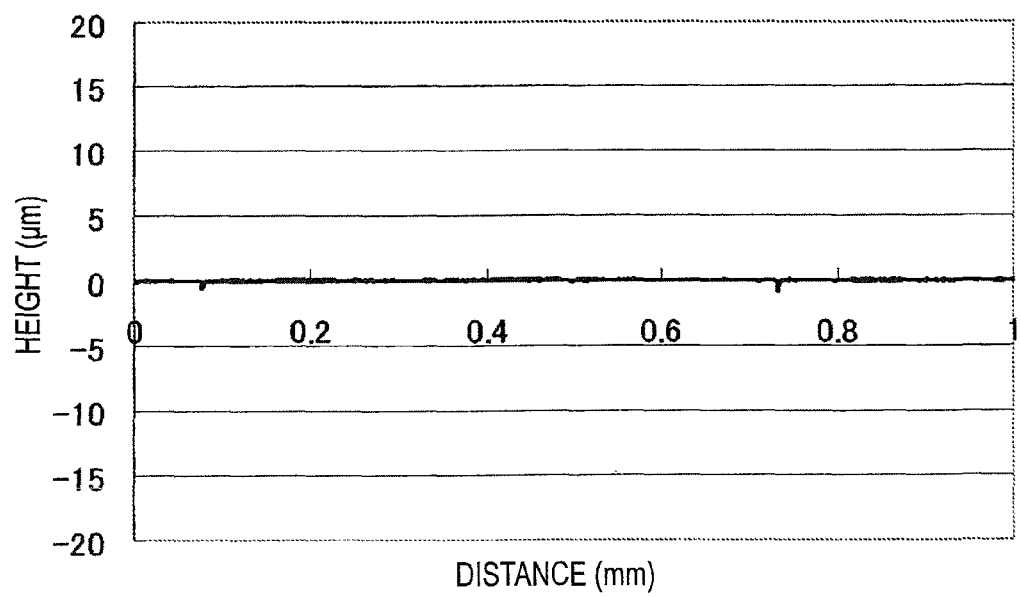
Figure 28:
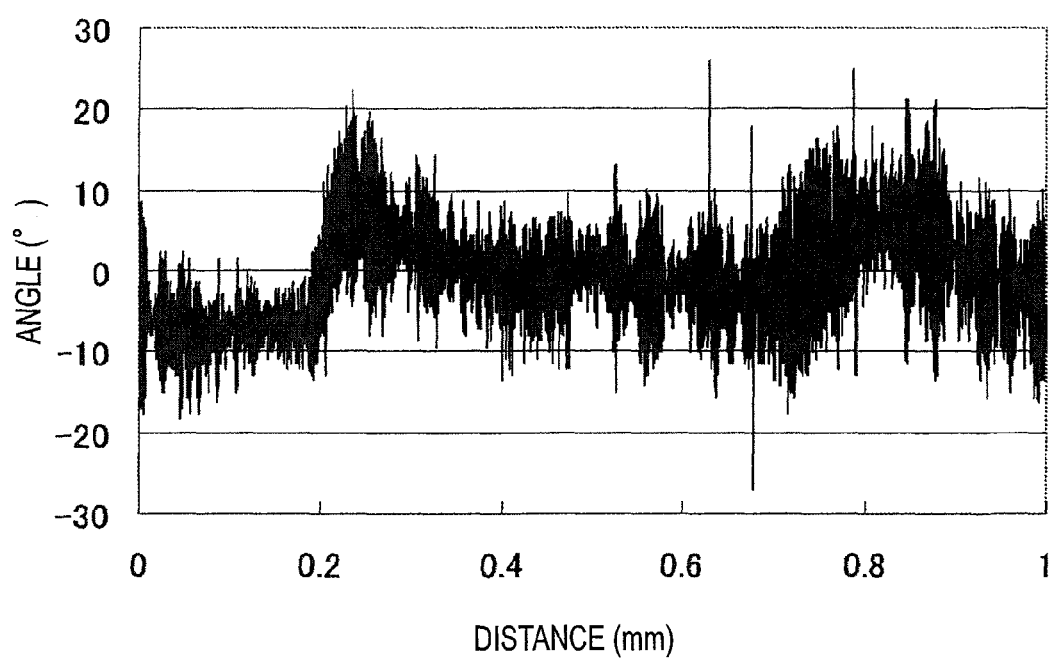
FIG. 28 is a graph showing the results obtained by measuring a surface shape of a scattering layer with a surface roughness tester.
Figure 29:
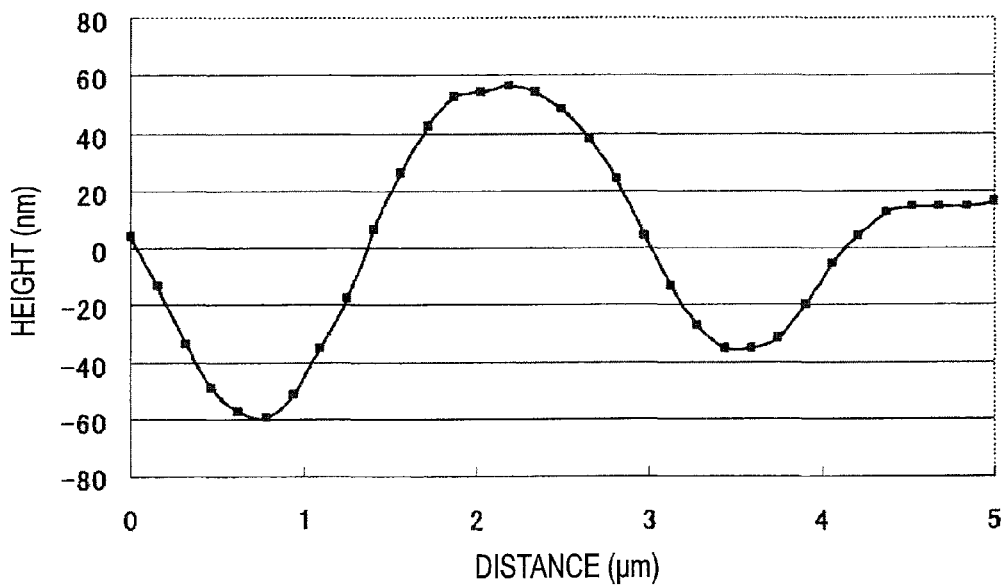
FIG. 29 are graphs showing the measurement results of local roughness of surfaces of scattering layers.
Figure 29:
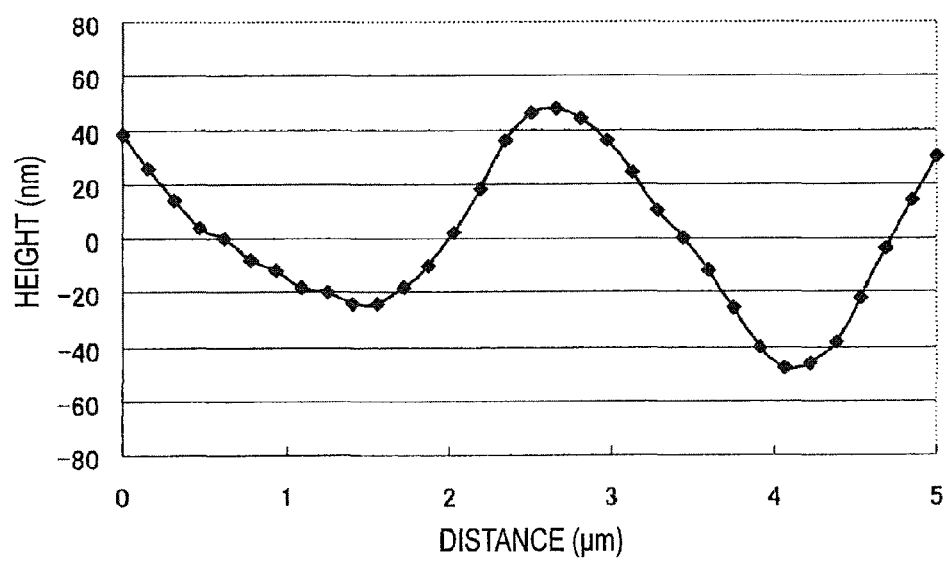

FIG. 27 is graphs showing waviness of the surfaces of the scattering layers. FIG. 27(A) shows waviness of the surface of the scattering layer having a film thickness of 60 μm, and FIG. 27(B) shows waviness of the surface of the scattering layer having a film thickness of 60 μm obtained by polishing the scattering layer having a film thickness of 120 μm. FIG. 28 is a graph in which the angle of a waviness slope in FIG. 27(A) is calculated. In FIG. 27(A) and FIG. 27(B), the measurement was made by using a surface roughness tester (manufactured by Tokyo Seimitsu Co., Ltd, SURFCOM 1400D). The angle of the slope of the scattering layer caused by the waviness is up to about 27°. This angle is smaller than the taper angle (40 to 50°) of an edge portion of an opening insulating film used in a passive type organic LED panel. This is therefore considered not to disturb coverage of the organic layer, the metal layer and the like. Further, the cause of the waviness is considered to be that the glass particles are not classified in preparing the frit to cause large particles to be contained, whereby the large particle portions remain as the waviness at the time of firing. Accordingly, the waviness can be avoided by decreasing and equalizing the size of the particles. Incidentally, the measurement results of local roughness are shown in FIG. 29 is graphs showing of surfaces of scattering layers. FIG. 29(A) is the case where the surface of the scattering layer is not polished, and FIG. 29(B) is the case where the surface of the scattering layer is polished. The arithmetic average roughness Ra of the surface of the non-polished scattering layer was 31.0 nm, and the arithmetic average roughness Ra of the surface of the polished scattering layer was 23.5 nm. As seen from FIG. 29, no local protrusion is observed on the surface of the scattering layer, and the measurement results of the surface of the non-polished scattering layer (FIG. 29(A)) shows an unevenness shape similar to that of the measurement results of the surface of the mirror-polished scattering layer (FIG. 29(B)). This is because the scattering material is pores and no pores are present in the surface. When the scattering material is mixed with the organic material (when a resin is used as the base material, and solid particles are used as the scattering material), the scattering material is exposed on the surface in some cases. It is therefore necessary to prevent the short circuit of the organic LED element by smoothing the roughness of the scattering layer surface.

On the other hand, in the polished one, the smooth surface is formed.

The total light transmittance and haze value of each scattering layer-attached substrate were measured. As a measurement device, there was used a haze meter HGM-2 manufactured by Suga Test Instruments Co., Ltd. As a reference, there was measured an untreated plate of the above-mentioned glass substrate PD200. The results measured are shown in Table 4.

TABLE 4

| Thickness of Scattering Layer (μm) | Total Light Transmittance (%) | Haze Value (%) |
|---|---|---|
| 15 | 97.9 | 66.3 |
| 30 | 85.1 | 72.5 |
| 60 | 83.1 | 76.1 |

As shown above, it is seen that scatterability increases with an increase in the film thickness of the scattering layer.

The ITO film 1630 was formed on the scattering layer 1620 and the glass substrate 1610 on which the scattering layer 1620 was not formed, to a film thickness of 150 nm by sputtering. The sputtering was performed at room temperature. Ar was 99.5 SCCM, $O_2$ was 0.5 SCCM, the pressure was 0.47 Pa, and the input electric power was 2.35 W/cm². Then, using a vapor deposition apparatus, the $Alq_3$ film 1640 was formed on the ITO film 1630, and the Ag film 1650 was formed on the $Alq_3$ film 1640, to film thicknesses of 200 nm and 70 nm, respectively. In this evaluation, UV light was irradiated from the upper side of the Ag film 1650 to excite the Alq₃ film 1640. When the film thickness of the Ag film 1650 is thick, the UV light does not pass through. When it is too thin, fluorescent light from the Alq₃ film 1640 passes through without being reflected. In the case of UV light of 320 nm, about 25% thereof can pass through by adjusting the film thickness of the Ag film 1650. On the other hand, it becomes possible to restrain the ratio of the fluorescent light passing through the Ag film 1650 to 1% or less. The Alq₃ film 1640 is excited by the UV light which enters from the side of the Ag film 1650. However, in the side of the Alq₃ film 1640 close to the Ag film 1650, light emitted to the side of the glass substrate 1610 and light emitted to the side of the Ag film 1650 and reflected by Ag to proceed to the glass substrate side interfere with each other to be weakened, because the difference in light path is small, whereas the reflection by Ag causes a phase deviation of approximately it. This problem could be solved by making the film thickness of the Alq₃ film 1640 as thick as 200 nm, thereby being able to increase the light-emitting luminance measured.

Figure 30:
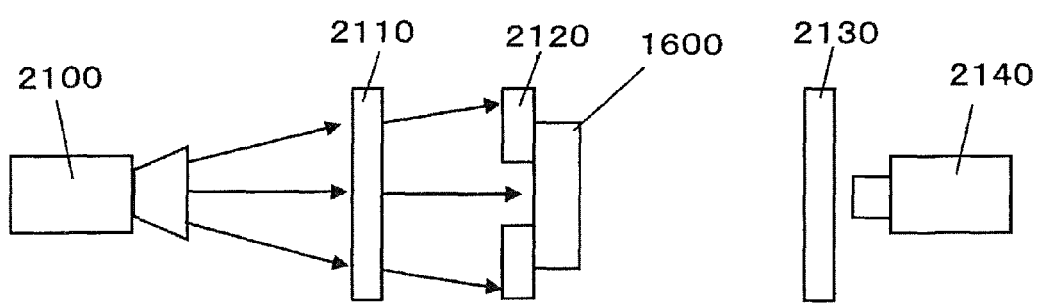
FIG. 30 is a block diagram showing the constitution of an evaluation system for evaluating light-emitting characteristics.

Using the evaluation element prepared as described above, light-emitting characteristics were immediately evaluated. A method for measuring and evaluating the light-emitting luminance is shown in FIG. 30. As an excitation light source, a mercury xenon lamp (trade name: Suncure 202-LS) 2100 manufactured by Asahi Glass Co., Ltd. was used. Light from the light source contains visible components, so that these components were removed by using a visible light filter 2110. In front of the evaluation element 1600, a stainless steel aperture (15 mm×10 mm) 2120 was disposed to form an UV beam. A part of the UV light which has entered the evaluation element 1600 passes through the Ag film 1650 and excites the Alq₃ film 1640 to generate fluorescence. The UV light irradiated to the region 1600A having the scattering layer of the evaluation element 1600 and to the region 1600B having no scattering layer, and fluorescent luminance of each region was measured with a luminance meter 2140. As the luminance meter, a luminance meter (trade name: LS-110) manufactured by Konica Minolta Holdings Inc. was used, and UV light filter was disposed in front of the luminance meter.

Figure 31:
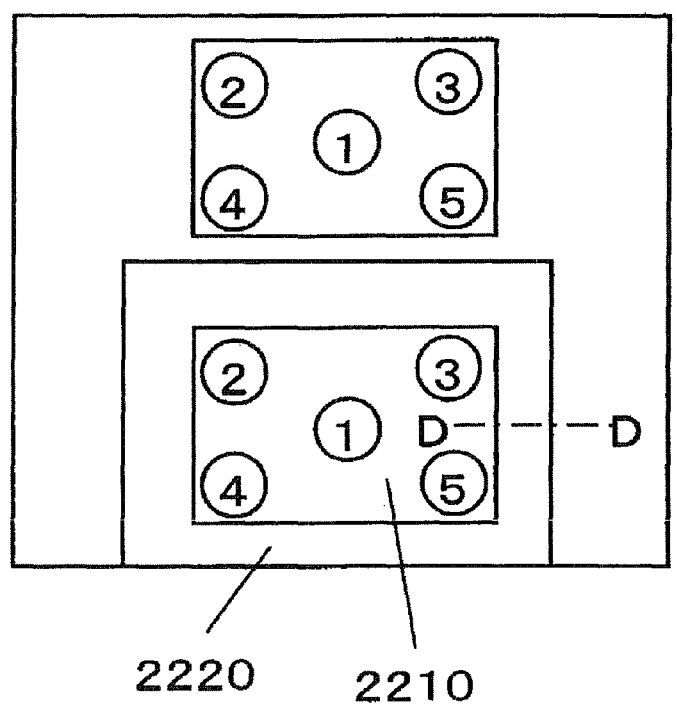
FIG. 31 is a block diagram showing measurement points.
Figure 32:
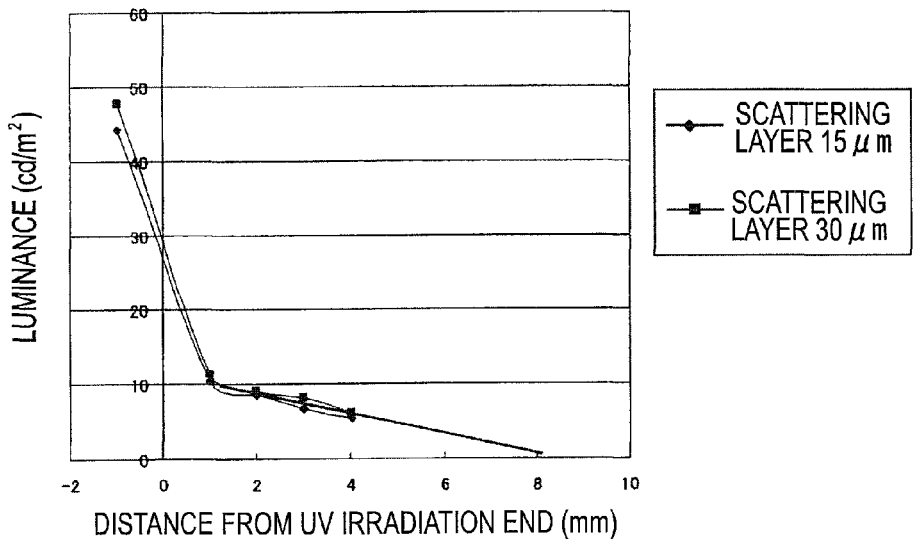
FIG. 32 is a graph showing luminance distribution of a central light-emitting region 2210 and a peripheral light-emitting region 2220.

Measurement points are shown using the drawing. FIG. 31 is a diagram corresponding to FIG. 26. As shown in FIG. 31, the measurement points are 5 points of a center and four corners of an UV irradiation region in total. In a portion not having the scattering layer 1620, the UV irradiation region and the fluorescent light emission region are the same as with each other. However, when there is the scattering layer 1620, the fluorescent light emission region can be classified into two regions, a strong central light-emitting region 2210 corresponding to the UV irradiation region and a peripheral light-emitting region 2220 on the outer side thereof in which light emission becomes weak as approaching the periphery. Examples of luminance distribution of the central light-emitting region 2210 and the peripheral light-emitting region 2220 are shown in FIG. 32. The luminance at line D-D in FIG. 31 was measured herein. As known from FIG. 32, it is seen that light can be extracted not only from the fluorescent light emission region (central light-emitting region 2210), but also from the periphery thereof, when there is the scattering layer. This is said to have an effect of high luminance, compared to the conventional organic LED element, when the organic LED element of the invention is used in lighting.

Figure 33:
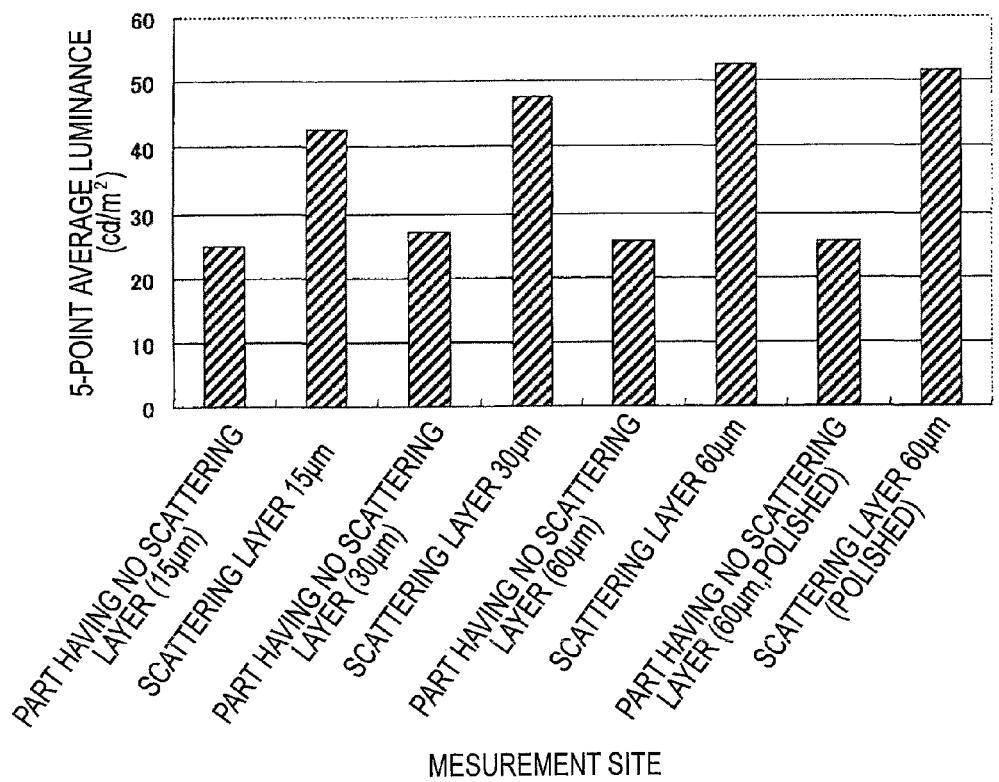
FIG. 33 is a graph showing the average front luminance of five measurement points for each scattering layer changed in thickness.

FIG. 33 shows the average front luminance of five measurement points for each scattering layer changed in thickness (15 μm, 30 μm, 60 μm and 60 μm after polishing). As shown in the graph, it is seen that the front luminance increases with an increase in the film thickness of the scattering layer. Further, the surface-polished article having a scattering layer film thickness of 60 μm has a luminance equivalent to that of the non-polished one. From this fact, it is considered that an increase in luminance is mainly caused by scattering by the pore-containing high refractive index glass layer of the invention, not by surface waviness.

Figure 34:
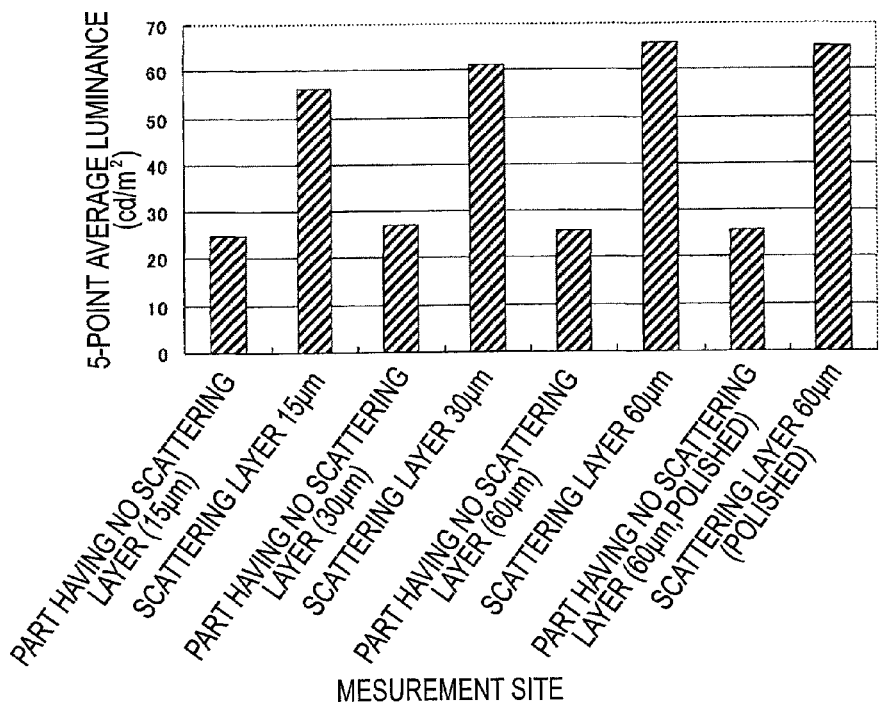
FIG. 34 is a graph showing the luminance at the time when the five-point average value is corrected by measuring the amount of light of a peripheral light-emitting region for each scattering layer changed in thickness.

Actually, there is the peripheral light-emitting region 2220. The light extracted from the periphery decreases in luminance with distance from the central light-emitting region, and becomes approximately 0 at about 8 mm from an edge of the central light-emitting region, as shown in FIG. 32. When a product is considered to which the invention is applied, in the case where the size of a light-emitting portion is sufficiently larger than 8 mm, the light extracted from the peripheral light-emitting region is also allowed to be considered as a light flux extracted. FIG. 34 shows the luminance at the time when the five-point average value is corrected by measuring the amount of light of the peripheral light-emitting region for each scattering layer changed in thickness (15 μm, 30 μm, 60 μm and 60 μm after polishing). Specifically, the luminance distribution of the peripheral light-emitting region is measured, and the total light flux amount is calculated. The correction is made by adding a value of that value divided by the area of the central light-emitting region to the luminance of the central light-emitting region. In the region having no scattering layer, it is seen that the front luminance ratio to the region having the scattering layer more increases because of no presence of the peripheral light-emitting region.

Figure 35:
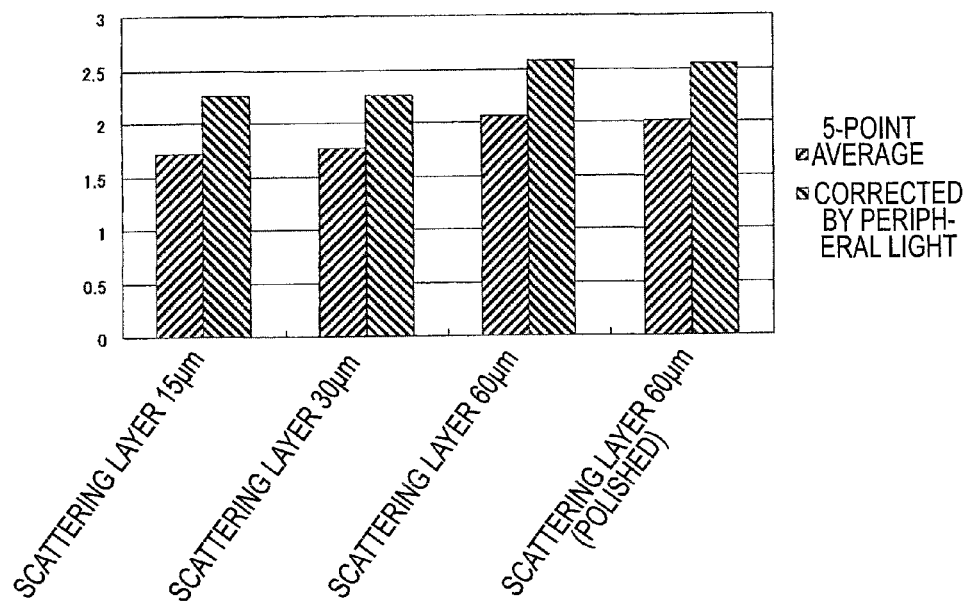
FIG. 35 is a graph showing the ratio of the front luminance in a region having no scattering layer and a region having a scattering layer of each evaluation element.

FIG. 35 shows the ratio of the front luminance in the region having no scattering layer and the region having the scattering layer of each evaluation element. As shown in the graph, only the UV irradiation region provides the front luminance of 1.7 to 2.0 times that in the case of having no scattering layer by insertion of the scattering layer of the invention. When the peripheral light-emitting region is considered, it can be estimated to reach 2.2 to 2.5 times.

Figure 36:
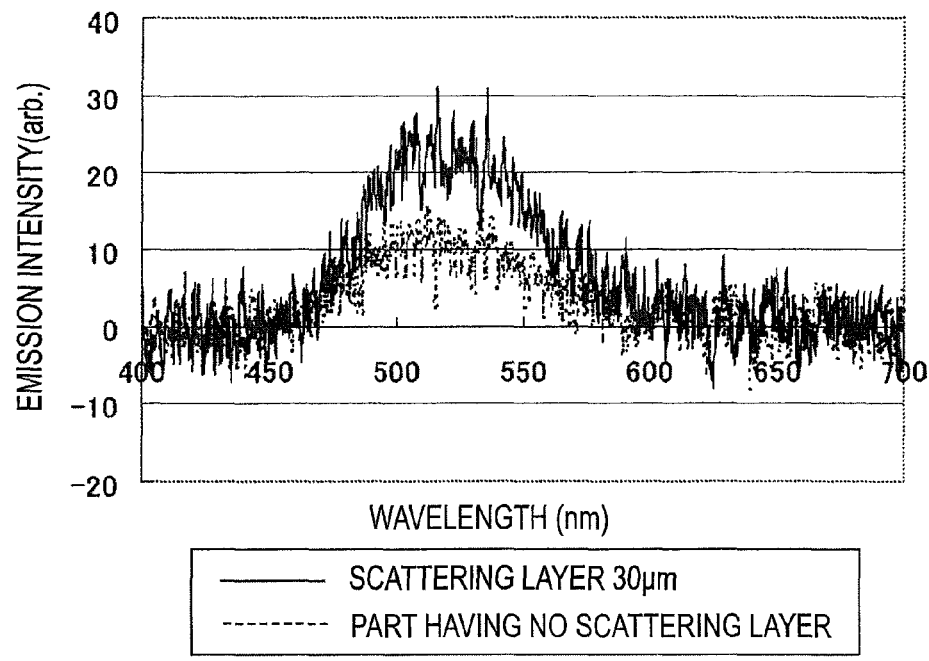
FIG. 36 is a graph showing the measurement results of fluorescence spectra of a region having a scattering layer and a region having no scattering layer.
Figure 37:
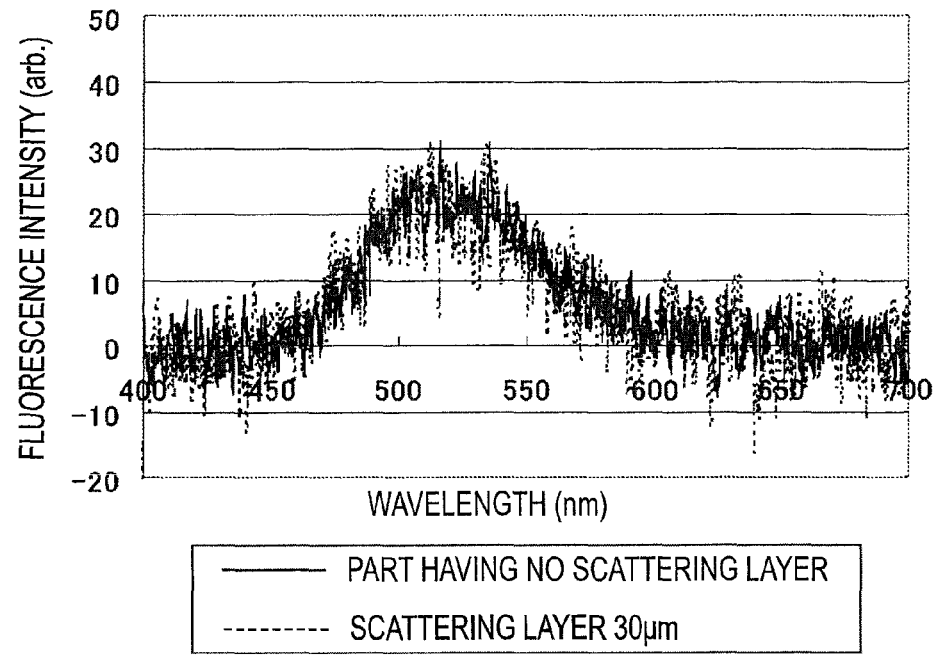
FIG. 37 is a graph in which in the measurement results of the fluorescence spectrum of the region having a scattering layer, the spectrum of the region having no scattering layer, the intensity of which is doubled, is overwritten on the spectrum of the region having a scattering layer.

Then, fluorescence spectra of the region having the scattering layer (thickness: 30 μm) and the region having no scattering layer were measured with a fluorophotometer (trade name: F4500) manufactured by Hitachi High-Technologies Corporation. The measurement results thereof are shown in FIG. 36. Further, one in which the spectrum intensity of the region having no scattering layer is doubled, and overwritten on the spectrum of the region having the scattering layer is shown in FIG. 37. As is apparent from FIG. 36 and FIG. 37, it is seen that the region having the scattering layer is approximately the same as the region having no scattering layer in shape, and about 2 times in light emission intensity. As a result of this, in the organic LED element, the emission spectrum is changed by the interference in the inside of the element to change the luminance in some cases, but it can be said that there is no influence thereof herein.

Figure 38:
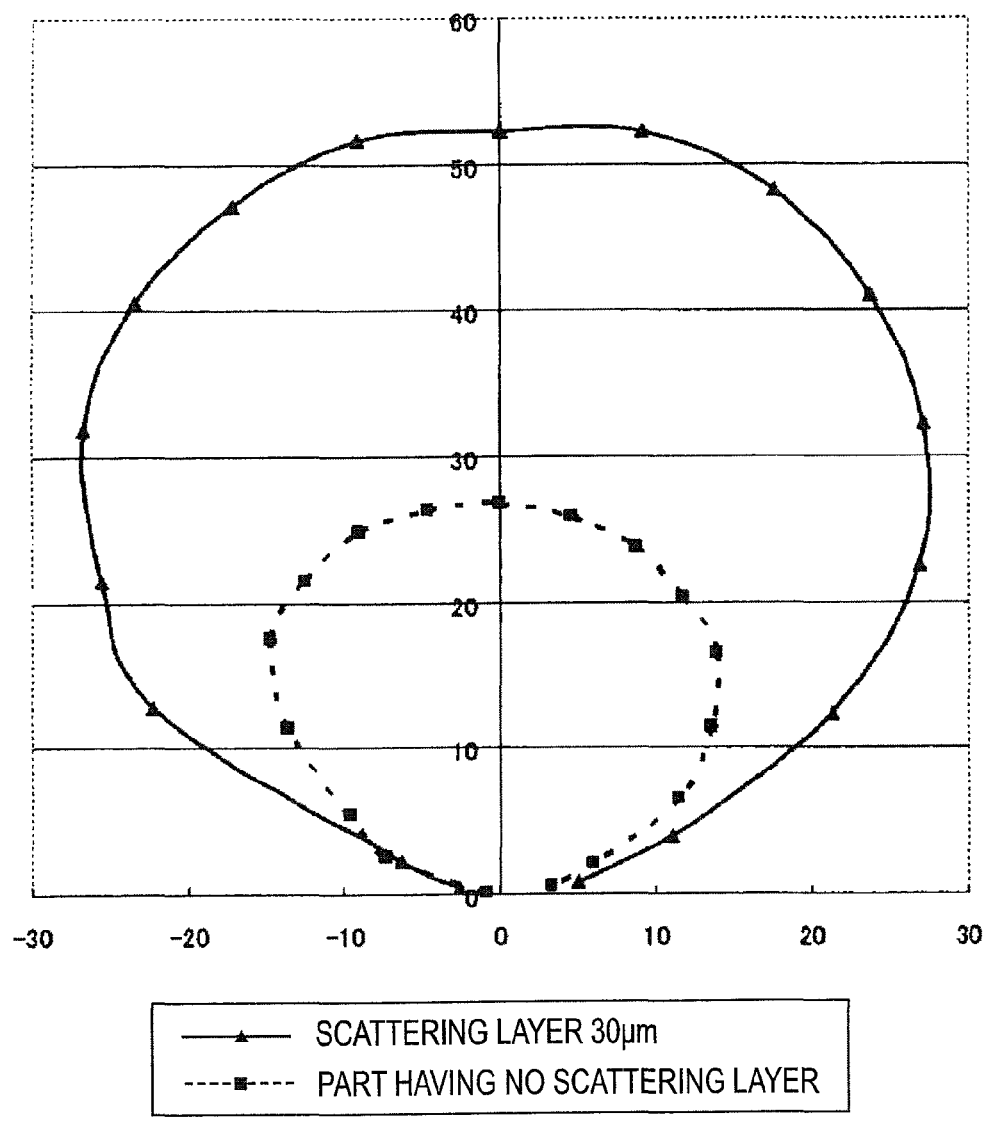
FIG. 38 is a graph showing the measurement results of directional dependency of light intensity.
Figure 39:
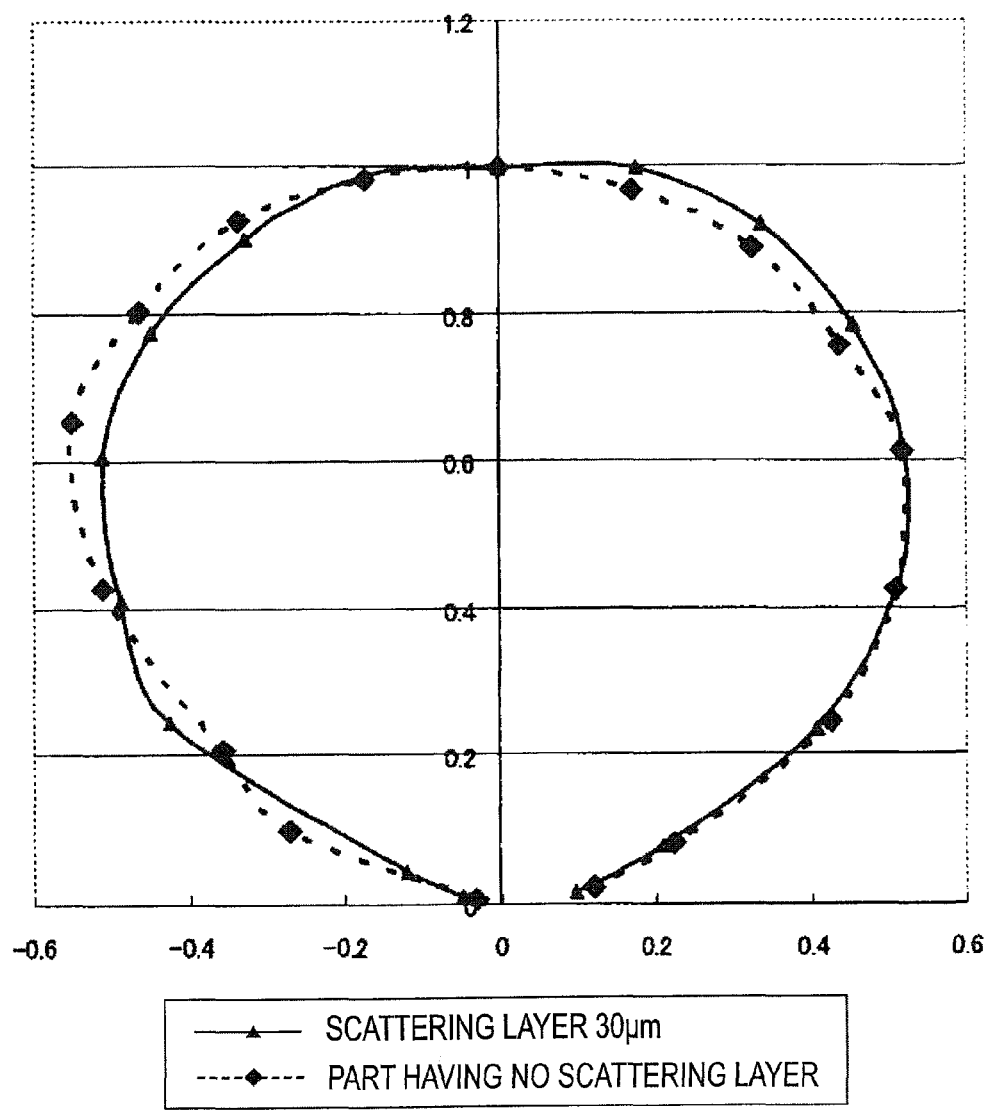
FIG. 39 is a graph in which the data of FIG. 38 is normalized by front light intensity.

Then, the directional dependency of light intensity was measured. A measuring method is the same as the measuring method shown in FIG. 30. The luminance was measured with changing the position of a luminance meter, and the light intensity was calculated from the resulting value. The measurement results are shown in FIG. 38. FIG. 39 is a graph in which the data of FIG. 38 is normalized by the front light intensity. As shown in the graph, it was confirmed that the directional dependency of light intensity did not change independently of the presence or absence of the scattering layer to show strong non-directivity. From this, it was confirmed that the improvement of the light-extraction efficiency of the invention which was confirmed for the front luminance was also similarly improved for the total light flux.

Then, the particle size distribution of pores in the scattering layer prepared this time was measured. When the thickness of the scattering layer is 15 μm, all pores in the scattering layer can be distinguished under a microscope. The pores in a field of view of 90.5 μm×68.1 μm were distinguished and counted by image processing. The results of measurement at arbitrary three places of the scattering layer are shown in Table 5.

TABLE 5

| Observing Site | Number of Pores | Average Pore Particle Size (μm) | Number of Pores per 1 mm² |
|---|---|---|---|
| #1 | 598 | 1.3 | $1.07 \times 10^5$ |
| #2 | 934 | 1.33 | $1.51 \times 10^5$ |
| #3 | 1371 | 1.4 | $2.22 \times 10^5$ |

Figure 40:
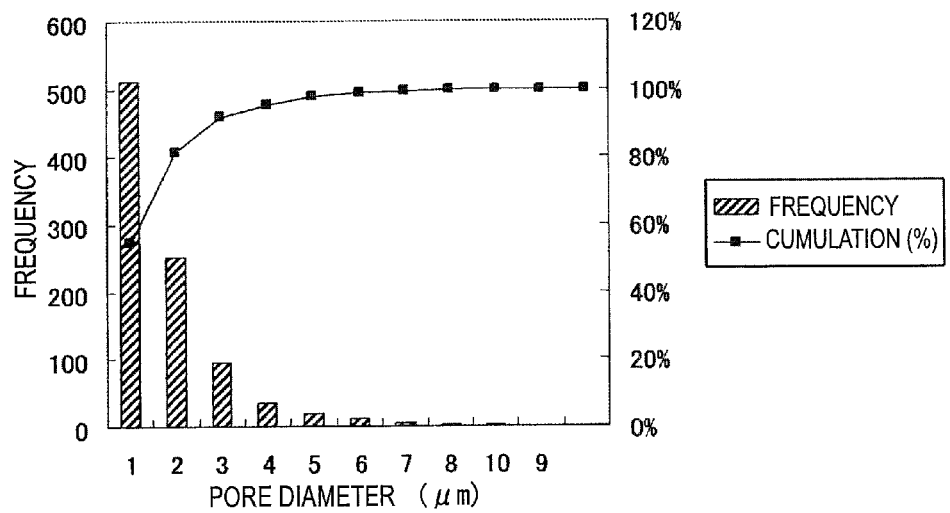
FIG. 40 is a graph showing pore diameter distribution.

Further, cell diameter distribution at measurement point #2 is shown in FIG. 40. As is apparent from Table 5 and FIG. 40, many pores had a pore diameter of 2 μm or less, and the average diameter was from 1.3 to 1.4 μm. Furthermore, the number of pores per 1 mm² of the scattering layer was from $1.1 \times 10^5$ to $2.2 \times 10^5$. When proportional calculation is carried out on the cases where the thickness of the scattering layer is 30 μm and 60 μm, using the above-mentioned measurement results (the thickness of the scattering layer is 15 μm), the number of pores in the case where the thickness of the scattering layer is 30 μm is from $2.2 \times 10^5$ to $4.4 \times 10^5$, and the number of pores in the case where the thickness of the scattering layer is 60 μm is from $4.4 \times 10^5$ to $8.8 \times 10^5$.

Figure 41:
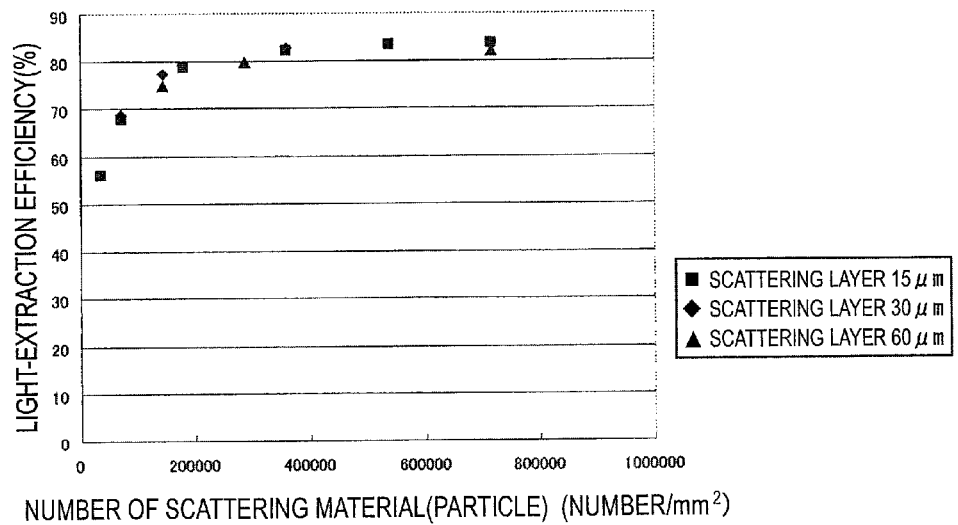
FIG. 41 is a graph comparing the measurement results in the present case to the relationship between the number of pores per 1 mm² and the light-extraction efficiency at the time when the pore diameter is 2 μm.

FIG. 41 is a graph comparing the measurement results in the present case to the relationship between the number of pores per 1 mm² and the light-extraction efficiency at the time when the pore diameter is 2 μm. When the measurement results of FIG. 41 are compared to the simulation results of FIG. 14, it has been seen that the evaluation element shows results similar to the simulation results. To describe it concretely, when the thickness of the scattering layer is 15 μm, the number of pores is insufficient, and the light-extraction efficiency is insufficient. When the thickness of the scattering layer is 60 μm, the light-extraction efficiency is also in a saturated region.

Figure 42:
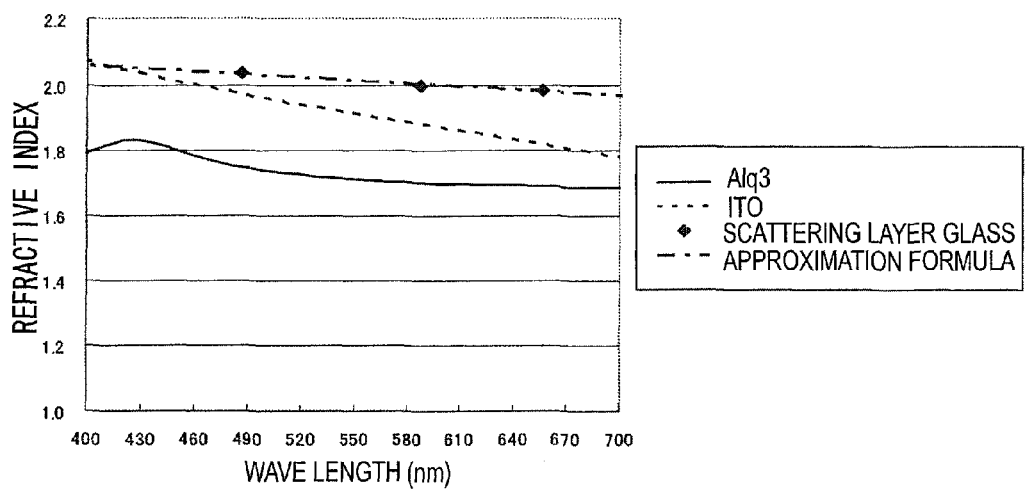
FIG. 42 is a graph showing the refractive indexes of a glass for a scattering layer, an ITO film and an Alq₃ film used in an evaluation experiment.

FIG. 42 shows the refractive indexes of the glass for the scattering layer, the ITO film and the $Alq_3$ film used in the example. As the refractive index of the ITO film as used herein, the data of a similar film formed at room temperature was used. The light-emitting wavelength of the $Alq_3$ film is from 430 nm to 670 nm, so that the magnitude correlation of the refractive index is the scattering layer glass>the ITO film>the $Alq_3$ film, over this entire wavelength region. From this, it is considered that there is no loss of light due to propagation in the inside of the ITO film or the $Alq_3$ film. Incidentally, as the causes of a loss of the light-extraction efficiency, the reflectivity of the Ag film and adsorption of the $Alq_3$ film, ITO film, the scattering layer glass and the substrate glass are considered. When the refractive indexes and extinction coefficients of Ag and $Alq_3$ at a light-emitting peak wavelength are taken as (n1, k1) and (n2, k2), respectively, the reflectivity in a vertical direction at an interface between Ag and $Alq_3$ becomes $((n1-n2)^2+(k1-k2)^2)/((n1+n2)^2+(k1+k2)^2)$. From this, the reflectivity becomes about 93%, because n1=0.129, k1=3.25, n2=1.728 and k2=0.0016. From the graph of "WITH SCATTERING LAYER" in FIG. 16, the light-extraction efficiency at this time is about 60%, when there is no additional loss. In the case of the scattering layer having a film thickness of 60 μm, which was prepared this time, the total light transmittance is as low as 83%, so that a loss in the scattering layer is deduced to be also on a non-negligible level. Although the light path length in the scattering layer is unknown herein, supposing that it is about 1 mm, the loss at an adsorption of 17% can be estimated to be about 12%, from the above-mentioned simulation results. When the above-mentioned reflection loss of the Ag film is multiplied by the loss in the scattering layer glass, the light-extraction efficiency becomes 60%×(100−12)%=53%. When the light-extraction efficiency in the case of no scattering layer is assumed to be 20%, the light-extraction efficiency of 53% is 2.65 times that of the untreated one, and approximately agrees with 2.5 times in the case where the peripheral diffusion light is also considered. In order to improve a decrease in light-extraction efficiency due to the reflection loss of the Ag film and the loss in the scattering layer glass, it is also conceivably effective to decrease the reflectivity of the glass substrate with the air, as well as to increase the reflectivity of the refractive electrode or the transmittance of the glass scattering layer. Specifically, it is mentioned that an antireflective film is formed on the outermost surface of the glass substrate. As described above, use of the invention make it possible to extract the light propagating in the organic layer or the inside of the translucent electrode to the outside.

Example 2

Experimental Proof of Flatness of Main Surface of Scattering Layer

There will be described below an experimental proof for showing that a flat main surface (the arithmetic average roughness is 30 nm or less) of the scattering layer is effective, in order to improve the light-extraction efficiency.

First, as the glass substrate, there was used the above-mentioned glass substrate PD200 manufactured by Asahi Glass Co., Ltd. The scattering layer was prepared as follows. First, a powder raw material was prepared so as to give the glass composition of Table 6, melted in an electric furnace of 1,100° C., cast into a roll to obtain glass flakes. This glass has a glass transition temperature of 499° C., a yield point of 545° C. and a thermal expansion coefficient of $74 \times 10^{-7}$ (1/° C.) (the average value of 100 to 300° C.). The refractive index nF of this glass at the F line (486.13 nm) is 2.0448, the refractive index nd at the d line (587.56 nm) is 2.0065, and the refractive index nC at the C line (656.27 nm) is 1.9918. Methods for measuring the refractive index and the glass transition point-yield point are the same as in the above-mentioned example.

The flakes prepared were further pulverized in a planetary mill made of zirconia for 2 hours, and passed through a sieve to prepare a powder. For the particle size distribution at this time, $D_{50}$ was 0.905 μm, $D_{10}$ was 0.398 μm, and $D_{90}$ was 3.024 μm. Then, 20 g of the resulting glass powder was kneaded with 7.6 g of an organic vehicle to prepare a glass paste. This glass paste was uniformly printed on the above-mentioned glass substrate to a circular form having a diameter of 10 mm and a film thickness after firing of 15 μm. After drying at 150° C. for 30 minutes, this was once returned to room temperature. Then, the temperature was raised to 450° C., taking 45 minutes, and held at 450° C. for 30 minutes Thereafter, the temperature was raised to 550° C., taking 12 minutes, and held at 550° C. for 30 minutes to perform firing. Then, the temperature was lowered to room temperature, taking 3 hours, to form a scattering layer on the glass substrate. In addition to this, scattering layers were also prepared at the same temperature profile as described above with the exception that only the holding-firing temperature was changed to 570° C. and 580° C.

Figure 43:
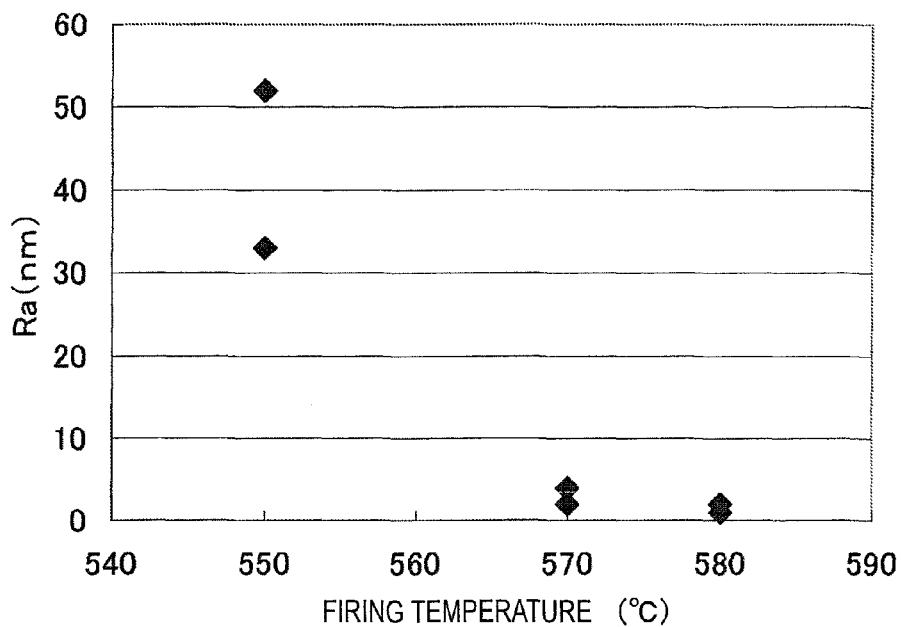
FIG. 43 is a graph showing the measurement results of the relationship between the firing temperature and the surface roughness of a scattering layer of a translucent substrate in Example 2 of the invention.

Then, the surface roughness of these was measured. For the measurement, there was used a three-dimensional noncontact surface profile measuring system, Micromap, manufactured by Ryoka Systems Inc. The measurement was made in two places in the vicinity of a central portion of the circular scattering layer, and a measuring area was a square with sides each 30 μm long. Further, the cutoff wavelength of waviness was 10 μm. When the unevenness has a period of 10 μm or more, it is considered that a film used for formation of the organic LED element, which is formed by a system such as sputtering, vapor deposition, spin coating or spraying, can sufficiently follow that unevenness. For the unevenness having a period of less than 10 μm, it is considered that coatability thereof becomes insufficient in vapor deposition and the like in some cases. FIG. 43 shows the arithmetic average roughness (Ra) of the scattering layers fired at the respective temperatures. One fired at 550° C. is incompletely fired, so that pores in the scattering layer are not spherical, and a surface thereof is roughened. Accordingly, when an element is prepared thereon, a defect such as an interelectrode short circuit is liable to occur. Compared to this, in the layers fired at 570° C. and 580° C., pores in the scattering layers become spherical, and surfaces thereof also become smooth.

TABLE 6

|  | Mass % | Mol % |
| --- | --- | --- |
| $P_2O_5$ | 16.4 | 23.1 |
| $B_2O_3$ | 4.2 | 12 |
| $Li_2O$ | 1.7 | 11.6 |
| $Na_2O$ | 0 | 0 |
| $K_2O$ | 0 | 0 |
| $Bi_2O_3$ | 38.7 | 16.6 |
| $TiO_2$ | 3.5 | 8.7 |
| $Nb_2O_5$ | 23.4 | 17.6 |
| $WO_3$ | 12.1 | 10.4 |

The total light transmittance of the scattering layer-attached glass substrate thus produced was 77.8, and the haze value thereof was 85.2. As a measurement device, there was used a haze computer (trade name: HZ-2) manufactured by Suga Test Instruments Co., Ltd. As a reference, the measurement was made using an untreated plate of the glass substrate PD200.

Figure 44:
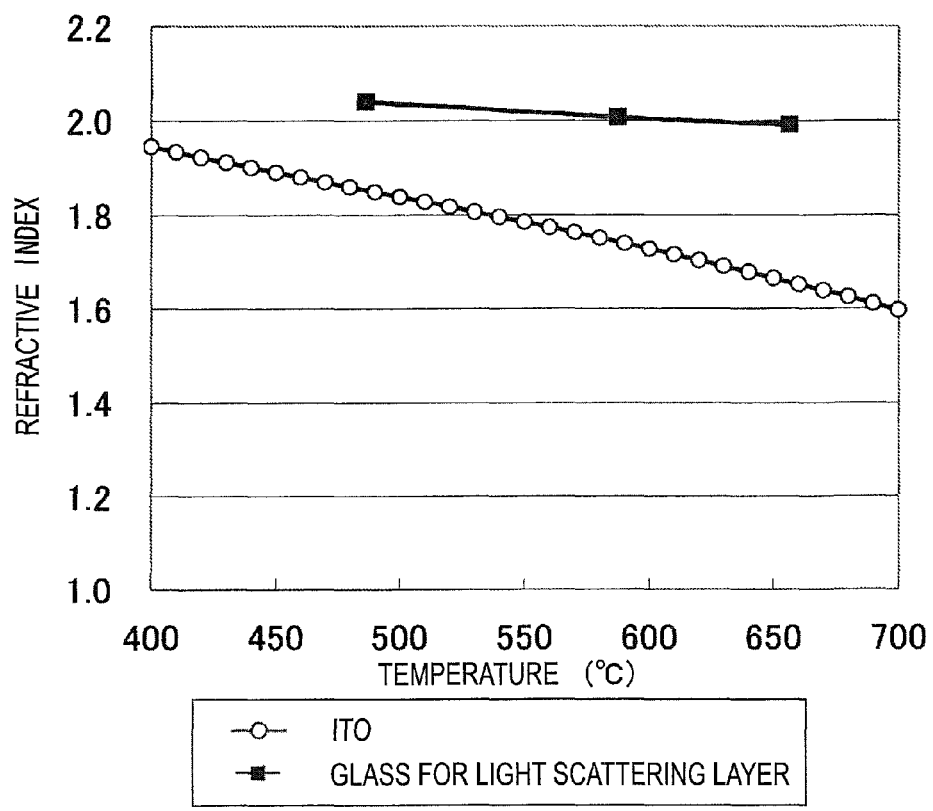
FIG. 44 is a graph showing the measurement results of the relationship between the firing temperature and the refractive index of a scattering layer of a translucent substrate in Example 2 of the invention.

Then, the scattering layer-attached glass substrate produced as described above and the glass substrate PD200 having no scattering layer were each prepared, and an organic LED element was produced. First, an ITO film was formed by mask film formation with a DC magnetron sputter to 150 nm as a transparent electrode. FIG. 44 shows the refractive indexes of the glass for the scattering layer and ITO. Then, ultrasonic cleaning using pure water was performed, and thereafter, UV light was irradiated with an excimer UV generator to clean a surface thereof Then, α-NPD (N,N'-diphenyl-N,N'-bis(1-naphthyl)-1,1'-biphenyl-4,4"-diamine was vapor deposited to 100 nm, $Alq_3$ (tris(8-hydroxyquinoline) aluminum to 60 nm, LiF to 0.5 nm, and Al to 80 nm, by using a vacuum vapor deposition apparatus. At this time, α-NPD and $Alq_3$ were deposited to a circular pattern having a diameter of 12 mm using a mask, and LiF and Al were pattern formed on the ITO pattern with the interposition of the above-mentioned organic layers, using a mask having a region of 2 mm square, thereby completing an element.

Then, a concave portion was formed on PD200 as an opposed substrate by sand basting, and a photosensitive epoxy resin was applied for peripheral sealing to a bank around the concave portion. Then, the element substrate and the opposed substrate were placed in a glove box, and a desiccant containing CaO was attached to the concave portion of the opposed substrate. Then, the element substrate and the opposed substrate were adhered to each other, followed by irradiation with UV light to cure the resin for peripheral sealing. The state of the occurrence of the interelectrode short circuit in each element is shown in Table 7. The self-healing as used herein means that a short-circuit portion is self-heald by allowing an overcurrent of 10 mA to flow through the element to self-heal a short-circuit portion by the Joule heat thereof.

TABLE 7

| Firing Temperature | State of Interelectrode Short Circuit | Remarks |
| --- | --- | --- |
| 550° C. | Δ to x | A short circuit occurred at Ra of 52 nm. Self-healing was impossible. A short circuit occurred at Ra of 33 nm. Self-healing was possible. |
| 570° C. | ○ | No short circuit occurred. |
| 580° C. | ○ | No short circuit occurred. |

Figure 45:
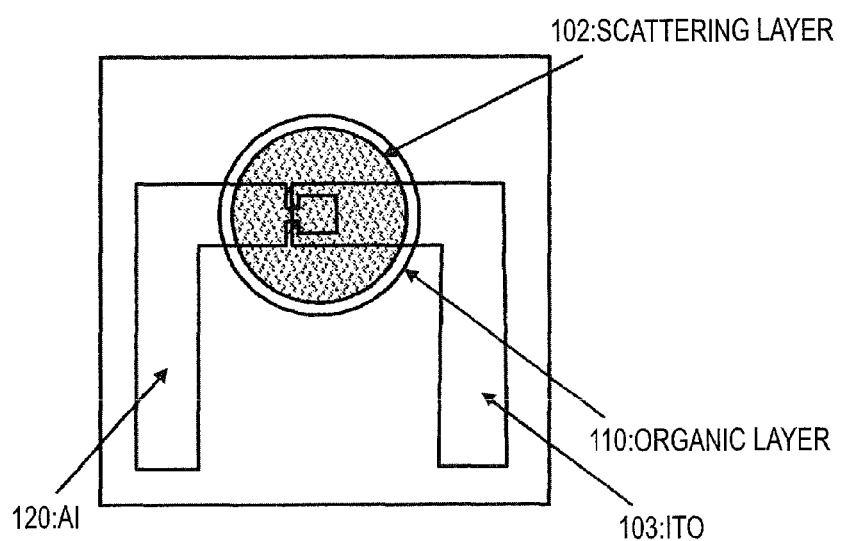
FIG. 45 is a view showing a light-emitting state of an organic LED element formed by using the translucent substrate in Example 2 of the invention.
Figure 46:
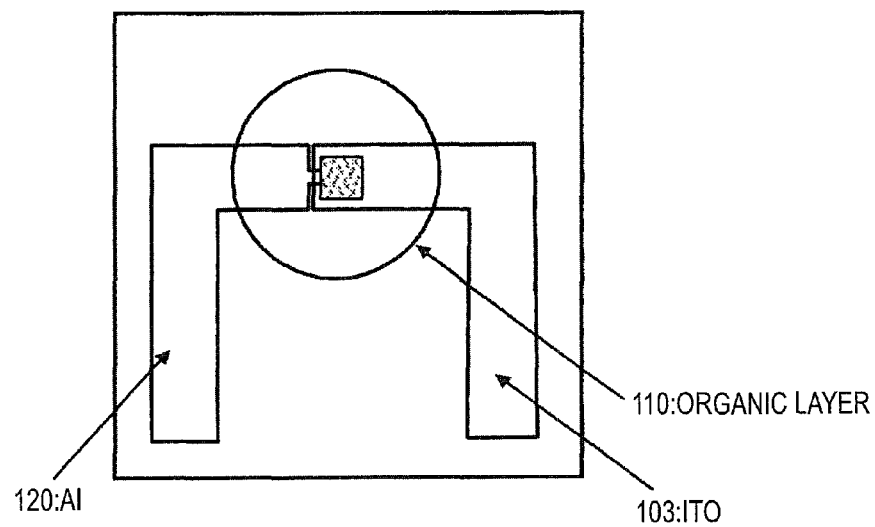
FIG. 46 is a view showing a light-emitting state of an organic LED element formed by using a translucent substrate for comparison.

States in which the elements emit light are shown in FIG. 45 and FIG. 46. Here, the element having the scattering layer is shown in FIG. 45, and the element having no scattering layer is shown in FIG. 46. In the element having no scattering layer, light emission from only a region of approximately 2 mm square formed by the intersection of the ITO pattern and the Al pattern is confirmed. However, in the element formed on the scattering layer, it is seen that the light is extracted not only from the above-mentioned region of approximately 2 mm square, but also from a peripheral scattering layer-forming portion to the atmosphere.

Figure 47:
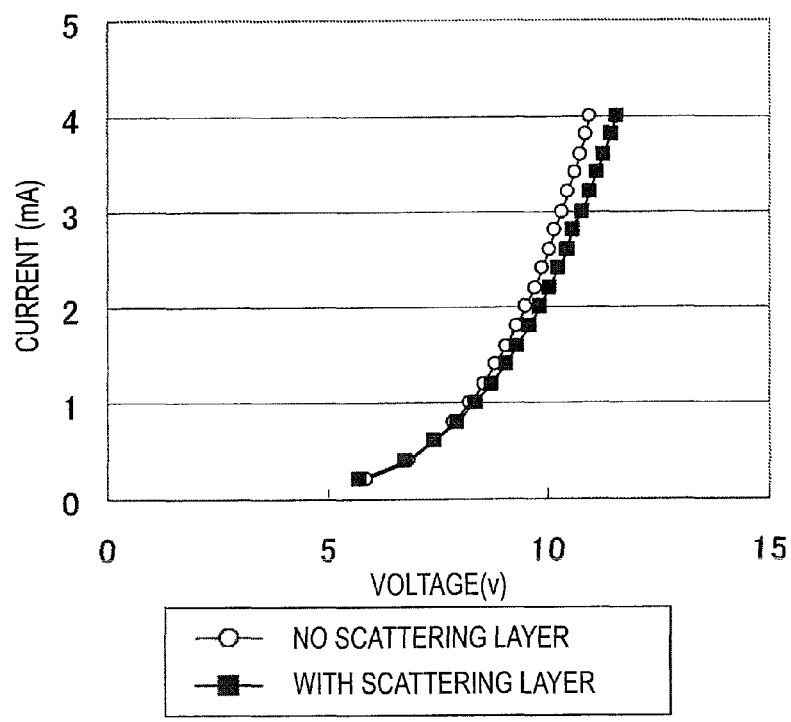
FIG. 47 is a graph showing the voltage-current characteristic of the organic LED elements formed by using the translucent substrates in Example 2 of the invention and for comparison.
Figure 48:
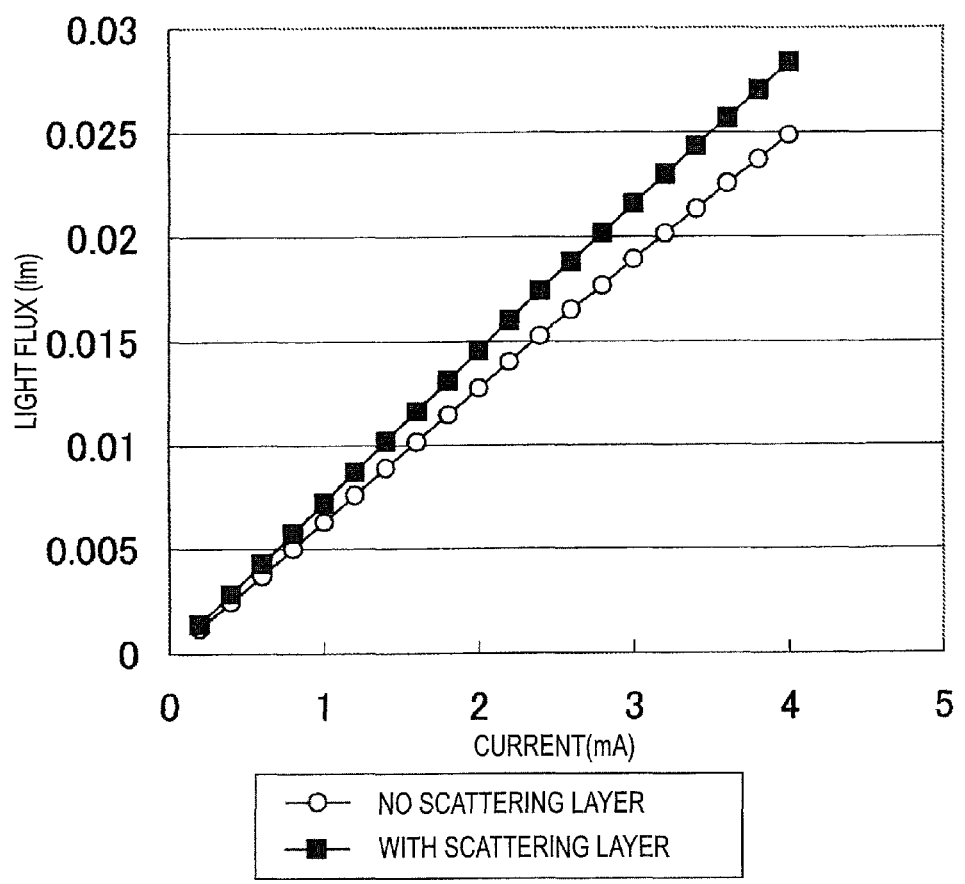
FIG. 48 is a graph showing the current-luminance characteristic of the organic LED elements formed by using the translucent substrates in Example 2 of the invention and for comparison.

Thereafter, characteristics of the element in which the scattering layer was fired at 570° C. were evaluated. For the measurement of the total light flux, an EL characteristic measuring apparatus C9920-12 manufactured by Hamamatsu Photonics K.K. was used. FIG. 47 shows the voltage-current characteristic of the element having the scattering layer and the element having no scattering layer. As shown in the graph, an approximately similar characteristic is obtained. This shows that a large leak current is not present even in the element formed on the scattering layer. Next, FIG. 48 shows the current-light flux characteristic. As shown in the graph, the light flux amount is proportional to the current independently of the presence or absence of the scattering layer. In the case of having the scattering layer, the light flux amount increased 15%, compared to the case of having no scattering layer. This shows that the refractive index of the scattering layer is higher than the refractive index of ITO as the translucent electrode at the light-emitting wavelength (450 nm to 700 nm) as shown in FIG. 44, so that EL emitted light of $Alq_3$ is inhibited from being totally reflected at an interface between ITO and the scattering layer, resulting in efficient extraction of light to the atmosphere.

Figure 49:
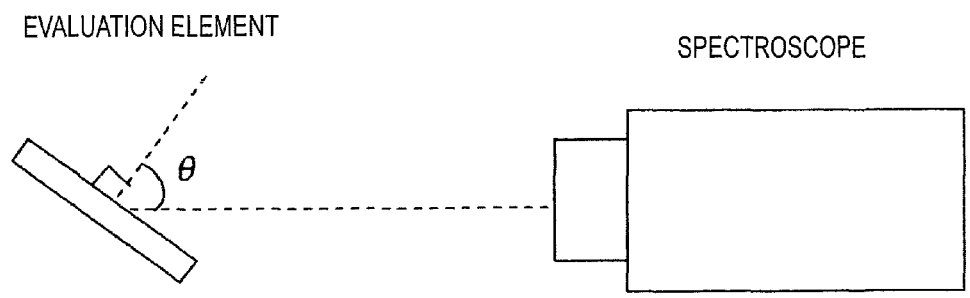
FIG. 49 is a view showing a measurement device for measuring the angular dependency of light-emitting luminance and light-emitting color in Example 2 of the invention.

Then, the angular dependency of color was evaluated. For optical measurement, a multichannel spectroscope (trade name: C10027) manufactured by Hamamatsu Photonics K.K. was used. The measurement was made while rotating the element to the spectroscope, thereby measuring the angular dependency of light-emitting luminance and light-emitting color. For the definition of the angle, the angle between a normal line direction of the element and a direction extending from the element to the spectroscope was defined as the measurement angle θ[° ] (FIG. 49). Namely, a state in which the spectroscope is placed in front to the element becomes 0°.

Figure 50:
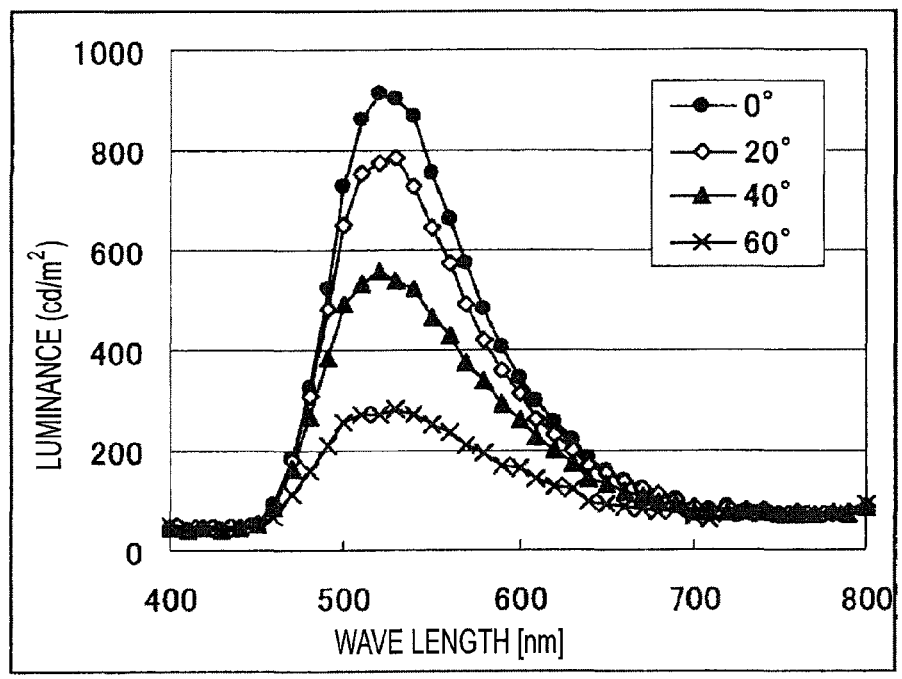
FIG. 50 is a graph showing spectral data of the angular dependency of light-emitting luminance and light-emitting color of an organic LED element for comparison.
Figure 51:
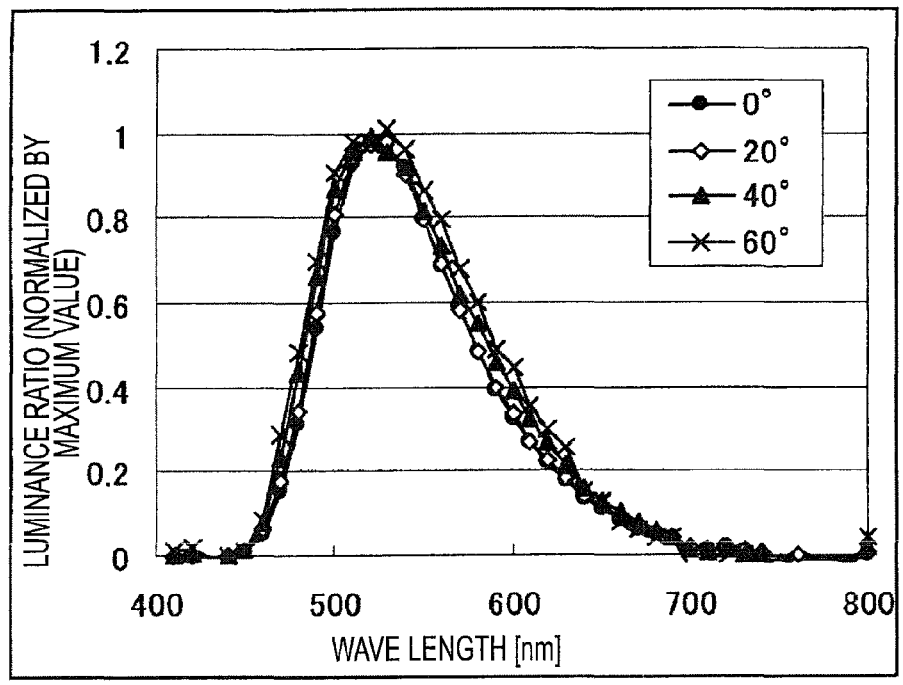
FIG. 51 is a graph showing spectral data of the angular dependency of light-emitting luminance and light-emitting color of the organic LED element for comparison.

The spectrum data obtained are shown in FIGS. 50, 51, 52 and 53. FIG. 50 shows the measurement results of the organic LED element having no scattering layer. FIG. 51 shows spectral data further normalized, taking the luminance at a wavelength showing the maximum luminance at each measurement angle as 1. From FIG. 51, it is seen that deviations occur in the spectra depending on the measurement angle.

Figure 52:
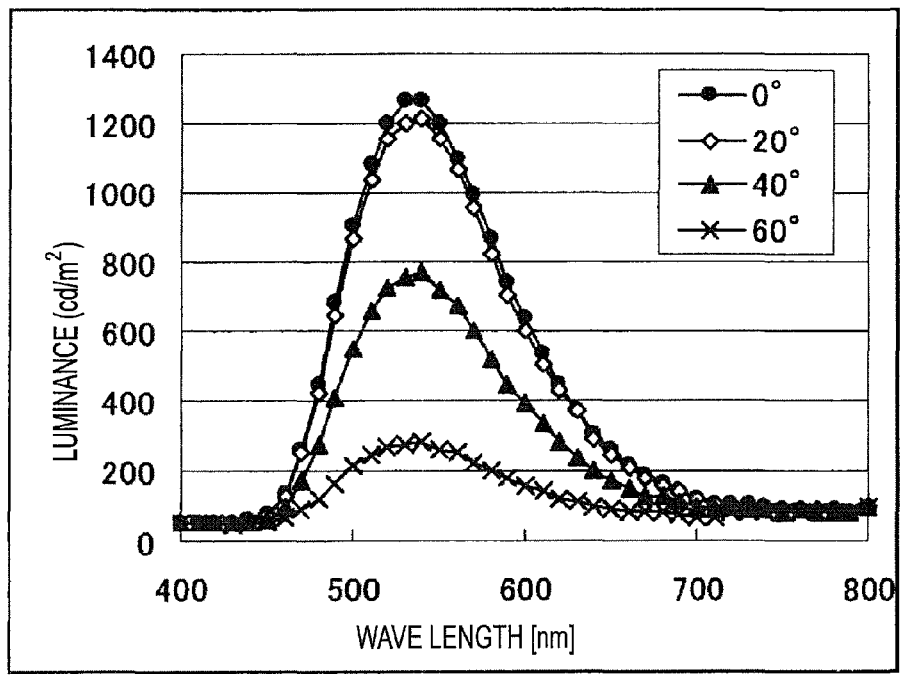
FIG. 52 is a graph showing spectral data of the angular dependency of light-emitting luminance and light-emitting color of an organic LED element in Example 2 of the invention.
Figure 53:
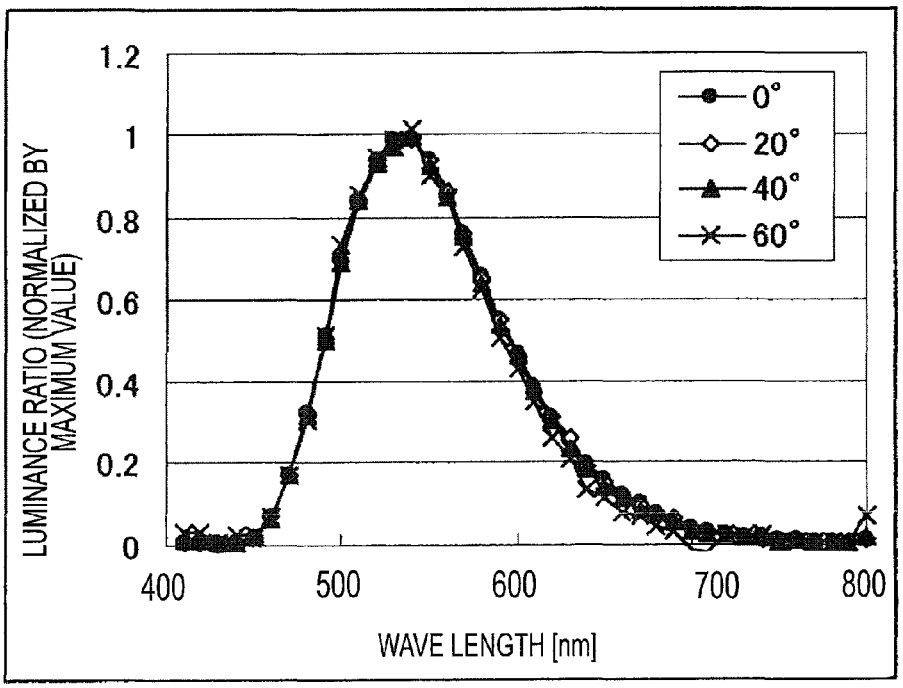
FIG. 53 is a graph showing spectral data of the angular dependency of light-emitting luminance and light-emitting color of the organic LED element in Example 3 of the invention.
Figure 54:
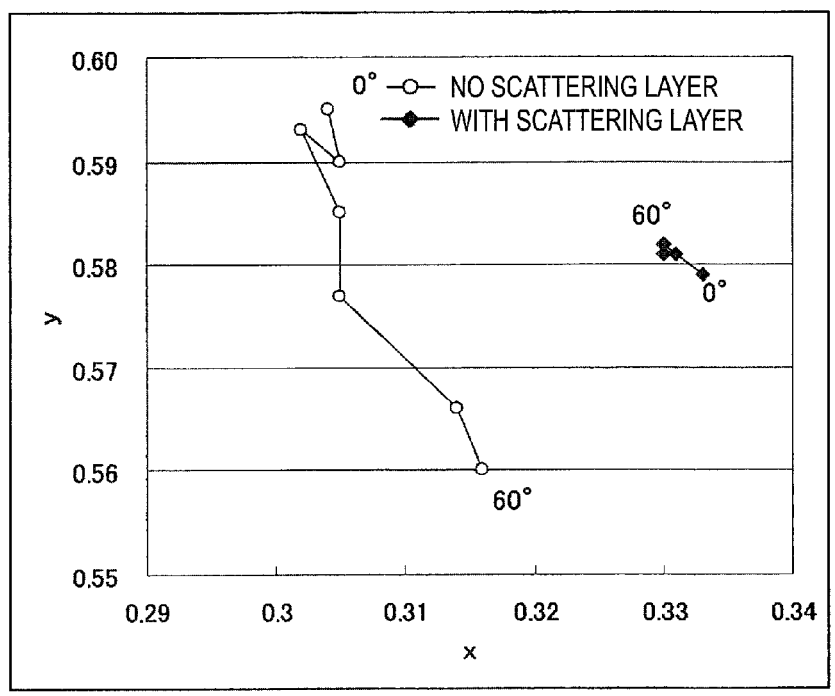
FIG. 54 is a graph showing the chromatic coordinates of the angular dependency of light-emitting luminance and light-emitting color of the organic LED element in Example 2 of the invention.

Then, FIG. 52 shows the measurement results of the organic LED element having the scattering layer. FIG. 53 shows spectral data further normalized, taking the luminance at a wavelength showing the maximum luminance at each measurement angle as 1. From FIG. 53, it is seen that deviations scarcely occur in the spectra even when the measurement angle changes. Further, the results of conversion of the above-mentioned spectra to chromaticity coordinates are shown in Table 8 and FIG. 54.

TABLE 8

| Measurement | No Scattering Layer | | With Scattering Layer | |
| --- | --- | --- | --- | --- |
| Angle θ | x | y | x | y |
| 0° (Front) | 0.304 | 0.595 | 0.333 | 0.579 |
| 10° | 0.305 | 0.59 | 0.333 | 0.579 |
| 20° | 0.302 | 0.593 | 0.333 | 0.579 |
| 30° | 0.305 | 0.585 | 0.333 | 0.579 |
| 40° | 0.305 | 0.577 | 0.331 | 0.581 |
| 50° | 0.314 | 0.566 | 0.33 | 0.582 |
| 60° | 0.316 | 0.56 | 0.33 | 0.582 |

It is seen that the element having no scattering layer largely changes in color depending on the measurement angle, whereas changes are small for the element having the scattering layer. The above has revealed that a further effect of decreasing angle changes in color is obtained, in addition to the effect of improving the light-extraction efficiency which is the original object, by imparting the scattering layer to the element. The small angle changes in color result in a great advantage that the seeing angle is not limited, as the light-emitting element.

As known from the above-mentioned evaluation experiments, it has been proved that the simulations of the invention are correct.

Incidentally, of the scattering layers used herein, cross sections of ones fired at 570° C. and 580° C. were polished, and SEM photographs were taken at a magnification of 10,000×. From the photographs, the relationship between the number of pores and distances from the surface of the glass scattering layer to the pores was examined. The lateral length of the SEM photograph was 12.5 μm. Lines were drawn on the SEM photograph at intervals of 0.25 μm from the surface of the scattering layer, and the number of pores found in a frame of 0.25 μm×12.5 μm was counted. Here, a pore existing over a plurality of frames was counted as existing in a lower frame. The results thereof are shown in FIG. 55. The X-axis indicates the distance from the surface of the glass scattering layer herein. For example, a point at 0.5 μm shows the number of pores confirmed in a frame 0.25 μm to 0.5 μm apart measured from the glass surface of the scattering layer. Further, X=0 shows the number of concave portions existing on the surface of the glass scattering layer, as shown in FIG. 7 or FIG. 8. As shown in the graph, it can be confirmed that the number of pores decreases with an approach to the surface from 0.5 μm from the surface, as shown by curve a, in the case of a firing temperature of 570° C., from 1.25 μm from the surface, as shown by curve b, in the case of a firing temperature of 580° C. Further, in both cases, no concave portion was confirmed on the surface.

Further, from FIG. 55, it is apparent that the density $\rho_3$ of the scattering material at a distance x (x≦0.2 μm) from the surface of the above-mentioned scattering layer including glass and the density $\rho_4$ of the above-mentioned scattering material at a distance x=2 μm satisfy $\rho_4 > \rho_3$. Furthermore, FIG. 55 shows the results in the case where the firing temperature is 570° C. and 580° C. However, even when the firing temperature was somewhat varied, similar results could be obtained.

Moreover, from FIG. 55, it is also apparent that the density $\rho_3$ of the scattering material at a distance x (x≦0.2 μm) from the surface of the above-mentioned scattering layer including glass and the density $\rho_5$ of the above-mentioned scattering material at a distance x=5 μm satisfy $\rho_5 > \rho_3$.

Incidentally, the number of pores in the scattering layer fired at 580° C. tends to be more than that of the scattering layer fired at 570° C. However, the cause thereof can not be concluded. As the possibility thereof, the following two are considered.

(1) In the scattering layer fired at 580° C., pores more expand by a higher temperature to become easy to count.

(2) The decomposition of organic residues adhered to the glass powder more proceeds at 580° C. to increase the number of pores.

Then, the presence or absence of the occurrence of precipitated crystals was examined. When precipitated on the surface of the glass scattering layer, the crystals can be easily visually recognized under an optical microscope, because when no crystals are precipitated, the surface of the scattering layer is very smooth, and a peculiar point is conspicuous. The difference between the crystals and foreign matter can be easily judged from the symmetry of the shape and the like. Further, the precipitated crystals in the inside of the glass scattering layer can also be easily distinguished from the pores and foreign matter by the shape thereof. The results are shown in Table 9. By selecting proper firing conditions such as firing at 570° C., it is possible to precipitate the crystals only in the inside of the scattering layer and to inhibit the occurrence thereof on the surface.

TABLE 9

| Firing Temperature | Inside of Glass Scattering Layer | Surface of Glass Scattering Layer |
| --- | --- | --- |
| 570° C. | Observed | Not observed |
| 580° C. | Observed | Not observed |

Incidentally, the pores and the crystals are generated by different mechanisms, so that it is possible to generate only the pores or only the crystals by controlling the glass material, the powder particle size, the surface state, the firing conditions (atmosphere, pressure) or the like. For example, crystal precipitation is inhibited by increasing a network former in the glass or increasing an alkali oxide component for inhibiting crystal precipitation, and pore generation is inhibited by firing under reduced pressure.

Example 3

Waviness

Then, Example 3 of the invention will be described.

First, as a sample for measurement, there was prepared one in which a scattering layer was formed on a PD200 substrate, and an Al thin film having a thickness of about 80 nm was further formed thereon by a vapor deposition method. As the scattering layers, six kinds shown in Table 10 were used. Glass compositions A, B and C are shown in Table 11 and Table 12, respectively.

TABLE 10

| | Glass Material | Firing Temperature | Film Thickness |
|---|---|---|---|
| 1 | A | 550° C. | 15 μm |
| 2 | | 560° C. | 15 μm |
| 3 | | 570° C. | 15 μm |
| 4 | | 580° C. | 15 μm |
| 5 | B | 550° C. | 60 μm |
| 6 | C | 550° C. | 30 μm |

TABLE 11

| | A | B |
|---|---|---|
| $P_2O_5$ | 23.1 | 23.1 |
| $B_2O_3$ | 12 | 5.5 |
| $Li_2O$ | 11.6 | 11.6 |
| $Na_2O$ | 0 | 4 |
| $K_2O$ | 0 | 2.5 |
| $Bi_2O_3$ | 16.6 | 16.6 |
| $TiO_2$ | 8.7 | 8.7 |
| $Nb_2O_5$ | 17.6 | 17.6 |
| $WO_3$ | 10.4 | 10.4 |

Unit: mol %

TABLE 12

| | C |
|---|---|
| $SiO_2$ | 5.1 |
| $B_2O_3$ | 24.24 |
| $Pb_3O_4$ | 52.37 |
| $BaO$ | 7.81 |
| $Al_2O_3$ | 6.06 |
| $TiO_2$ | 2.71 |
| $CeO_2$ | 0.41 |
| $Co_3O_4$ | 0.48 |
| $MnO_2$ | 0.56 |
| $CuO$ | 0.26 |

Unit: mol %

Then, the waviness was measured. As an apparatus, there was used SURFCOM (trade name: 1400D-12) manufactured Tokyo Seimitsu Co., Ltd. Roughness measurement was made at a measuring length of 5.0 mm and a measuring speed of 0.15 mm/s, taking the short wavelength cutoff value $λs$ as 25.0 μm and the long wavelength cutoff value $λc$ as 2.5 mm. The waviness roughness Ra and the arithmetic average wavelength $Rλa$ are calculated from this measured data in the apparatus based on the JIS 2001 standard (the translated standard of ISO 97). Further, from the data of the waviness, the surface area was calculated, and the difference from the flat case was compared. Then, the diffuse reflection ratio was measured. In a measuring system, parallel light is allowed to income through one opening of an integrating sphere, the sample is placed at an opening corresponding to the opposite corner thereof, and a detecting apparatus of outgoing light is placed at another opening. As the detecting apparatus, there was used a spectrophotometer Lambda 950 manufactured by Perkin Elmer.

First, spectrometry of total reflection is carried out in a state where the other openings are closed, and the reflectivity is calculated using that data. The calculation of the reflectivity is performed by multiplying the spectral data obtained by the spectral distribution of a light source and the color-matching function $y(λ)$. Incidentally, a D65 standard light source was used for the light source data, and the data of 2° field of view was used for the color-matching function.

Then, spectrometry is carried out in a state where the opening of the integrating sphere, which is placed at a position where light specularly reflected outgoes to the sample, is opened, and the reflectivity at that time is calculated. The reflectivity ion this case shall be called the diffuse reflectivity. Then, the diffuse reflectivity ratio was calculated by dividing the diffuse reflectivity by the total reflectivity. The measurement results thereof are as shown in Table 1.

Since there is the scattering material in the glass scattering layer, a metal electrode surface is not visually recognized like a mirror surface. However, supposing that scatterability is lowered, it is visually recognized as a mirror surface, which is possibly unfavorable in terms of the appearance. This time, when the Al film is formed on the scattering layer and observation is made from the Al electrode side, the appearance of the metal electrode can be evaluated without being affected by the scattering layer. As shown in Table 1, the diffuse reflectivity ratio increases by the waviness, and seeing specularity is restrained in all cases.

The diffuse reflectivity ratio at the time when the Al film was directly formed on the glass substrate was measured. As a result, it was 40%, and became a large value compared to 38% of material C. However, specular visibility was apparently restrained to the eye, when the scattering layer was formed by material C. However, although the outline of an body reflected blurs to be able to restrain specularity in the case of material C ($Ra/λRa=0.0234×10^{-2}$), the diffuse reflectivity ratio equivalent to or more than the case of material A fired at 580° C. ($Ra/λRa=0.556×10^{-2}$) is more preferred. In that case, the outline of a body reflected is not visually recognized at all.

Example 4

Total Transmittance (Haze Value) of Scattering Layers

The results of measuring the total transmittance of the scattering layers will be described below.

Figure 56:
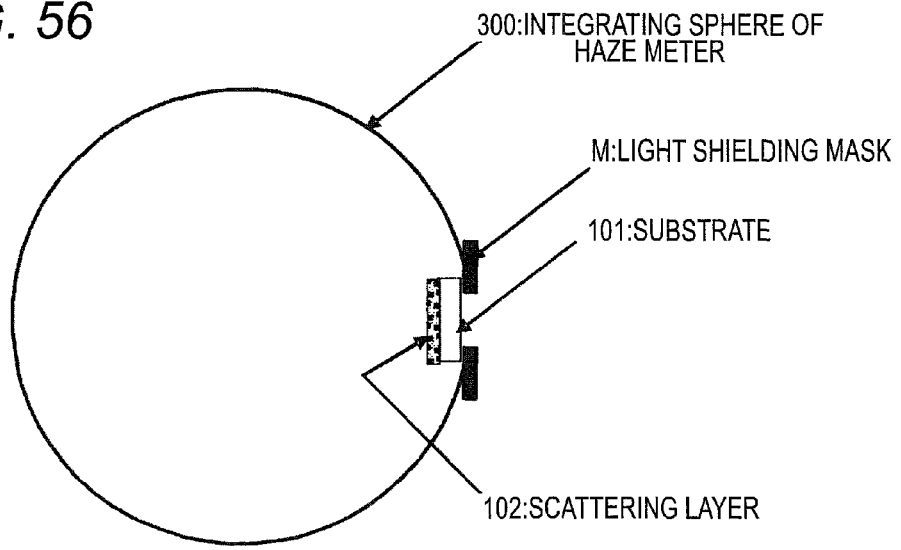
FIG. 56 is a view showing a method for measuring the transmittance of a scattering layer of Example 4 of the invention.
Figure 57:
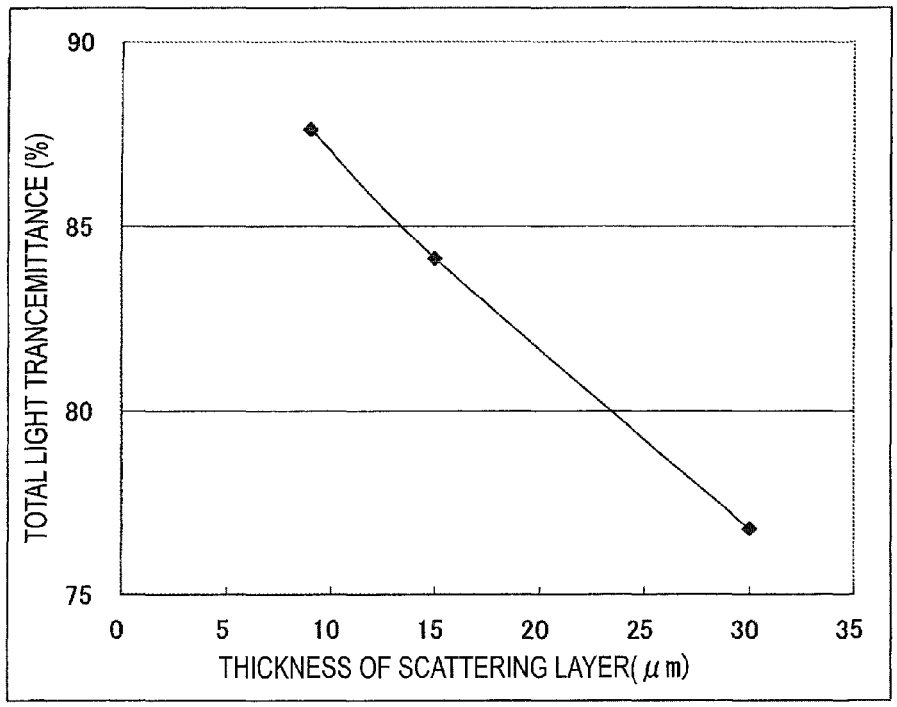
FIG. 57 is a graph showing the measurement results of the relationship between the film thickness and the total light transmittance of the scattering layer of Example 4 of the invention.
Figure 58:
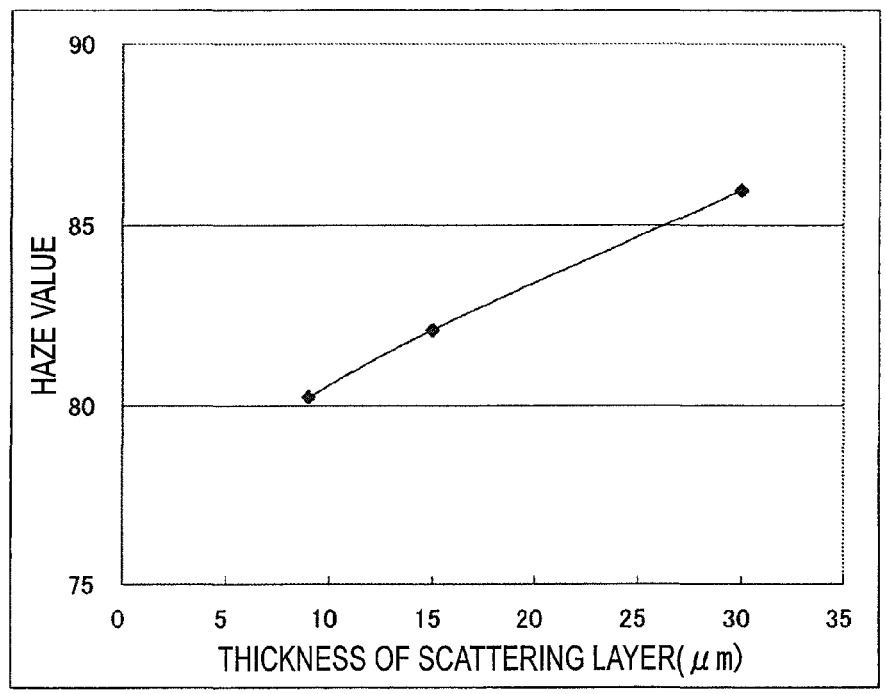
FIG. 58 is a graph showing the relationship between the film thickness and the haze value of the scattering layer of Example 4 of the invention.

Scattering layers having the glass composition shown in Table 1 and different in thickness were prepared on glass substrates. The scattering layers have thicknesses of 9 μm, 15 μm and 30 μm, respectively. Organic LED elements were prepared on these scattering layers, followed by evaluation to evaluate the ratio of the light-extraction efficiency to the case of having no scattering layer, in the same manner as described above. When total transmittance and the haze value were measured using the above-mentioned haze meter, a sample is set in the inside of an integrating sphere 300 as shown in FIG. 56 to prevent loss of the light propagating in a lateral direction inside the substrate 101 to perform evaluation. The relationship between the film thickness of the scattering layer and the total light transmittance is shown in FIG. 57, and the relationship between the film thickness of the scattering layer and the haze value is shown in FIG. 58.

Figure 59:
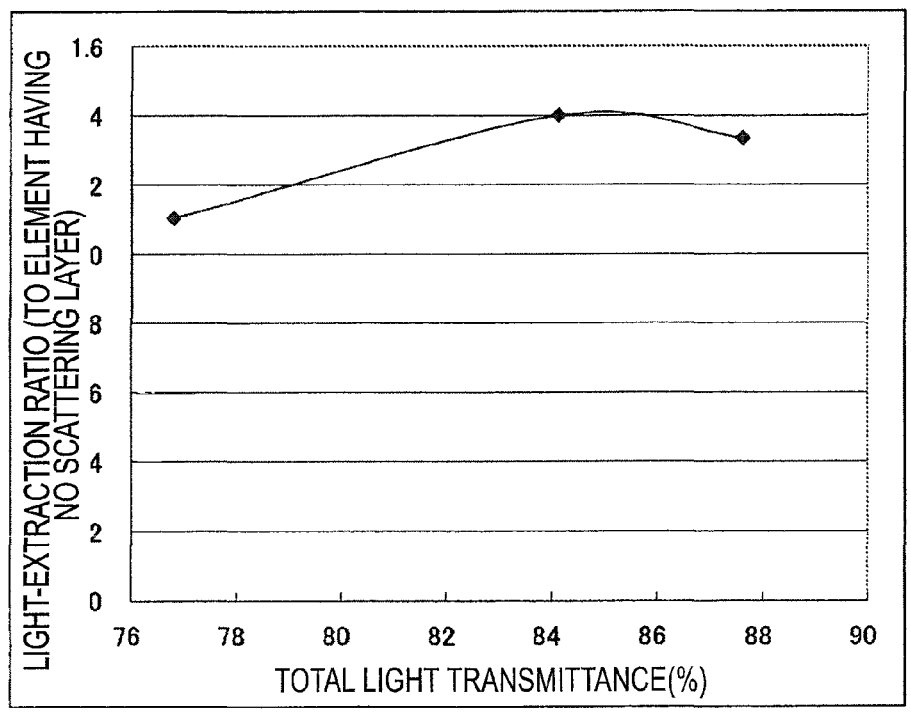
FIG. 59 is a graph showing the light-extraction efficiency ratio (light-extraction ratio) comparing the total light transmittance of Example 4 of the invention to the case of having no scattering layer.
Figure 60:
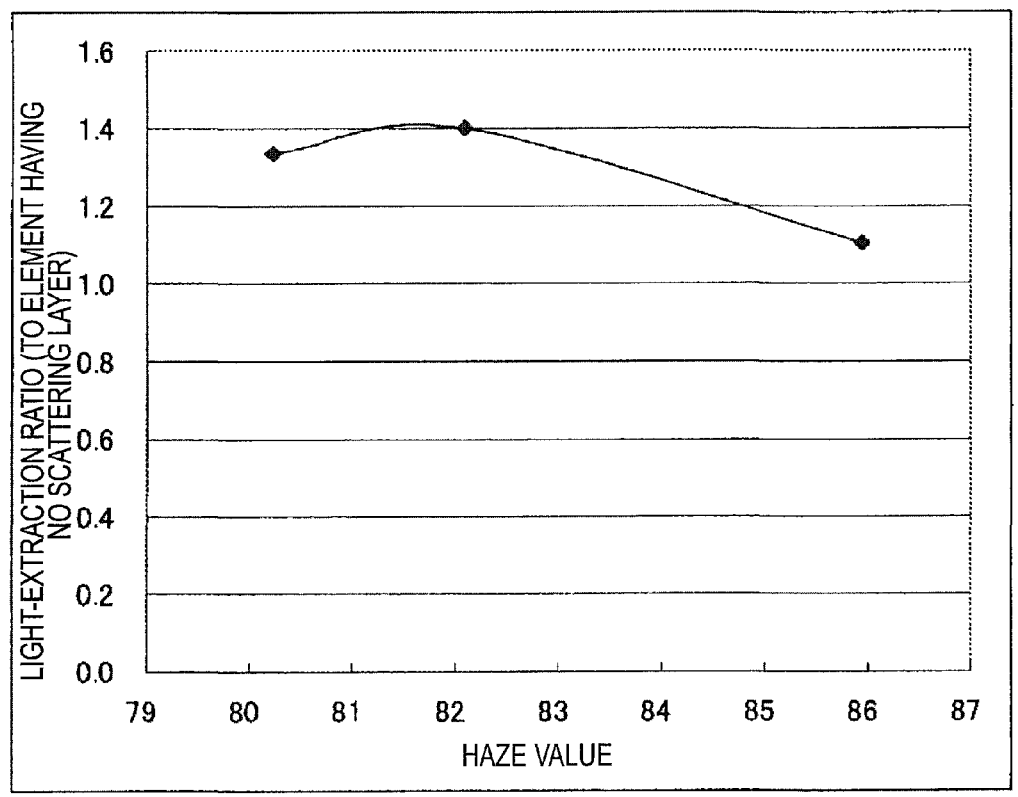
FIG. 60 is a graph showing the light-extraction efficiency ratio (light-extraction ratio) comparing the haze value of Example 4 of the invention to the case of having no

As shown in the graphs, it is confirmed that the total light transmittance decreases and the haze value increases with an increase in the film thickness of the scattering layer 102. Then, the light-extraction efficiency ratio (light-extraction ratio) comparing the total light transmittance to the case of having no scattering layer is shown in FIG. 59, and the light-extraction efficiency ratio (light-extraction ratio) comparing the haze value to the case of having no scattering layer is shown in FIG. 60.

The glass material has definite absorption. Accordingly, when the degree of scattering increases, the light path length passing through in the scattering layer becomes long, resulting in a decrease the extraction efficiency. Conversely, when the scattering is small, the direction of light can not be changed, so that total reflection can not be inhibited, resulting in a decrease in the extraction efficiency. From these, there are the total light transmittance and the haze value suitable for maximizing the extraction efficiency.

From the above-mentioned experiment results, the total light transmittance is desirably 75% or more. Further, it is desirable that this translucent substrate has a haze value of 80 to 87.

While the invention has been described in detail and with reference to specific embodiments thereof, it will be understood by those skilled in the art that various changes and modifications may be made therein without departing from the spirit and scope of the invention.

The present application is based on Japanese Patent Application No. 2007-195797 filed on Jul. 27, 2007, and Japanese Patent Application No. 2007-241287 filed on Sep. 18, 2007, the contents of which are incorporated herein by reference.

Industrial Applicability

As has been described above, the electrode-attached translucent substrate of the invention has the scattering layer which is excellent in scatterability and high in reliability, so that light-extraction efficiency or incorporation efficiency can be increased to be applicable to light-emitting devices, light-receiving devices and the like.

The invention claimed is:

1. An electrode-attached translucent substrate comprising:
a translucent glass substrate;
a scattering layer formed over the glass substrate and comprising a glass which contains: a base material having a first refractive index for at least one wavelength of light to be transmitted; and a plurality of scattering materials dispersed in the base material and having a second refractive index different from that of the base material; and
a translucent electrode formed over the scattering layer and having a third refractive index equal to or lower than the first refractive index,
wherein distribution of the scattering materials in the scattering layer decreases from the inside of the scattering layer toward the translucent electrode.

2. The translucent substrate according to claim 1, wherein a surface of the scattering layer has waviness constituting a curved surface.

3. The translucent substrate according to claim 2, wherein the ratio Ra/Rλa of a waviness roughness Ra of the surface of the scattering layer to a wavelength Rλa of the waviness of the surface is from $1.0 \times 10^{-3}$ to $3.0 \times 10^{-2}$.

4. The translucent substrate according to claim 1, wherein a surface roughness Ra of the surface of the scattering layer is 30 nm or less.

5. The translucent substrate according to claim 1, wherein the content of the scattering material in the scattering layer is at least 1 vol %.

6. The translucent substrate according to claim 1, wherein the scattering materials are pores.

7. The translucent substrate according to claim 1, wherein the scattering materials are material particles having a composition different from that of the base layer.

8. The translucent substrate according to claim 1, wherein the scattering materials are precipitated crystals of a glass constituting the base layer.

9. The translucent substrate according to claim 1, having a wavelength of light to be transmitted being equal to a wavelength of emitted light of an organic LED element.

10. An organic LED element comprising an organic layer formed over the translucent electrode layer of the translucent substrate according to claim 9, and a reflective electrode formed over the organic layer.

11. The translucent substrate according to claim 1, wherein the scattering material has a density $\rho_1$ at a half thickness ($\delta/2$) of the scattering layer, and a density $\rho_2$ at a distance x ($\delta/2 < X < \delta$) from a surface of the scattering layer on the side facing the translucent electrode, wherein $\rho_1 \geq \rho_2$.

* * * * *